United States Patent
Nonoyama et al.

(10) Patent No.: US 7,101,491 B2
(45) Date of Patent: Sep. 5, 2006

(54) PIEZOELECTRIC CERAMIC COMPOSITION AND METHOD OF PRODUCTION OF SAME, PIEZOELECTRIC ELEMENT, AND DIELECTRIC ELEMENT

(75) Inventors: Tatsuhiko Nonoyama, Chiryu (JP); Toshiatsu Nagaya, Kuwana (JP); Yasuyoshi Saito, Toyota (JP); Kazumasa Takatori, Nagoya (JP); Hisaaki Takao, Seto (JP); Takahiko Homma, Owariasahi (JP)

(73) Assignees: DENSO Corporation, Kariya (JP); Kabushiki Kaisha Toyota Chuo Kenkyusho, Aichi-gun (JP)

( * ) Notice: Subject to any disclaimer, the term of this patent is extended or adjusted under 35 U.S.C. 154(b) by 0 days.

(21) Appl. No.: 10/620,923

(22) Filed: Jul. 16, 2003

(65) Prior Publication Data
US 2004/0058797 A1 Mar. 25, 2004

(30) Foreign Application Priority Data

| Jul. 16, 2002 | (JP) | 2002-207208 |
| Jan. 23, 2003 | (JP) | 2003-015282 |
| Jan. 23, 2003 | (JP) | 2003-015283 |
| Jan. 23, 2003 | (JP) | 2003-015284 |
| Jan. 23, 2003 | (JP) | 2003-015285 |
| Mar. 14, 2003 | (JP) | 2003-069060 |

(51) Int. Cl.
C04B 35/495 (2006.01)

(52) U.S. Cl. .................. 252/62.9 R; 501/134; 310/311

(58) Field of Classification Search ............ 252/62.9 R; 501/134; 310/311
See application file for complete search history.

(56) References Cited
U.S. PATENT DOCUMENTS
6,514,427 B1 2/2003 Nishida et al.

2002/0060306 A1 5/2002 Nishida et al.

FOREIGN PATENT DOCUMENTS

| EP | 1 032 057 | 8/2000 |
| JP | 49-33907 | 3/1974 |
| JP | 58-060582 | 4/1983 |
| JP | 7-82024 | 3/1995 |
| JP | 10-53465 | 2/1998 |
| JP | 11-228226 | 8/1999 |
| JP | 11-228227 | 8/1999 |
| JP | 11-228228 | 8/1999 |
| JP | 2001-114560 | 4/2001 |
| JP | 2001-240471 | 9/2001 |
| JP | 2001-316182 | 11/2001 |
| JP | A-2002-154872 | 5/2002 |
| JP | 2002-193663 | 7/2002 |
| JP | 2003-12373 | 1/2003 |

OTHER PUBLICATIONS

European Office Action dated Sep. 18, 2003 in corresponding EP Application No. 03 01 5622.

*Primary Examiner*—C. Melissa Koslow
(74) *Attorney, Agent, or Firm*—Harness, Dickey & Pierce, PLC

(57) ABSTRACT

A piezoelectric ceramic composition not containing lead, able to be sintered at ordinary pressure, and superior to the past in at least one of the properties unique to piezoelectric ceramic compositions such as the piezoelectric $d_{31}$ constant, that is, a piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, where the piezoelectric ceramic composition contains at least one metal element selected from (1) palladium, silver, gold, ruthenium, rhodium, rhenium, osmium, iridium, and platinum, (2) nickel, iron, manganese, copper, and zinc, or (3) magnesium, calcium, strontium, and barium as an added element, and a method of production of the same and a piezoelectric element and dielectric element utilizing that piezoelectric ceramic composition.

122 Claims, 1 Drawing Sheet

PIEZOELECTRIC CERAMIC COMPOSITION AND METHOD OF PRODUCTION OF SAME, PIEZOELECTRIC ELEMENT, AND DIELECTRIC ELEMENT

BACKGROUND OF THE INVENTION

1. Field of the Invention

The present invention relates to a piezoelectric ceramic composition of a composition not containing lead and a method of production of the same and to a piezoelectric element and dielectric element using the piezoelectric ceramic composition as materials.

2. Description of the Related Art

In the past, as a piezoelectric ceramic composition, a PZT ($PbTiO_3$—$PbZrO_3$) component-based ceramic containing lead has been used. This is because the above PZT exhibits large piezoelectric properties and has a high mechanical quality factor superior in long-term stability and enables the easy fabrication of materials of various properties required for applications such as sensors, actuators, and filters.

Further, PZT has a high relative dielectric constant, so can also be used as a capacitor etc.

While a piezoelectric ceramic composition comprised of PZT has superior properties, it includes lead among its component elements, so harmful lead leaches out from the industrial waste of products containing the PZT and therefore environmental pollution is liable to be caused. The rising awareness of such environmental issues in recent years has made difficult the production of products which might become causes of environmental pollution such as with PZT. Therefore, development of a piezoelectric ceramic composition of a composition not containing lead is being sought. A piezoelectric ceramic composition of the general formula $(K_{1-x}Na_x)NbO_3$ (where, 0<x<1) has become the focus of attention. (See *Journal of the American Ceramic Society*, U.S., 1962, vol. 45, no. 5, p. 209.)

(A) Problem to be Solved I

A piezoelectric ceramic composition of the general formula $(K_{1-x}Na_x)NbO_3$ (where, 0<x<1) is difficult to fire, so hot press sintering is necessary. Therefore, there was the problem that the production costs became high.

Further, there was the problem that the piezoelectric ceramic composition of the above general formula suffered from low properties such as the piezoelectric $d_{31}$ constant, electromechanical coupling coefficient Kp, and Curie temperature Tc. Therefore, application was difficult to piezoelectric elements requiring high piezoelectric $d_{31}$ constants and electromechanical coupling coefficients Kp such as piezoelectric actuators, piezoelectric filters, piezoelectric vibrators, piezoelectric transformers, piezoelectric ultrasonic motors, piezoelectric gyrosensors, knock sensors, yaw rate sensors, air bag sensors, back sonar, corner sonar, piezoelectric buzzers, piezoelectric speakers, and piezoelectric ignitors. Further, since the Curie temperature Tc is low, there was the problem that the piezoelectric properties deteriorated under a high temperature environment.

The invention was made in view of the above problem and has as its object to provide a piezoelectric ceramic composition not containing lead, able to be sintered at ordinary pressure, and superior to the past in at least one of the properties unique to piezoelectric ceramic compositions such as the piezoelectric $d_{31}$ constant and a method of production of the same and a piezoelectric element and dielectric element utilizing that piezoelectric ceramic composition.

(B) Problem to be Solved II

A piezoelectric ceramic composition of the above general formula $(K_{1-x}Na_x)NbO_3$ (where, 0<x<1) suffers from the problem of low piezoelectric properties such as the piezoelectric $d_{31}$ constant, electromechanical coupling coefficient Kp, piezoelectric $g_{31}$ constant, and mechanical quality factor Qm. Therefore, application was difficult to a piezoelectric elements requiring a high piezoelectric $d_{31}$ constant such as piezoelectric actuators, piezoelectric filters, piezoelectric vibrators, piezoelectric transformers, piezoelectric ultrasonic motors, piezoelectric gyrosensors, knock sensors, yaw rate sensors, air bag sensors, back sonar, corner sonar, piezoelectric buzzers, piezoelectric speakers, and piezoelectric ignitors.

Further, since the piezoelectric ceramic composition of the above general formula has low dielectric properties such as the relative dielectric constant $\in_{33T}/\in_0$ and dielectric loss tan δ, there was the problem that application was difficult to a dielectric element such as a capacitor.

The present invention was made in view of the above problem in the prior art and has as its object to provide a piezoelectric ceramic composition not containing lead, having high piezoelectric properties and dielectric properties, and superior in at least one of the piezoelectric $d_{31}$ constant, relative dielectric constant, dielectric loss, and Curie temperature Tc and a method of production of the same and a piezoelectric element and dielectric element utilizing that piezoelectric ceramic composition.

(C) Problem to be Solved III

A piezoelectric ceramic composition of the above general formula $(K_{1-x}Na_x)NbO_3$ (where, 0<x<1) suffers from the problem of low piezoelectric properties such as the piezoelectric $d_{31}$ constant, electromechanical coupling coefficient Kp, piezoelectric $g_{31}$ constant, and mechanical quality factor Qm and low dielectric properties such as the relative dielectric constant $\in_{33T}/\in_0$ and dielectric loss tan δ. Therefore, application was difficult to piezoelectric elements requiring a high piezoelectric $d_{31}$ constant and electromechanical coupling coefficient Kp such as piezoelectric actuators, piezoelectric filters, piezoelectric vibrators, piezoelectric transformers, piezoelectric ultrasonic motors, piezoelectric gyrosensors, knock sensors, yaw rate sensors, air bag sensors, back sonar, corner sonar, piezoelectric buzzers, piezoelectric speakers, and piezoelectric ignitors and to dielectric elements such as capacitors.

To solve this problem, in addition to the piezoelectric ceramic composition of the above general formula $(K_{1-x}Na_x)NbO_3$, various piezoelectric ceramic compositions of compositions not containing lead are being developed, but almost all of these cannot withstand practical use. Further, in general the piezoelectric $d_{31}$ constant and mechanical quality factor Qm are contradictory in relationship, so it is particularly difficult to obtain a piezoelectric ceramic composition superior in both of the piezoelectric $d_{31}$ constant and mechanical quality factor Qm.

The present invention was made in view of the above problem in the prior art and has as its object to provide a piezoelectric ceramic composition not containing lead, having high piezoelectric properties and dielectric properties, and superior in both of the piezoelectric $d_{31}$ constant and mechanical quality factor Qm and a method of production of the same and a piezoelectric element and dielectric element utilizing that piezoelectric ceramic composition.

(D) Problem to be Solved IV

A piezoelectric ceramic composition of the above general formula $(K_{1-x}Na_x)NbO_3$ (where, 0<x<1) suffers from the problem of being difficult to sinter. Therefore, the sintered piezoelectric ceramic composition features a low apparent density and tends to have a large number of pores in its surface and inside. Therefore, a conventional piezoelectric ceramic composition of the above general formula $(K_{1-x}Na_x)NbO_3$ suffered from the problem of a susceptibility to a drop in its mechanical strength.

The present invention was made in view of the above problem in the prior art and has as its object to provide a piezoelectric ceramic composition not containing lead, having a high apparent density, and having a low porosity and open porosity and a method of production of the same and a piezoelectric element and dielectric element utilizing that piezoelectric ceramic composition.

(E) Problem to be Solved v

A piezoelectric ceramic composition of the above general formula $(K_{1-x}Na_x)NbO_3$ (where, 0<x<1) suffers from the problem of low piezoelectric properties such as the piezoelectric $d_{31}$ constant, electromechanical coupling coefficient Kp, piezoelectric $g_{31}$ constant, and mechanical quality factor Qm. Therefore, application is difficult to piezoelectric elements requiring a high piezoelectric $d_{31}$ constant and electromechanical coupling coefficient Kp such as piezoelectric actuators, piezoelectric filters, piezoelectric vibrators, piezoelectric transformers, piezoelectric ultrasonic motors, piezoelectric gyrosensors, knock sensors, yaw rate sensors, air bag sensors, back sonar, corner sonar, piezoelectric buzzers, piezoelectric speakers, and piezoelectric ignitors.

Further, since the piezoelectric ceramic composition of the above general formula has low dielectric properties such as the relative dielectric constant $\in_{33r}/\in_0$ and dielectric loss tan δ, there was the problem that application was difficult to a dielectric element such as a capacitor.

The present invention was made in view of the above problem in the prior art and has as its object to provide a piezoelectric ceramic composition not containing lead, having high piezoelectric properties and dielectric properties, and superior in at least one of the piezoelectric $d_{31}$ constant, mechanical quality factor Qm, and relative dielectric constant and a method of production of the same and a piezoelectric element and dielectric element utilizing that piezoelectric ceramic composition.

SUMMARY OF THE INVENTION (1) Means for Solving the Problem I

According to a first aspect of the present invention, there is provided a piezoelectric ceramic composition of a general formula $\{Li_z(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$.

As described above, the piezoelectric ceramic composition of the invention has a general formula of a type of perovskite structure $ABO_3$ wherein elements of A site comprise either K and Na; or K, Na and Li; while elements of B site comprise Nb, Ta and Sb. In this formula, the ideal perovskite structure is attained when A:B is 1:1 (i.e. a stoichiometric ratio). However, for the purpose of the invention, the ratio A/B may vary because especially several % (e.g. 3%) of K, Na, Li and Sb may vaporize during sintering process, and all of the constituent elements may also vary to some extent (e.g. 3%) during mixing, milling or granulating. Thus, the stoichiometric composition may sometimes vary depending on the variation in manufacturing processes. Therefore, there are many cases where the formulation ratio of starting materials is intentionally adjusted in light of such a variation. It is true of conventional manufacturing processes for PZT, wherein the formulation ratio is commonly adjusted, taking into account that lead may vaporize during sintering and zirconia may be mingled as a contaminant from milling media of zirconia balls. For the purpose of the invention, the variation of the ratio A/B is allowed to the extent of ±5 mol % to obtain acceptable electric properties. Preferably, the variation of the ratio A/B is within ±3 mol % to obtain higher electric properties due to less lattice defect.

The piezoelectric ceramic composition of the first aspect of the/present invention, as shown by the general formula $\{Li_x(K_{1-y}Na_y)_{1-x}\}(Nb_{1-z-w}Ta_zSb_w)O_3$, is a composition not containing lead.

Therefore, the piezoelectric ceramic composition is safe in that waste of the piezoelectric ceramic composition etc. does not leach harmful lead into the natural world.

Further, the piezoelectric ceramic composition has the x, y, z, and w in the above general formula in the above ranges. Therefore, the piezoelectric ceramic composition is superior in at least one of the piezoelectric $d_{31}$ constant, electromechanical coupling coefficient Kp, piezoelectric $g_{31}$ constant, relative dielectric constant $\in_{33r}/\in_0$, dielectric loss tan δ, and Curie temperature Tc.

Further, the piezoelectric ceramic composition has a range of z in the above general formula of $0<z \leq 0.4$ and a range of w of $0<w \leq 0.2$ and contains tantalum and antimony as essential ingredients. Therefore, the piezoelectric ceramic composition easily is densified at the time of sintering and can be sufficiently densified even by sintering under ordinary pressure. This is because the inclusion of tantalum and antimony as essential ingredients in the above ranges reduces the sintering temperature, the tantalum and antimony function as sintering aids, and sintering with little pores becomes possible. Therefore, there is no need for hot press sintering as in the past and the above piezoelectric ceramic composition can be fabricated simply and at a low cost. Further, the stability of the dielectric loss tan δ of the piezoelectric ceramic composition can be improved.

In this way, the piezoelectric ceramic composition is safe to the environment, can be sintered at ordinary pressure, and can be utilized as a material for a high performance piezoelectric element or dielectric element. Note that the piezoelectric ceramic composition in the first aspect of the present invention is not limited to a ceramic composition having piezoelectric properties and includes in concept also a dielectric ceramic composition having dielectric properties.

According to a second aspect of the present invention, there is provided a method of production of a piezoelectric ceramic composition comprising shaping and sintering a powder comprised of a piezoelectric ceramic composition of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$.

A shaped article obtained using a powder comprised of the above piezoelectric ceramic composition can be sintered at ordinary pressure. Therefore, it can be sintered simply and at a low cost. Further, the piezoelectric ceramic composition obtained after sintering does not contain lead and is superior in properties unique to piezoelectric ceramic compositions such as the piezoelectric $d_{31}$ constant. Therefore, it can be utilized as a material for a high performance piezoelectric element or dielectric element.

According to a third aspect of the present invention, there is provided a method of production of a piezoelectric ceramic composition comprising mixing and sintering a compound containing lithium, a compound containing sodium, a compound containing potassium, a compound containing niobium, a compound containing tantalum, and a compound containing antimony so as to obtain a piezoelectric ceramic composition of the first aspect of the invention In the third aspect of the present invention, as explained above, a compound containing lithium, a compound containing sodium, a compound containing potassium, a compound containing niobium, a compound containing tantalum, and a compound containing antimony are mixed and sintered. Due to this, the piezoelectric ceramic composition of the first aspect of the invention can be easily obtained.

Further, at the time of sintering, the piezoelectric ceramic composition can be sintered at ordinary pressure. Further, the piezoelectric ceramic composition obtained after sintering does not contain lead and is superior in properties unique to piezoelectric ceramic compositions such as the piezoelectric $d_{31}$ constant. Therefore, it can be utilized as a material for a high performance piezoelectric element or dielectric element.

According to a fourth aspect of the present invention, there is provided a piezoelectric element having a piezoelectric body comprised of a piezoelectric ceramic composition of the first aspect of the invention.

The piezoelectric element of the fourth aspect of the invention has a piezoelectric body comprised of the piezoelectric ceramic composition of the first aspect of the invention. Therefore, the piezoelectric element does not contain lead and is safe to the environment.

Further, the piezoelectric element enables the direct utilization of the property of the piezoelectric ceramic composition of being superior in properties unique to piezoelectric ceramic compositions such as the piezoelectric $d_{31}$ constant. Therefore, the piezoelectric element can be utilized as a piezoelectric sensor element having a high sensitivity, a piezoelectric vibrator and actuator having a high electromechanical energy conversion efficiency, or other superior piezoelectric element.

According to a fifth aspect of the invention, there is provided a dielectric element having a dielectric body comprised of a piezoelectric ceramic composition of the first aspect of the invention.

The dielectric element of the fifth aspect of the invention has a dielectric body comprised of the piezoelectric ceramic composition of the first aspect of the invention. Therefore, the dielectric element does not contain lead and is safe to the environment. Further, the dielectric element enables the direct utilization of the property of the piezoelectric ceramic composition of being superior in at least one of the properties of the relative dielectric constant, dielectric loss, and long-term stability of the dielectric loss etc. Therefore, the dielectric element can be utilized as a large electrostatic capacity capacitor or other superior dielectric element.

(2) Means for Solving the Problem II

According to a sixth aspect of the invention, there is provided a piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein the piezoelectric ceramic composition contains at least one metal element selected from palladium, silver, gold, ruthenium, rhodium, rhenium, osmium, iridium, and platinum as an added element, and a total of the contents of the added elements is 0.001 mol to 0.15 mol with respect to 1 mole of the compound of the above general formula.

The above additive may be added to the above piezoelectric ceramic composition having the general formula by substitutional addition or external addition.

As described above, the piezoelectric ceramic composition of the invention has a general formula of a type of perovskite structure $ABO_3$ wherein elements of A Site comprise either K and Na; or K, Na and Li; while elements of B site comprise Nb, Ta and Sb. In this formula, the ideal perovskite structure is attained when A:B is 1:1 (i.e. a stoichiometric ratio). However, for the purpose of the invention, the ratio A/B may vary because especially several % (e.g. 3%) of K, Na, Li and Sb may vaporize during sintering process, and all of the constituent elements may also vary to some extent (e.g. 3%) during mixing, milling or granulating. Thus, the stoichiometric composition may sometimes vary depending on the variation in manufacturing processes. Therefore, there are many cases where the formulation ratio of starting materials is intentionally adjusted in light of such a variation. It is true of conventional manufacturing processes for PZT, wherein the formulation ratio is commonly adjusted, taking into account that lead may vaporize during sintering and zirconia may be mingled as a contaminant from milling media of zirconia balls. For the purpose of the invention, the variation of the ratio A/B is allowed to the extent of ±5 mol % to obtain acceptable electric properties. Preferably, the variation of the ratio A/B is within ±3 mol % to obtain higher electric properties due to less lattice defect.

Next, the action and effects of the present invention will be explained. The piezoelectric ceramic composition of the present invention is a composition not containing lead. Therefore, the piezoelectric ceramic composition is safe in that its waste etc. do not leach harmful lead into the natural world.

Further, the piezoelectric ceramic composition contains the compound of the above general formula and has the x, y, z, and w in the above general formula in the above ranges. Therefore, the piezoelectric ceramic composition is superior in the piezoelectric $d_{31}$ constant, electromechanical coupling coefficient Kp, piezoelectric $g_{31}$ constant, and other piezoelectric properties, the relative dielectric constant $\in_{33T}/\in_0$, dielectric loss tan δ, and other dielectric properties, and Curie temperature Tc. Note that a composition of the above general formula $\{Li_x(K_{1-y}Na_y)_{1-x}\}(Nb_{1-z-w}Ta_zSb_w)O_3$ not containing the above added elements will be referred to below as the "basic composition".

The piezoelectric ceramic composition contains, in addition to the compound of the basic composition of the above general formula, at least one type of metal element selected from palladium, silver, gold, ruthenium, rhodium, rhenium, osmium, iridium, and platinum as added elements in a total in the above range of content. Therefore, the piezoelectric ceramic composition of the present invention is further improved in at least one property among the piezoelectric $d_{31}$ constant, piezoelectric $g_{31}$ constant, electromechanical coupling coefficient Kp, relative dielectric constant $δ_{33T}/\in_0$, dielectric loss tan δ, and Curie temperature Tc and is more superior even compared with a piezoelectric ceramic composition of the above general formula not containing the added elements.

In this way, the piezoelectric ceramic composition of the present invention does not contain lead and therefore is safe to the environment and further has superior piezoelectric properties, so can be utilized as a high performance piezoelectric element.

Further, the piezoelectric ceramic composition is superior in the relative dielectric constant, dielectric loss, and other dielectric properties in addition to the above piezoelectric properties. Therefore, it can be utilized as a high performance dielectric element as well. That is, the piezoelectric ceramic composition of the sixth aspect of the invention is not limited to a piezoelectric ceramic composition having piezoelectric properties and includes in concept a dielectric ceramic composition having dielectric properties as well.

According to a seventh aspect of the invention, there is provided a method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from palladium, silver, gold, ruthenium, rhodium, rhenium, osmium, iridium, and platinum.

The mixture obtained by mixing the compound of the above general formula and the above additive can be sintered under ordinary pressure. Therefore, it is possible to fire it simply and at a low cost. Further, the piezoelectric ceramic composition obtained after sintering does not contain lead and is superior in piezoelectric $d_{31}$ constant, electromechanical coupling coefficient Kp, and other piezoelectric properties and dielectric loss, relative dielectric constant, and other dielectric properties. Therefore, it can be used as a material for a high performance piezoelectric element or a dielectric element.

Further, the piezoelectric ceramic composition obtained after sintering has the above additive added to it, so has at least part of at least one type of the lithium, potassium, sodium, niobium, tantalum, and antimony of the compound of the above general formula substituted by at least one type of metal element selected from palladium, silver, gold, ruthenium, rhodium, rhenium, osmium, iridium, and platinum or has the above metal elements or oxides or perovskite structure compounds containing the same included in the grains or at the grain boundaries of the piezoelectric ceramic composition. Note that the "containing an additive" in this specification includes all of the above meanings.

The above additive may be added to the above piezoelectric ceramic composition having the general formula by substitutional addition or external addition.

According to an eighth aspect of the invention, there is provided a method of production of a piezoelectric ceramic composition comprising mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ or a stoichiometric ratio considering substitution by a metal element contained in the following additive, mixing an additive containing at least one metal element selected from palladium, silver, gold, ruthenium, rhodium, rhenium, osmium, iridium, and platinum, and sintering the result.

In the eighth aspect of the invention, as explained above, a compound containing lithium, a compound containing sodium, a compound containing potassium, a compound containing niobium, a compound containing tantalum, a compound containing antimony, and an additive containing at least one metal element selected from palladium, silver, gold, ruthenium, rhodium, rhenium, osmium, iridium, and platinum are mixed and sintered in the above stoichiometric ratio. Due to this, it is possible to easily obtain the piezoelectric ceramic composition of the sixth aspect of the invention.

Further, the piezoelectric ceramic composition obtained after sintering has the above additive added to it, so in the same way as in the seventh aspect of the invention, has at least part of at least one type of the lithium, potassium, sodium, niobium, tantalum, and antimony of the compound of the above general formula substituted by at least one type of metal element selected from palladium, silver, gold, ruthenium, rhodium, rhenium, osmium, iridium, and platinum or has the above metal elements or oxides or perovskite structure compounds containing the same included in the grains or at the grain boundaries of the piezoelectric ceramic composition.

At this time, when mixing a compound containing lithium, a compound containing sodium, a compound containing potassium, a compound containing niobium, a compound containing tantalum, a compound containing antimony, and the above additive by a stoichiometric ratio considering substitution by metal elements included in the additive, it is possible to positively substitute at least part of at least one type of the lithium, sodium, potassium, niobium, tantalum, and antimony in the compound of the general formula with the metal elements included in the additive.

The "mixing . . . considering substitution by metal elements included in the additive" can be realized, for example when substituting the lithium of the compound of the above general formula by a metal element of the additive, reducing the amount of the compound containing the lithium and adding and mixing in the above additive in exactly the reduced amount and, overall, by mixing by a stoichiometric ratio so as to give a compound of the general formula $\{Li_x(K_{1-y}Na_y)_{1-x}\}(Nb_{1-z-w}Ta_zSb_w)O_3$ after sintering. When substituting the potassium, sodium, niobium, tantalum, or antimony in the above general formula as well, it is possible to realize this by reducing the amount of the compound containing the same and adding an additive containing the metal element desired to be substituted by in exactly the reduced amount. For example, when adding silver for substitution, the result becomes $\{Li_x(K_{1-y}Na_y)_{1-x}Ag_u\}(Nb_{1-z-w}Ta_zSb_w)O_3$.

On the other hand, by mixing a compound containing lithium, a compound containing sodium, a compound containing potassium, a compound containing niobium, a compound containing tantalum, and a compound containing antimony by a stoichiometric ratio giving a compound of the above general formula $\{Li_x(K_{1-y}Na_y)_{1-x}\}(Nb_{1-z-w}Ta_zSb_w)O_3$ after sintering and further mixing the above additive into this and sintering the result, it is possible to positively produce a piezoelectric ceramic composition containing the above metal elements or oxides or perovskite structure compounds containing the same.

Further, in the eighth aspect of the invention, the composition can be sintered at ordinary pressure. Further, the piezoelectric ceramic composition obtained after sintering does not contain lead and is superior in piezoelectric properties or dielectric properties. Therefore, it can be used as a material for a high performance piezoelectric element and dielectric element etc.

According to a ninth aspect of the invention, there is provided a piezoelectric element having a piezoelectric body comprised of a piezoelectric ceramic composition of the sixth aspect of the invention.

The piezoelectric element of the ninth aspect of the invention has a piezoelectric body comprised of the piezoelectric ceramic composition of the sixth aspect of the invention. Therefore, the piezoelectric element does not contain lead and is safe to the environment.

Further, the piezoelectric element enables the direct utilization of the property of the piezoelectric ceramic composition of being superior in properties unique to piezoelectric ceramic compositions such as the piezoelectric $d_{31}$ constant. Therefore, the piezoelectric element can be utilized as a piezoelectric sensor element having a high sensitivity, a piezoelectric vibrator and actuator having a high electromechanical energy conversion efficiency, etc.

According to a 10th aspect of the invention, there is provided a piezoelectric element having a piezoelectric body comprised of a piezoelectric ceramic composition produced by the method of production of the seventh or eighth aspect of the invention.

The piezoelectric element of the 10th aspect of the invention has a piezoelectric body comprised of a piezoelectric ceramic composition obtained by the above method of production. Therefore, the piezoelectric element directly utilizes the superior properties of the piezoelectric ceramic composition and can be utilized as a piezoelectric sensor element having a high sensitivity, a piezoelectric vibrator and actuator having a high electromechanical energy conversion efficiency, etc.

According to an 11th aspect of the invention, there is provided a dielectric element having a dielectric body comprised of a piezoelectric ceramic composition of the sixth aspect of the invention.

The dielectric element of the 11th aspect of the invention has a dielectric body comprised of the piezoelectric ceramic composition of the sixth aspect of the invention. Therefore, the dielectric element does not contain lead and is safe to the environment. Further, the dielectric element enables the direct utilization of the property of the piezoelectric ceramic composition of being superior in the relative dielectric constant, dielectric loss, etc. Therefore, the dielectric element can be utilized as a capacitor with a large electrostatic capacity.

According to a 12th aspect of the invention, there is provided a dielectric element having a dielectric body comprised of a piezoelectric ceramic composition produced by the method of production of the seventh or eighth aspect of the invention.

The dielectric element of the 12th aspect of the invention has a dielectric body comprised of a piezoelectric ceramic composition obtained by the above method of production. Therefore, the dielectric element directly utilizes the superior properties of the piezoelectric ceramic composition and can be utilized as a capacitor with a large electrostatic capacity etc.

(3) Means for Solving the Problem III

According to a 13th aspect of the invention, there is provided a piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein the piezoelectric ceramic composition contains at least one metal element selected from nickel, iron, manganese, copper, and zinc as an added element, and a total of the contents of the added elements is 0.001 mol to 0.08 mol with respect to 1 mole of the compound of the above general formula.

The above additive may be added to the above piezoelectric ceramic composition having the general formula by substitutional addition or external addition.

As described above, the piezoelectric ceramic composition of the invention has a general formula of a type of perovskite structure $ABO_3$ wherein elements of A site comprise either K and Na; or K, Na and Li; while elements of B site comprise Nb, Ta and Sb. In this formula, the ideal perovskite structure is attained when A:B is 1:1 (i.e. a stoichiometric ratio). However, for the purpose of the invention, the ratio A/B may vary because especially several % (e.g. 3%) of K, Na, Li and Sb may vaporize during sintering process, and all of the constituent elements may also vary to some extent (e.g. 3%) during mixing, milling or granulating. Thus, the stoichiometric composition may sometimes vary depending on the variation in manufacturing processes. Therefore, there are many cases where the formulation ratio of starting materials is intentionally adjusted in light of such a variation. It is true of conventional manufacturing processes for PZT, wherein the formulation ratio is commonly adjusted, taking into account that lead may vaporize during sintering and zirconia may be mingled as a contaminant from milling media of zirconia balls. For the purpose of the invention, the variation of the ratio A/B is allowed to the extent of ±5 mol % to obtain acceptable electric properties. Preferably, the variation of the ratio A/B is within ±3 mol % to obtain higher electric properties due to less lattice defect.

Next, the action and effects of the present invention will be explained. The piezoelectric ceramic composition of the present invention is a composition not containing lead. Therefore, the piezoelectric ceramic composition is safe in that its waste etc. do not leach harmful lead into the natural world.

Further, the piezoelectric ceramic composition contains the compound of the above general formula and has the x, y, z, and w in the above general formula in the above ranges. Therefore, the piezoelectric ceramic composition is superior in the piezoelectric $d_{31}$ constant, electromechanical coupling coefficient Kp, piezoelectric $g_{31}$ constant, and other piezoelectric properties, the relative dielectric constant δ dielectric loss tan δ, and other dielectric properties, and Curie temperature Tc. Note that a composition of the above general formula $\{Li_x(K_{1-y}Na_y)_{1-x}\}(Nb_{1-z-w}Ta_zSb_w)O_3$ not containing the above added elements will be referred to below as the "basic composition".

The piezoelectric ceramic composition contains, in addition to the compound of the basic composition of the above general formula, at least one type of metal element selected from nickel, iron, manganese, copper, and zinc as added elements in a total in the above range of content. Therefore, the piezoelectric ceramic composition of the present invention can be maintained at a high piezoelectric $d_{31}$ constant equal to that of a piezoelectric ceramic composition of the above general formula not containing the added elements while being improved in the mechanical quality factor Qm. That is, it is possible to realize a piezoelectric ceramic composition superior in both of the piezoelectric $d_{31}$ constant and the mechanical quality factor Qm.

In this way, the piezoelectric ceramic composition does not contain lead and therefore is safe to the environment and further has superior piezoelectric properties, so can be utilized as a high performance piezoelectric element. In particular, since the piezoelectric ceramic composition has a high mechanical quality factor Qm as explained above, a piezoelectric element using this piezoelectric ceramic composition is suppressed in heat generation when driving it in an electric field and therefore is more superior.

Further, the piezoelectric ceramic composition is superior in the relative dielectric constant, dielectric loss, and other dielectric properties in addition to the above piezoelectric properties. Therefore, the piezoelectric ceramic composition of the present invention can be utilized as a high performance dielectric element as well. That is, the piezoelectric ceramic composition of the 13th aspect of the invention is not limited to a piezoelectric ceramic composition having piezoelectric properties and includes in concept a dielectric ceramic composition having dielectric properties as well.

According to a 14th aspect of the invention, there is provided a method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from nickel, iron, manganese, copper, and zinc.

The above additive may be added to the above piezoelectric ceramic composition having the general formula by substitutional addition or external addition.

The mixture obtained by mixing the compound of the above general formula and the above additive can be sintered under ordinary pressure. Therefore, it is possible to fire it simply and at a low cost. Further, the piezoelectric ceramic composition obtained after sintering does not contain lead and is superior in piezoelectric $d_{31}$ constant, electromechanical coupling coefficient Kp, mechanical quality factor Qm, and other piezoelectric properties or dielectric loss, relative dielectric constant, and other dielectric properties. Therefore, it can be used as a material for a high performance piezoelectric element or dielectric element.

Further, the piezoelectric ceramic composition obtained after sintering has the above additive added to it, so has at least part of at least one type of the lithium, potassium, sodium, niobium, tantalum, and antimony of the compound of the above general formula substituted by at least one type of metal element selected from nickel, iron, manganese, copper, and zinc or has the above metal elements or oxides or perovskite structure compounds containing the same included in the grains or at the grain boundaries of the piezoelectric ceramic composition. Note that the "containing an additive" in this specification includes all of the above meanings.

According to a 15th aspect of the invention, there is provided a method of production of a piezoelectric ceramic composition comprising mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ or a stoichiometric ratio considering substitution by a metal element contained in the following additive, mixing an additive containing at least one metal element selected from nickel, iron, manganese, copper, and zinc, and sintering the result.

The above additive may be added to the above piezoelectric ceramic composition having the general formula by substitutional addition or external addition.

In the 15th aspect of the invention, as explained above, a compound containing lithium, a compound containing sodium, a compound containing potassium, a compound containing niobium, a compound containing tantalum, a compound containing antimony, and an additive containing at least one metal element selected from nickel, iron, manganese, copper, and zinc are mixed and sintered in the above stoichiometric ratio. Due to this, it is possible to easily obtain the piezoelectric ceramic composition of the 13th aspect of the invention.

Further, the piezoelectric ceramic composition obtained after sintering has the above additive added to it, so in the same way as in the 14th aspect of the invention, has at least part of at least one type of the lithium, potassium, sodium, niobium, tantalum, and antimony of the compound of the above general formula substituted by at least one type of metal element selected from nickel, iron, manganese, copper, and zinc or has the above metal elements or oxides or perovskite structure compounds containing the same included in the grains or at the grain boundaries of the piezoelectric ceramic composition.

At this time, when mixing a compound containing lithium, a compound containing sodium, a compound containing potassium, a compound containing niobium, a compound containing tantalum, a compound containing antimony, and the above additive by a stoichiometric ratio considering substitution by metal elements included in the additive, it is possible to positively substitute at least part of at least one type of the lithium, sodium, potassium, niobium, tantalum, and antimony in the compound of the general formula with the metal elements included in the additive.

The "mixing . . . considering substitution by metal elements included in the additive" can be realized, for example when substituting the lithium of the compound of the above general formula by a metal element of the additive, reducing the amount of the compound containing the lithium and adding and mixing in the above additive in exactly the reduced amount and, overall, by mixing by a stoichiometric ratio so as to give a compound of the general formula $\{Li_x(K_{1-y}Na_y)_{1-x}\}(Nb_{1-z-w}Ta_zSb_w)O_3$ after sintering. When substituting the potassium, sodium, niobium, tantalum, or antimony in the above general formula as well, it is possible to realize this by reducing the amount of the compound containing the same and adding an additive containing the metal element desired to be substituted by in exactly the reduced amount.

On the other hand, by mixing a compound containing lithium, a compound containing sodium, a compound containing potassium, a compound containing niobium, a compound containing tantalum, and a compound containing antimony by a stoichiometric ratio giving a compound of the above general formula $\{Li_x(K_{1-y}Na_y)_{1-x}\}(Nb_{1-z-w}Ta_zSb_w)O_3$ after sintering and further mixing the above additive into this and sintering the result, it is possible to positively produce a piezoelectric ceramic composition containing the above metal elements or oxides or perovskite structure compounds containing the same.

Further, in the 15th aspect of the invention, the composition can be sintered at ordinary pressure. Further, the piezoelectric ceramic composition obtained after sintering does not contain lead and is superior in piezoelectric properties or dielectric properties. Therefore, it can be used as a material for a high performance piezoelectric element and dielectric element etc.

According to a 16th aspect of the invention, there is provided a piezoelectric element having a piezoelectric body comprised of a piezoelectric ceramic composition of the 13th aspect of the invention.

The piezoelectric element of the 16th aspect of the invention has a piezoelectric body comprised of the piezoelectric ceramic composition of the 13th aspect of the invention. Therefore, the piezoelectric element does not contain lead and is safe to the environment.

Further, the piezoelectric element enables the direct utilization of the property of the piezoelectric ceramic composition of being superior in properties unique to piezoelectric ceramic compositions such as the piezoelectric $d_{31}$ constant and mechanical quality factor Qm. Therefore, the piezoelectric element can be utilized as a piezoelectric sensor element having a high sensitivity, a piezoelectric vibrator and actuator having a high electromechanical energy conversion efficiency, etc.

According to a 17th aspect of the invention, there is provided a piezoelectric element having a piezoelectric body comprised of a piezoelectric ceramic composition produced by the method of production of the 14th or 15th aspect of the invention.

The piezoelectric element of the 17th aspect of the invention has a piezoelectric body comprised of a piezoelectric ceramic composition obtained by the above method of production. Therefore, the piezoelectric element directly utilizes the superior properties of the piezoelectric ceramic composition and can be utilized as a piezoelectric sensor element having a high sensitivity, a piezoelectric vibrator and actuator having a high electromechanical energy conversion efficiency, etc.

According to an 18th aspect of the invention, there is provided a dielectric element having a dielectric body comprised of a piezoelectric ceramic composition of the 13th aspect of the invention.

The dielectric element of the 18th aspect of the invention has a dielectric body comprised of the piezoelectric ceramic composition of the 13th aspect of the invention. Therefore, the dielectric element does not contain lead and is safe to the environment. Further, the dielectric element enables the direct utilization of the property of the piezoelectric ceramic composition of being superior in the relative dielectric constant, dielectric loss, etc. Therefore, the dielectric element can be utilized as a capacitor with a large electrostatic capacity.

According to a 19th aspect of the invention, there is provided a dielectric element having a dielectric body comprised of a piezoelectric ceramic composition produced by the method of production of the 14th or 15th aspect of the invention.

The dielectric element of the 19th aspect of the invention has a dielectric body comprised of a piezoelectric ceramic composition obtained by the above method of production. Therefore, the dielectric element directly utilizes the superior properties of the piezoelectric ceramic composition and can be utilized as a capacitor with a large electrostatic capacity etc.

(4) Means for Solving the Problem IV

According to a 20th aspect of the invention, there is provided a piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein the piezoelectric ceramic composition contains at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium, a total of the contents of the added elements is 0.0005 mol to 0.15 mol with respect to 1 mole of the compound of the above general formula, and an open porosity is not more than 0.4 vol %.

As described above, the piezoelectric ceramic composition of the invention has a general formula of a type of perovskite structure $ABO_3$ wherein elements of A site comprise either K and Na; or K, Na and Li; while elements of B site comprise Nib, Ta and Sb. In this formula, the ideal perovskite structure is attained when A:B is 1:1 (i.e. a stoichiometric ratio). However, for the purpose of the invention, the ratio A/B may vary because especially several % (e.g. 3%) of K, Na, Li and Sb may vaporize during sintering process, and all of the constituent elements may also vary to some extent (e.g. 3%) during mixing, milling or granulating. Thus, the stoichiometric composition may sometimes vary depending on the variation in manufacturing processes. Therefore, there are many cases where the formulation ratio of starting materials is intentionally adjusted in light of such a variation. It is true of conventional manufacturing processes for PZT, wherein the formulation ratio is commonly adjusted, taking into account that lead may vaporize during sintering and zirconia may be mingled as a contaminant from milling media of zirconia balls. For the purpose of the invention, the variation of the ratio A/B is allowed to the extent of ±5 mol % to obtain acceptable electric properties. Preferably, the variation of the ratio A/B is within ±3 mol % to obtain higher electric properties due to less lattice defect.

Next, the action and effects of the present invention will be explained. The piezoelectric ceramic composition of the present invention is a composition not containing lead. Therefore, the piezoelectric ceramic composition is safe in that its waste etc. do not leach harmful lead into the natural world.

Further, the piezoelectric ceramic composition contains the compound of the above general formula and contains the above added elements in the above range. Therefore, when sintering the piezoelectric ceramic composition at the time of fabrication, the added elements act as sintering aids to promote densification and enable easy sintering. Therefore, a good quality piezoelectric ceramic composition having a high apparent density and small number of pores is formed. Note that the porosity is the amount of pores caused inside and at the back surface of the piezoelectric ceramic composition expressed by vol %, while the open porosity is the amount of depressions formed at the front surface of the piezoelectric ceramic composition expressed by volt, Further, the piezoelectric ceramic composition of the present invention has a low open porosity of not more than 0.4 vol %. Therefore, the piezoelectric ceramic composition can be utilized as a piezoelectric element superior in mechanical strength, resistant to degradation, and high in reliability such as a piezoelectric actuator, a piezoelectric vibrator, a surface wave filter, a piezoelectric sensor element, an ultrasonic motor, and a piezoelectric transformer.

Further, the piezoelectric ceramic composition of the present invention contains a compound of the above general formula $\{Li_x(K_{1-y}Na_y)_{1-x}\}Nb_{1-z-w}Ta_zSb_w)O_3$ as its main ingredient. Therefore, the piezoelectric ceramic composition utilizes the superior piezoelectric and dielectric properties of the compound of the above general formula such as the piezoelectric $d_{31}$ constant, electromechanical coupling coefficient Kp, piezoelectric $g_{31}$ constant, mechanical quality factor Qm, relative dielectric constant, dielectric loss, and Curie temperature and becomes superior in these properties. Therefore, the piezoelectric ceramic composition can be utilized for a high performance piezoelectric element and dielectric element.

Note that a composition of the above general formula $\{Li_x(K_{1-y}Na_y)_{1-x}\}(Nb_{1-z-w}Ta_zSb_w)O_3$ not containing the above added elements will be referred to below as the "basic composition".

According to a 21st aspect of the invention, there is provided a method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium.

The mixture obtained by mixing the compound of the above general formula and the above additive can be sintered under ordinary pressure. Therefore, it is possible to fire it simply and at a low cost.

In particular, the piezoelectric ceramic composition of the above general formula has an additive containing the above metal elements added to it. Therefore, the added elements act as sintering aids and the piezoelectric ceramic composition becomes easier to sinter at the time of sintering. As a result, it is possible to improve the apparent density of the piezoelectric ceramic composition after sintering and possible to make formation of large pores at the front surface and inside more difficult and reduce the porosity and open porosity. Therefore, it is possible to improve the mechanical strength of the piezoelectric ceramic composition after sintering.

The piezoelectric ceramic composition obtained after sintering has the above additive added to it, so has at least part of at least one type of the lithium, potassium, sodium, niobium, tantalum, and antimony of the compound of the above general formula substituted by at least one type of metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium or has the above metal elements or oxides or perovskite structure compounds containing the same included in the grains or at the grain boundaries of the piezoelectric ceramic composition. Note that the "containing an additive" in this specification includes all of the above meanings.

Further, the piezoelectric ceramic composition obtained after sintering does not contain lead and is superior in piezoelectric $d_{31}$ constant, electromechanical coupling coefficient Kp, piezoelectric $g_{31}$ constant, mechanical quality factor Qm, relative dielectric constant, dielectric loss, curie temperature, and other piezoelectric and dielectric properties. Therefore, it can be used as a material for a high performance piezoelectric element or dielectric element.

According to a 22nd aspect of the invention, there is provided a method of production of a piezoelectric ceramic composition comprising mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ or a stoichiometric ratio considering substitution by a metal element contained in the following additive, mixing an additive containing at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium, and sintering the result.

In the 22nd aspect of the invention, as explained above, a compound containing lithium, a compound containing sodium, a compound containing potassium, a compound containing niobium, a compound containing tantalum, a compound containing antimony, and an additive containing at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium are mixed and sintered in the above stoichiometric ratio. Due to this, it is possible to easily obtain the piezoelectric ceramic composition of the 20th aspect of the invention.

Further, the piezoelectric ceramic composition obtained after sintering has the above additive added to it, so in the same way as in the 21st aspect of the invention, has at least part of at least one type of the lithium, potassium, sodium, niobium, tantalum, and antimony of the compound of the above general formula substituted by at least one type of metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium or has the above metal elements or oxides or perovskite structure compounds containing the same included in the grains or at the grain boundaries of the piezoelectric ceramic composition.

At this time, when mixing a compound containing lithium, a compound containing sodium, a compound containing potassium, a compound containing niobium, a compound containing tantalum, a compound containing antimony, and the above additive by a stoichiometric ratio considering substitution by metal elements included in the additive, it is possible to positively substitute at least part of at least one type of the lithium, sodium, potassium, niobium, tantalum, and antimony in the compound of the general formula with the metal elements included in the additive.

The "mixing . . . considering substitution by metal elements included in the additive" can be realized, for example when substituting the lithium of the compound of the above general formula by a metal element of the additive, reducing the amount of the compound containing the lithium and adding and mixing in the above additive in exactly the reduced amount and, overall, by mixing by a stoichiometric ratio so as to give a compound of the general formula $\{Li_x(K_{1-y}Na_y)_{1-x}\}(Nb_{1-z-w}Ta_zSb_w)O_3$ after sintering. When substituting the potassium, sodium, niobium, tantalum, or antimony in the above general formula as well, it is possible to realize this by reducing the amount of the compound containing the same and adding an additive containing the metal element desired to be substituted by in exactly the reduced amount.

On the other hand, by mixing a compound containing lithium, a compound containing sodium, a compound containing potassium, a compound containing niobium, a compound containing tantalum, and a compound containing antimony by a stoichiometric ratio giving a compound of the above general formula $\{Li_x(K_{1-y}Na_y)_{1-x}\}(Nb_{1-z-w}Ta_zSb_w)O_3$ after sintering and further mixing the above additive into this and sintering the result, it is possible to positively produce a piezoelectric ceramic composition containing the above metal elements or oxides or perovskite structure compounds containing the same.

Further, in the 22nd aspect of the invention, the composition can be sintered at ordinary pressure. Therefore, the piezoelectric ceramic composition can be produced simply and at a low cost. Further, the piezoelectric ceramic composition obtained after sintering does not contain lead, is high in apparent density, has a small porosity and open porosity, and is superior in piezoelectric properties or dielectric properties. Therefore, it is superior in mechanical strength and can be used as a material for a high performance piezoelectric element and dielectric element etc.

According to a 23rd aspect of the invention, there is provided a piezoelectric element having a piezoelectric body comprised of a piezoelectric ceramic composition of the 20th aspect of the invention.

The piezoelectric element of the 23rd aspect of the invention has a piezoelectric body comprised of the piezoelectric ceramic composition of the 20th aspect of the invention. Therefore, the piezoelectric element does not contain lead and is safe to the environment.

Further, the piezoelectric element utilizes the property of the piezoelectric ceramic composition of being high in apparent density and low in porosity and open porosity and becomes superior in mechanical strength.

Further, the piezoelectric element enables the direct utilization of the property of the piezoelectric ceramic composition of being superior in piezoelectric properties. Therefore, the piezoelectric element can be utilized as a piezoelectric sensor having a high sensitivity, a piezoelectric vibrator and actuator having a high electromechanical energy conversion efficiency, etc.

According to a 24th aspect of the invention, there is provided a piezoelectric element having a piezoelectric body comprised of a piezoelectric ceramic composition produced by the method of production of the 21st or 22nd aspect of the invention.

The piezoelectric element of the 24th aspect of the invention has a piezoelectric body comprised of a piezoelectric ceramic composition obtained by the above method of production. Therefore, the piezoelectric element directly utilizes the superior properties of the piezoelectric ceramic composition, is superior in mechanical properties, and can be utilized as a piezoelectric sensor having a high sensitivity, a piezoelectric vibrator and actuator having a high electromechanical energy conversion efficiency, etc.

According to a 25th aspect of the invention, there is provided a dielectric element having a dielectric body comprised of a piezoelectric ceramic composition of the 20th aspect of the invention.

The dielectric element of the 25th aspect of the invention has a dielectric body comprised of the piezoelectric ceramic composition of the 20th aspect of the invention. Therefore, the dielectric element does not contain lead and is safe to the environment. Further, the dielectric element enables the direct utilization of the properties of the piezoelectric ceramic composition, is superior in mechanical strength, and is superior in relative dielectric constant and other dielectric properties. Therefore, the dielectric element can be utilized as a capacitor with a large electrostatic capacity.

According to a 26th aspect of the invention, there is provided a dielectric element having a dielectric body comprised of a piezoelectric ceramic composition produced by the method of production of the 21st or 22nd aspect of the invention.

The dielectric element of the 26th aspect of the invention has a dielectric body comprised of a piezoelectric ceramic composition obtained by the above method of production. Therefore, the dielectric element directly utilizes the superior properties of the piezoelectric ceramic composition, is superior in mechanical strength, and can be utilized as a capacitor with a large electrostatic capacity etc.

(5) Means for Solving the Problem V

According to a 27th aspect of the invention, there is provided a piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein the piezoelectric ceramic composition contains at least one metal element selected from magnesium, calcium, strontium, and barium as an added element, and a total of the contents of the added elements is 0.0001 mol to 0.10 mol with respect to 1 mole of the compound of the above general formula.

The above additive may be added to the above piezoelectric ceramic composition having the general formula by substitutional addition or external addition.

Further, according to a 28th aspect of the invention, there is provided a piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein the piezoelectric ceramic composition contains at least one metal element selected from silicon, indium, and scandium as an added element, and a total of the contents of the added elements is not more than 0.08 mol with respect to 1 mole of the compound of the above general formula.

The above additive may be added to the above piezoelectric ceramic composition having the general formula by substitutional addition or external addition.

Preferably, the total of the contents of said added elements is 0.0001 mol to 0.08 mol with respect to 1 mole of the compound of the above general formula.

Further, according to a 29th aspect of the invention, there is provided a piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein the piezoelectric ceramic composition contains bismuth as an added element, and a content of the added element is 0.0001 mol to 0.004 mol with respect to 1 mole of the compound of the above general formula.

The above additive may be added to the above piezoelectric ceramic composition having the general formula by substitutional addition or external addition.

As described above, the piezoelectric ceramic composition of the invention has a general formula of a type of perovskite structure $ABO_3$ wherein elements of A site comprise either K and Na; or K, Na and Li; while elements of B site comprise Nb, Ta and Sb. In this formula, the ideal perovskite structure is attained when A:B is 1:1 (i.e. a stoichiometric ratio). However, for the purpose of the invention, the ratio A/B may vary because especially several % (e.g. 3%) of K, Na, Li and Sb may vaporize during sintering process, and all of the constituent elements may also vary to some extent (e.g. 3%) during mixing, milling or granulating. Thus, the stoichiometric composition may sometimes vary depending on the variation in manufacturing processes. Therefore, there are many cases where the formulation ratio of starting materials is intentionally adjusted in light of such a variation. It is true of conventional manufacturing processes for PZT, wherein the formulation ratio is commonly adjusted, taking into account that lead may vaporize during sintering and zirconia may be mingled as a contaminant from milling media of zirconia balls. For the purpose of the invention, the variation of the ratio A/B is allowed to the extent of ±5 mol % to obtain acceptable electric properties. Preferably, the variation of the ratio A/B is within ±3 mol % to obtain higher electric properties due to less lattice defect.

Next, the action and effects of the 27th to 29th aspects of the present invention will be explained. The piezoelectric ceramic composition of each of the 27th to 29th aspects of the present invention is a composition not containing lead. Therefore, the piezoelectric ceramic composition is safe in that its waste etc. do not leach harmful lead into the natural world.

Further, the piezoelectric ceramic composition of each aspect contains the compound of the above general formula and has the x, y, z, and w in the above general formula in the above ranges. Therefore, the piezoelectric ceramic composition is superior in the piezoelectric $d_{31}$ constant, electromechanical coupling coefficient Kp, piezoelectric $g_{31}$ constant, mechanical quality factor Qm, and other piezoelectric properties, the relative dielectric constant $\varepsilon_{33T}/\varepsilon_0$, dielectric loss tan$\delta$, and other dielectric properties, and Curie temperature Tc. Note that a composition of the above general formula $\{Li_x(K_{1-y}Na_y)_{1-x}\}(Nb_{1-z-w}Ta_zSb_w)O_3$ not containing the above added elements will be referred to below as the "basic composition".

The piezoelectric ceramic composition of the 27th aspect of the invention contains, in addition to the compound of the basic composition of the above general formula, at least one type of metal element selected from magnesium, calcium, strontium, and barium as added elements in a total in the above range of content. The piezoelectric ceramic composition of the 28th aspect of the invention contains, in addition to the compound of the basic composition of the above general formula, at least one type of metal element selected from silicon, indium, and scandium as added elements in a total in the above range of content. The piezoelectric ceramic composition of the 29th aspect of the invention contains, in addition to the compound of the basic composition of the above general formula, bismuth as an added element in the above range of content.

Therefore, the piezoelectric ceramic composition of each of the 27th to 29th aspects of the invention is further improved in at least one property among the piezoelectric $d_{31}$ constant, piezoelectric $g_{31}$ constant, electromechanical coupling coefficient Kp, and relative dielectric constant $\varepsilon_{33T}/\varepsilon_0$ and is more superior even compared with a piezoelectric ceramic composition of the above general formula not containing the added elements.

In this way, the piezoelectric ceramic composition of each of the 27th to 29th aspects of the invention does not contain lead and therefore is safe to the environment and further has superior piezoelectric properties, so can be utilized as a high performance piezoelectric element.

Further, the piezoelectric ceramic composition of each aspect is superior in the relative dielectric constant, dielectric loss, and other dielectric properties in addition to the above piezoelectric properties. Therefore, the piezoelectric ceramic composition of each of the 27th to 29th aspects of the invention can be utilized as a high performance dielectric element as well. That is, the piezoelectric ceramic composition of each aspect is not limited to a piezoelectric ceramic composition having piezoelectric properties and includes in concept a dielectric ceramic composition having dielectric properties as well.

According to a 30th aspect of the invention, there is provided a method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from magnesium, calcium, strontium, and barium.

The above additive may be added to the above piezoelectric ceramic composition having the general formula by substitutional addition or external addition.

According to a 31st aspect of the invention, there is provided a method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from silicon, indium, and scandium.

The above additive may be added to the above piezoelectric ceramic composition having the general formula by substitutional addition or external addition.

According to a 32nd aspect of the invention, there is provided a method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including bismuth.

The above additive may be added to the above piezoelectric ceramic composition having the general formula by substitutional addition or external addition.

The mixture obtained by mixing the compound of the above general formula and the above additive in each of the 30th to 32nd aspects of the invention can be sintered under ordinary pressure. Therefore, it is possible to fire it simply and at a low cost. Further, the piezoelectric ceramic composition obtained after sintering does not contain lead and is superior in piezoelectric $d_{31}$ constant, electromechanical coupling coefficient Kp, and other piezoelectric properties or relative dielectric constant, dielectric loss, and other dielectric properties. Therefore, it can be used as a material for a high performance piezoelectric element or dielectric element.

Further, in the 30th aspect of the invention, the piezoelectric ceramic composition obtained after sintering has the above additive added to it, so has at least part of at least one type of the lithium, potassium, sodium, niobium, tantalum, and antimony of the compound of the above general formula substituted by at least one type of metal element selected from magnesium, calcium, strontium, and barium or has the above metal elements or oxides or perovskite structure compounds containing the same included in the grains or at the grain boundaries of the piezoelectric ceramic composition.

Further, in the 31st aspect of the invention, the piezoelectric ceramic composition obtained after sintering has the above additive added to it, so has at least part of at least one type of the lithium, potassium, sodium, niobium, tantalum, and antimony of the compound of the above general formula substituted by at least one type of metal element selected from silicon, indium, and scandium or has the above metal elements or oxides or perovskite structure compounds containing the same included in the grains or at the grain boundaries of the piezoelectric ceramic composition.

Further, in the 32nd aspect of the invention, the piezoelectric ceramic composition obtained after sintering has the above additive added to it, so has at least part of at least one type of the lithium, potassium, sodium, niobium, tantalum, and antimony of the compound of the above general formula substituted by bismuth or has the bismuth or oxides or perovskite structure compounds containing the same included in the grains or at the grain boundaries of the piezoelectric ceramic composition.

According to a 33rd aspect of the invention, there is provided a method of production of a piezoelectric ceramic composition comprising preparing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ or a stoichiometric ratio considering substitution by a metal element contained in the following additive, mixing an additive containing at least one metal element selected from magnesium, calcium, strontium, and barium, and sintering the result.

According to a 34th aspect of the invention, there is provided a method of production of a piezoelectric ceramic composition comprising preparing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ or a stoichiometric ratio considering substitution by a metal element contained in the following additive, mixing an additive containing at least one metal element selected from silicon, indium, and scandium, and sintering the result.

According to a 35th aspect of the invention, there is provided a method of production of a piezoelectric ceramic composition comprising preparing a compound containing lithium, a compound containing Sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ or a stoichiometric ratio considering substitution by a metal element contained in the following additive, mixing an additive containing bismuth, and sintering the result.

According to the 33rd, 34th, and 35th aspects of the invention, it is possible to simply fabricate piezoelectric ceramic compositions of the 27th, 28th, and 29th aspects of the invention. Further, in the 33rd, 34th, and 35th aspects of the invention, the compositions can be sintered at ordinary pressure. Therefore, the piezoelectric ceramic compositions can be produced simply and at a low cost. Further, the piezoelectric ceramic compositions obtained after sintering do not contain lead and are superior in piezoelectric properties and dielectric properties. Therefore, they can be utilized as materials for a high performance piezoelectric element or dielectric element.

Further, in the 33rd aspect of the invention, the piezoelectric ceramic composition obtained after sintering has the above additive added to it, so has at least part of at least one type of the lithium, potassium, sodium, niobium, tantalum, and antimony of the compound of the above general formula substituted by at least one type of metal element selected from magnesium, calcium, strontium, and barium or has the above metal elements or oxides or perovskite structure compounds containing the same included in the grains or at the grain boundaries of the piezoelectric ceramic composition.

Further, in the 34th aspect of the invention, the piezoelectric ceramic composition obtained after sintering has the above additive added to it, so has at least part of at least one type of the lithium, potassium, sodium, niobium, tantalum, and antimony of the compound of the above general formula substituted by at least one type of metal element selected from silicon, indium, and scandium or has the above metal elements or oxides or perovskite structure compounds containing the same included in the grains or at the grain boundaries of the piezoelectric ceramic composition.

Further, in the 35th aspect of the invention, the piezoelectric ceramic composition obtained after sintering has the above additive added to it, so has at least part of at least one type of the lithium, potassium, sodium, niobium, tantalum, and antimony of the compound of the above general formula substituted by bismuth or has the bismuth or oxides or perovskite structure compounds containing the same included in the grains or at the grain boundaries of the piezoelectric ceramic composition.

In the 33rd to 35th aspects of the invention, when mixing a compound containing lithium, a compound containing sodium, a compound containing potassium, a compound containing niobium, a compound containing tantalum, a compound containing antimony, and the above additive by a stoichiometric ratio considering substitution by metal elements included in the additive, it is possible to positively substitute at least part of at least one type of the lithium, sodium, potassium, niobium, tantalum, and antimony in the compound of the general formula with the metal elements or bismuth atoms included in the additive.

The "preparing . . . considering substitution by metal elements included in the additive" in the 33rd and 34th aspects of the invention and the "preparing . . . considering substitution by bismuth atoms included in the additive" can be realized, for example when substituting the lithium of the compound of the above general formula by a metal element or bismuth atoms of the additive, reducing the amount of the compound containing the lithium and adding and mixing in the above additive in exactly the reduced amount and, overall, by mixing by a stoichiometric ratio so as to give a compound of the general formula $\{Li_x(K_{1-y}Na_y)_{1-x}\}(Nb_{1-z-w}Ta_zSb_w)O_3$ after sintering.

When substituting the potassium, sodium, niobium, tantalum, or antimony in the above general formula as well, it is possible to realize this by reducing the amount of the compound containing the same and adding an additive containing the metal element or bismuth atoms desired to be substituted by in exactly the reduced amount.

On the other hand, by preparing a compound containing lithium, a compound containing sodium, a compound containing potassium, a compound containing niobium, a compound containing tantalum, and a compound containing antimony by a stoichiometric ratio giving a compound of the above general formula $\{Li_x(K_{1-y}Na_y)_{1-x}\}(Nb_{1-z-w}Ta_zSb_w)O_3$ after sintering or before sintering and further mixing the above additive into this, it is possible to positively produce a piezoelectric ceramic composition containing the above metal elements or bismuth or oxides or perovskite structure compounds containing the same.

According to a 36th aspect of the invention, there is provided a piezoelectric element having a piezoelectric body comprised of a piezoelectric ceramic composition of the 27th to 29th aspects of the invention.

The piezoelectric element of the 36th aspect of the invention has a piezoelectric body comprised of the piezoelectric ceramic composition of the 27th to 29th aspect of the invention. Therefore, the piezoelectric element does not contain lead and is safe to the environment.

Further, the piezoelectric element enables the direct utilization of the property of the piezoelectric ceramic composition of being superior in properties such as the piezoelectric $d_{31}$ constant. Therefore, the piezoelectric element can be utilized as a piezoelectric sensor having a high sensitivity or a piezoelectric element having a high electromechanical energy conversion efficiency such as a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor.

According to a 37th aspect of the invention, there is provided a piezoelectric element having a piezoelectric body comprised of a piezoelectric ceramic composition produced by the method of production of the 30th to 35th aspects of the invention.

The piezoelectric element of the 37th aspect of the invention has a piezoelectric body comprised of a piezoelectric ceramic composition obtained by the method of production of the 30th to 35th aspects of the invention. Therefore, the piezoelectric element directly utilizes the superior properties of the piezoelectric ceramic composition and can be utilized as a piezoelectric sensor having a high sensitivity or a piezoelectric element having a high electromechanical energy conversion efficiency such as a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor.

According to a 38th aspect of the invention, there is provided a dielectric element having a dielectric body comprised of a piezoelectric ceramic composition of the 27th to 29th aspects of the invention.

The dielectric element of the 38th aspect of the invention has a dielectric body comprised of the piezoelectric ceramic composition of the 27th to 29th aspects of the invention. Therefore, the dielectric element does not contain lead and is safe to the environment. Further, the dielectric element enables the direct utilization of the property of the piezoelectric ceramic composition of being superior in the relative dielectric constant, dielectric loss, etc. Therefore, the dielectric element can be utilized as a capacitor with a large electrostatic capacity.

According to a 39th aspect of the invention, there is provided a dielectric element having a dielectric body comprised of a piezoelectric ceramic composition produced by the method of production of the 30th to 35th aspects of the invention.

The dielectric element of the 39th aspect of the invention has a dielectric body comprised of a piezoelectric ceramic composition obtained by the method of production of the 30th to 35th aspects of the invention. Therefore, the dielectric element directly utilizes the superior properties of the piezoelectric ceramic composition and can be utilized as a capacitor with a large electrostatic capacity etc.

BRIEF DESCRIPTION OF THE DRAWINGS

These and other objects and features of the present invention will become clearer from the following description of the preferred embodiments given with reference to the attached FIG. 1 which is a view explaining the relationship between the value of y in the above general formula $\{Li_x(K_{1-y}Na_y)_{1-x}\}(Nb_{1-z-w}Ta_zSb_w)O_3$ and the piezoelectric $d_{31}$ constant.

DESCRIPTION OF THE PREFERRED EMBODIMENTS

Figure 1:
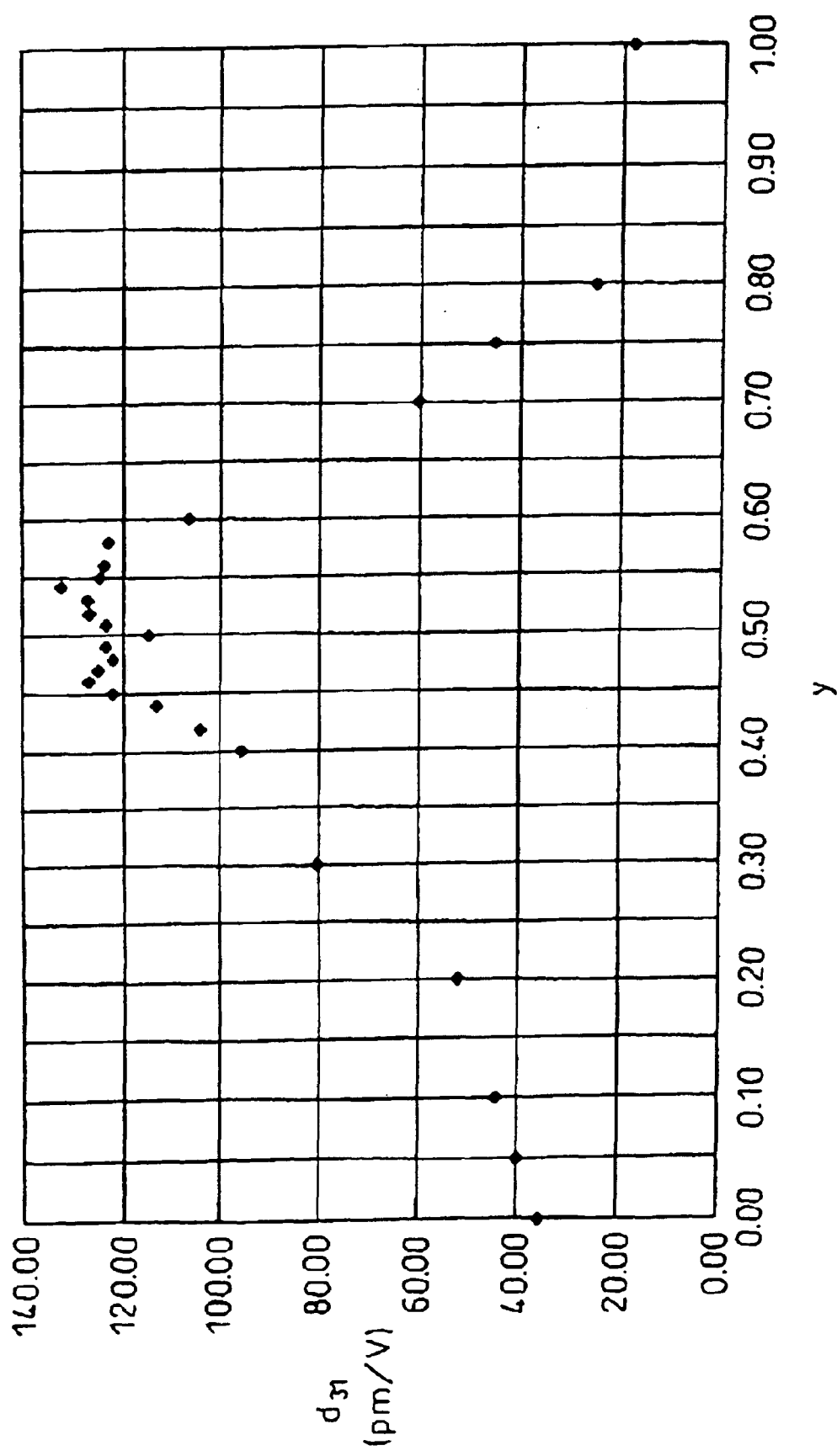

Preferred embodiments of the present invention will be described in detail below while referring to the attached figures.

(1) Invention I

In the present invention I, the piezoelectric ceramic composition is expressed by a general formula $\{Li_x(K_{1-y}Na_y)_{1-x}\}(Nb_{1-z-w}Ta_zSb_w)O_3$ and has an x, y, z, and w in the ranges of $0 \leq x \leq 0.2$, $0 \leq y \leq 1$, $0 < z \leq 0.4$, and $0 < w \leq 0.2$. Here, when $x>0.2$, $z>0.4$, $w>0.2$, $z=0$, or $w=0$, the piezoelectric $d_{31}$ constant and other properties unique to the piezoelectric ceramic composition drop and a piezoelectric ceramic composition having the desired properties is liable to not be able to be obtained any longer.

Further, the range of y in the general formula $\{Li_x(K_{1-y}Na_y)_{1-x}\}(Nb_{1-z-w}Ta_zSb_w)O_3$ is preferably $0 \leq x \leq 0.85$.

Further, in the general formula $\{Li_x(K_{1-y}Na_y)_{1-x}\}(Nb_{1-z-w}Ta_zSb_w)O_3$ preferably $z+w \leq 0.37$. In this case, the piezoelectric $d_{31}$ constant and other properties unique to the piezoelectric ceramic composition can be further improved.

The piezoelectric ceramic composition has piezoelectric properties and dielectric properties and can be used as a piezoelectric body and as a dielectric body. Specifically, it can be used for example as a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

In the first aspect of the invention, preferably the range of x in the general formula $\{Li_x(K_{1-y}Na_y)_{1-x}\}(Nb_{1-z-w}Ta_zSb_w)O_3$ is $0<x \leq 0.2$. In this case, since lithium becomes an essential ingredient, the piezoelectric ceramic composition can be more easily prepared as a sintered body at the time of sintering, the piezoelectric properties can be further improved, and the Curie temperature can be further raised. This is because the inclusion of lithium as an essential ingredient in the above range causes the sintering temperature to drop, the lithium functions as a sintering aid, and sintering with little pores becomes possible.

Next, the value of x in the general formula $\{Li_x(K_{1-y}Na_y)_{1-x}\}(Nb_{1-z-w}Ta_zSb_w)O_3$ can be made x=0. In this case, the above formula is expressed by $(K_{1-y}Na_y)(Nb_{1-z-w}Ta_zSb_w)O_3$. Further, in this case, when preparing the piezoelectric ceramic composition, since the materials do not include any compound containing the lightest weight lithium such as $Li_2CO_3$, when mixing the materials to prepare the piezoelectric ceramic composition, it is possible to reduce the variation in properties due to segregation of the powder materials. Further, in this case, a high relative dielectric constant and relatively large piezoelectric g constant can be realized.

Further, preferably the range of y in the general formula $\{Li_x(K_{1-y}Na_y)_{1-x}\}(Nb_{1-z-w}Ta_zSb_w)O_3$ is made $0<y\leq1$. In this case, it is possible to further improve the piezoelectric $g_{31}$ constant of the piezoelectric ceramic composition. Further, the range of y is more preferably $0.05\leq y\leq0.75$. In this case, it is possible to further improve the piezoelectric $d_{31}$ constant and electromechanical coupling coefficient Kp of the piezoelectric ceramic composition. More preferably, $0.05\leq y<0.75$, $0.35\leq y\leq0.65$, or even $0.35\leq y<0.65$. Most preferably $0.42\leq y\leq0.60$.

Further, in the above general formula, the value of y may be made y=0. In this case, the general formula is expressed by $\{Li_xK_{1-x}\}(Nb_{1-z-w}Ta_zSb_w)O_3$. Further, in this case, the piezoelectric ceramic composition does not contain sodium and therefore the dielectric 1055 and the long-term stability of the dielectric loss of the piezoelectric ceramic composition can be improved.

Next, preferably the piezoelectric ceramic composition has a piezoelectric $d_{31}$ constant of not less than 30 pm/V. In this case, it is possible to make use of the high piezoelectric $d_{31}$ constant of at least 30 pm/V and utilize the piezoelectric ceramic composition for a high sensitivity piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the piezoelectric $d_{31}$ constant is less than 30 pm/V, the piezoelectric ceramic composition is liable to be unable to be utilized for a piezoelectric element requiring a superior sensitivity. Further, to obtain more sensitive superior piezoelectric sensor properties or larger piezoelectric actuator properties, the piezoelectric $d_{31}$ constant is more preferably at least 40 pm/V. Still more preferably, it is at least 80 pm/V. Even more preferably, the piezoelectric $d_{31}$ constant should be at least 100 pm/V.

Next, preferably the piezoelectric ceramic composition has a piezoelectric $g_{31}$ constant of not less than $7\times10^{-3}$ Vm/N. In this case, it is possible to make use of the high piezoelectric $g_{31}$ constant of at least $7\times10^{-3}$ Vm/N and utilize the piezoelectric ceramic composition for a superior booster ratio piezoelectric transformer, ultrasonic motor, sensor, etc.

If the piezoelectric $g_{31}$ constant is less than $7\times10^{-3}$ Vm/N, the piezoelectric ceramic composition is liable to be unable to be utilized for a piezoelectric element requiring a superior booster ratio. Further, to obtain an element more superior in booster ratio, the piezoelectric $g_{31}$ constant is more preferably made at least $10\times10^{-3}$ Vm/N.

Next, preferably the piezoelectric ceramic composition has an electromechanical coupling coefficient Kp of not less than 0.3. In this case, it is possible to make use of the high electromechanical coupling coefficient Kp of at least 0.3 and utilize the piezoelectric ceramic composition for a piezoelectric element superior in conversion efficiency of mechanical energy and electrical energy such as a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the electromechanical coupling coefficient is less than 0.3, the piezoelectric ceramic composition is liable to be unable to be utilized for a piezoelectric element requiring a superior conversion efficiency of mechanical energy and electrical energy. Further, to obtain more superior conversion efficiency of mechanical energy and electrical energy, the electromechanical coupling coefficient Kp is more preferably at least 0.34. Still more preferably, it is at least 0.4. Even more preferably, the electromechanical coupling coefficient Kp should be at least 0.5.

Next, preferably the piezoelectric ceramic composition has a dielectric loss of not more than 0.09. In this case, it is possible to make use of the low dielectric loss of not more than 0.09 and utilize the piezoelectric ceramic composition for a capacitor or other dielectric element or a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the dielectric loss is more than 0.09, the piezoelectric ceramic composition is liable to be unable to be utilized for a capacitor or other dielectric element or piezoelectric transformer, ultrasonic motor, etc. Further, the dielectric loss is more preferably not more than 0.035.

Next, preferably the piezoelectric ceramic composition has a relative dielectric constant of not less than 400. In this case, it is possible to make use of the high relative dielectric constant of at least 400 and utilize the piezoelectric ceramic composition for a capacitor having a large electrostatic capacity or other dielectric element.

If the relative dielectric constant is less than 400, the electrostatic capacity drops and the piezoelectric ceramic composition is liable to be unable to be utilized for a capacitor or other dielectric element. The relative dielectric constant is more preferably at least 430. Still more preferably, it is at least 600.

Next, preferably the piezoelectric ceramic composition has a Curie temperature Tc of not less than 200° C. In this case, it is possible to make use of the high Curie temperature Tc of at least 200° C. and utilize the piezoelectric ceramic composition in a high temperature environment exceeding 100° C. such as near an automobile engine. If the Curie temperature Tc is less than 200° C., if using the piezoelectric ceramic composition at a high temperature location such as near an automobile engine, the piezoelectric $d_{31}$ constant, electromechanical coupling coefficient Kp, and other properties are liable to drop. Further, the Curie temperature Tc is more preferably at least 250° C.

Next, preferably the piezoelectric ceramic composition has a piezoelectric $d_{31}$ constant of not less than 30 pm/V and a Curie temperature Tc of not less than 200° C. In this case, it is possible to use the piezoelectric ceramic composition in a high temperature environment of a temperature of over 100° C. as a high sensitivity sensor, ultrasonic motor, actuator, piezoelectric transformer, piezoelectric vibrator, etc.

Further, to obtain more sensitive superior piezoelectric sensor properties or larger piezoelectric actuator properties, the piezoelectric $d_{31}$ constant is more preferably at least 40 pm/V. Still more preferably, it is at least 80 pm/V. Even more preferably, the piezoelectric $d_{31}$ constant should be at least 100 pm/V. Further, the Curie temperature Tc is more preferably at least 250° C.

Next, preferably, the piezoelectric ceramic composition has a piezoelectric $g_{31}$ constant of not less than $7 \times 10^{-3}$ Vm/N and a Curie temperature Tc of not less than 200° C. In this case, it is possible to use the piezoelectric ceramic composition in a high temperature environment of a temperature of over 100° C. as a superior booster ratio piezoelectric transformer, ultrasonic motor, sensor, etc.

Further, to obtain a more superior booster ratio, the piezoelectric $g_{31}$ constant is more preferably at least $10 \times 10^{-3}$ Vm/N. Further, the Curie temperature Tc is more preferably at least 250° C.

Next, preferably, the piezoelectric ceramic composition has an electromechanical coupling coefficient Kp of not less than 0.3 and a Curie temperature Tc of not less than 200° C. In this case, it is possible to use the piezoelectric ceramic composition in a high temperature environment of a temperature of over 100° C. as a piezoelectric element superior in conversion efficiency of mechanical energy and electrical energy such as a piezoelectric actuator, piezoelectric vibrator, sensor, piezoelectric transformer, ultrasonic motor, etc.

Further, to obtain a more superior conversion efficiency of mechanical energy and electrical energy, the electromechanical coupling coefficient Kp is more preferably at least 0.34. More preferably, it should be at least 0.4. Further, the Curie temperature Tc is more preferably at least 250° C.

Next, preferably the piezoelectric ceramic composition has a dielectric loss of not more than 0.09 and a Curie temperature Tc of not less than 200° C. In this case, it is possible to use the piezoelectric ceramic composition in a high temperature environment of a temperature of over 100° C. as a capacitor or other dielectric element or a piezoelectric transformer, ultrasonic motor, sensor, etc. Further, the dielectric loss is more preferably not more than 0.035. Further, the Curie temperature Tc is more preferably at least 250° C.

Next, preferably the piezoelectric ceramic composition has a piezoelectric $d_{31}$ constant of not less than 30 pm/V, an electromechanical coupling coefficient Kp of not less than 0.3, and a Curie temperature Tc of not less than 200° C. In this case, it is possible to use the piezoelectric ceramic composition in a high temperature environment of a temperature of over 100° C. and obtain a superior sensitivity and conversion efficiency of mechanical energy and electrical energy.

Further, to obtain more sensitive superior piezoelectric sensor properties or larger piezoelectric actuator properties, the piezoelectric $d_{31}$ constant is more preferably at least 40 pm/V. Further, the electromechanical coupling coefficient Kp is more preferably at least 0.34.

Further, in the third aspect of the invention, the compound containing lithium includes for example $Li_2CO_3$, $Li_2O$, $LiNO_3$, LiOH, etc. The compound containing sodium includes $Na_2CO_3$, $NaHCO_3$, $NaNO_3$, etc.

Further, the compound containing potassium includes $K_2CO_3$, $KNO_3$, $KNbO_3$, $KTaO_3$, etc. The compound containing niobium includes for example $Nb_2O_5$, $Nb_2O_3$, $NbO_2$, etc. The compound containing tantalum includes $Ta_2O_5$ etc. The compound containing antimony includes for example $Sb_2O_5$, $Sb_2O_3$, $Sb_2O_4$, etc.

Preferably, the compound containing lithium is $Li_2CO_3$, the compound containing sodium is $Na_2CO_3$, the compound containing potassium is $K_2CO_3$, the compound containing niobium is $Nb_2O_5$, the compound containing tantalum is $Ta_2O_5$, and the compound containing antimony is $Sb_2O_5$ or $Sb_2O_3$. In this case, it is possible to easily fabricate the piezoelectric ceramic composition.

Next, in the fourth aspect of the invention, the piezoelectric element includes for example a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor.

Next, in the fifth aspect of the invention, the dielectric element includes for example a capacitor, multilayer capacitor, etc.

(2) Invention II

In the sixth to eight aspects of the invention, the piezoelectric ceramic composition of the general formula $\{Li_x(K_{1-y}Na_y)_{1-x}\}(Nb_{1-z-w}Ta_zSb_w)O_3$ has ranges of x, y, z, and w of $0 \leq x \leq 0.2$, $0 \leq y \leq 1$, $0 < z \leq 0.4$, and $0 < w \leq 0.2$. Here, when $x > 0.2$, $z > 0.4$, $w > 0.2$, $z = 0$, or $w = 0$, the piezoelectric $d_{31}$ constant and other piezoelectric properties and dielectric properties drop and a piezoelectric ceramic composition having the desired properties is liable to not be able to be obtained any longer.

Further, the range of y in the general formula $\{Li_x(K_{1-y}Na_y)_{1-x}\}(Nb_{1-z-w}Ta_zSb_w)O_3$ is preferably $0 \leq x \leq 0.85$.

Further, the range of x in the general formula $\{Li_x(K_{1-y}Na_y)_{1-x}\}(Nb_{1-z-w}Ta_zSb_w)O_3$ is preferably $0 < x \leq 0.2$. In this case, since lithium becomes an essential ingredient, the piezoelectric ceramic composition can be more easily sintered at the time of production, the piezoelectric properties can be further improved, and the Curie temperature Tc can be further raised. This is because the inclusion of lithium as an essential ingredient in the above range causes the sintering temperature to drop, the lithium functions as a sintering aid, and sintering with little pores becomes possible.

Further, the value of x in the general formula $\{Li_x(K_{1-y}Na_y)_{1-x}\}(Nb_{1-z-w}Ta_zSb_w)O_3$ can be made $x = 0$. In this case, the above formula is expressed by $(K_{1-y}Na_y)(Nb_{1-z-w}Ta_zSb_w)O_3$. Further, in this case, when preparing the piezoelectric ceramic composition, since the materials do not include any compound containing the lightest weight lithium such as $Li_2CO_3$, when mixing the materials to prepare the piezoelectric ceramic composition, it is possible to reduce the variation in properties due to segregation of the powder materials. Further, in this case, a high relative dielectric constant and relatively large piezoelectric g constant can be realized.

In the sixth aspect of the invention, the piezoelectric ceramic composition contains at least one type of metal element selected from palladium, silver, gold, ruthenium, rhodium, rhenium, osmium, iridium, and platinum as an added element and the total of the contents of the added elements is 0.001 mol to 0.15 mol with respect to 1 mol of the compound of the above general formula.

If the total of the contents is less than 0.001 mol or over 0.15 mol, the piezoelectric $d_{31}$ constant etc. of the piezoelectric ceramic composition drop and a piezoelectric ceramic composition having the desired properties is liable to be unable to be obtained. Note that the contents of the added elements are the number of moles of the metal elements of palladium, silver, gold, ruthenium, rhodium, rhenium, osmium, iridium, and platinum.

The added elements may be present as the form of at least one type of metal element selected from palladium, silver, gold, ruthenium, rhodium, rhenium, osmium, iridium, and platinum substituting at least part of the lithium, potassium, sodium, niobium, tantalum, and antimony of the compound of the general formula $\{Li_x(K_{1-y}Na_y)_{1-x}\}(Nb_{1-z-w}Ta_zSb_w)O_3$ or in the form of the above metal elements, oxides or perovskite structure compounds, or other compounds containing the same present in the grains or at the grain boundaries of the piezoelectric ceramic composition.

In particular, silver, palladium, gold, and other metal elements which can become +1 or +2 values can be present substituting at least part of the lithium, potassium, sodium, niobium, tantalum, and antimony of the compound of the above general formula. On the other hand, palladium, ruthenium, rhenium, osmium, iridium, platinum, and other metal elements which can become +3 to +6 values may be present substituting at least part of the niobium, tantalum, and antimony of the compound of the above general formula. Further, by adopting such a substitution and solid solution state, the piezoelectric $d_{31}$ constant and other properties can be further improved.

Next, preferably the piezoelectric $d_{31}$ constant of the piezoelectric ceramic composition is larger than a piezoelectric $d_{31}$ constant of a piezoelectric ceramic composition of the above general formula not containing the added elements. If larger than the piezoelectric $d_{31}$ constant of a piezoelectric ceramic composition of the above general formula not containing the added elements (basic piezoelectric ceramic composition), the effects of the added elements can be sufficiently obtained and application to a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor becomes easier.

The "larger than a piezoelectric $d_{31}$ constant of a piezoelectric ceramic composition of the above general formula not containing the added elements" means that the piezoelectric $d_{31}$ constant of the piezoelectric ceramic composition containing the added elements is larger than that of the basic piezoelectric ceramic composition having the basic composition of the piezoelectric ceramic composition not containing the above added elements. The same is true for the later mentioned electromechanical coupling coefficient Kp, piezoelectric $g_{31}$ constant, relative dielectric constant, dielectric loss, and Curie temperature Tc as well.

Next, preferably an electromechanical coupling coefficient Kp of the piezoelectric ceramic composition is larger than an electromechanical coupling coefficient Kp of a piezoelectric ceramic composition of the above general formula not containing the added elements. If larger than the electromechanical coupling coefficient Kp of a piezoelectric ceramic composition of the above general formula not containing the added elements (basic piezoelectric ceramic composition), the effects of the added elements can be sufficiently obtained and application to a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor becomes easier.

Next, preferably a piezoelectric $g_{31}$ constant of the piezoelectric ceramic composition is larger than a piezoelectric $g_{31}$ constant of a piezoelectric ceramic composition of the above general formula not containing the added elements. If larger than the electromechanical coupling coefficient Kp of a piezoelectric ceramic composition of the above general formula not containing the added elements (basic piezoelectric ceramic composition), the effects of the added elements can be sufficiently obtained and application to a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor becomes easier.

Next, preferably a relative dielectric constant of the piezoelectric ceramic composition is larger than a relative dielectric constant of a piezoelectric ceramic composition of the above general formula not containing the added elements. If larger than the relative dielectric constant of a piezoelectric ceramic composition of the above general formula not containing the added elements (basic piezoelectric ceramic composition), the effects of the added elements can be sufficiently obtained and application to a capacitor or other dielectric element becomes easier.

Next, preferably a dielectric loss of the piezoelectric ceramic composition is smaller than a dielectric loss of a piezoelectric ceramic composition of the above general formula not containing the added elements. If smaller than the dielectric loss of a piezoelectric ceramic composition of the above general formula not containing the added elements (basic piezoelectric ceramic composition), the effects of the added elements can be sufficiently obtained and application to a capacitor or other dielectric element becomes easier.

Next, preferably a Curie temperature Tc of the piezoelectric ceramic composition is larger than a Curie temperature of a piezoelectric ceramic composition of the above general formula not containing the added elements. If larger than the Curie temperature Tc of a piezoelectric ceramic composition of the above general formula not containing the added elements (basic piezoelectric ceramic composition), the effects of the added elements can be sufficiently obtained and use in a high temperature environment of over 100° C. such as near an automobile engine becomes easier.

Next, preferably the piezoelectric ceramic composition has a piezoelectric do constant of not less than 30 pm/V. In this case, it is possible to make use of the high piezoelectric $d_{31}$ constant of at least 30 pm/V and utilize the piezoelectric ceramic composition for a high sensitivity piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the piezoelectric $d_{31}$ constant is less than 30 pm/V, the piezoelectric ceramic composition is liable to be unable to be utilized for a piezoelectric element requiring a superior sensitivity. Further, to obtain more sensitive superior piezoelectric sensor properties or larger piezoelectric actuator properties, the piezoelectric $d_{31}$ constant is more preferably at least 40 pm/V. Still more preferably, it is at least 80 pm/V. Even more preferably, the piezoelectric $d_{31}$ constant should be at least 100 pm/V.

Next, preferably the piezoelectric ceramic composition has an electromechanical coupling coefficient Kp of not less than 0.3. In this case, it is possible to make use of the high electromechanical coupling coefficient Kp of at least 0.3 and utilize the piezoelectric ceramic composition for a piezoelectric element superior in conversion efficiency of mechanical energy and electrical energy such as a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the electromechanical coupling coefficient is less than 0.3, the piezoelectric ceramic composition is liable to be unable to be utilized for a piezoelectric element requiring a superior conversion efficiency of mechanical energy and electrical energy. Further, to obtain more superior conversion efficiency of mechanical energy and electrical energy, the electromechanical coupling coefficient Kp is more preferably at least 0.34. Still more preferably, it is at least 0.4. Even more preferably, the electromechanical coupling coefficient Kp should be at least 0.5.

Next, preferably the piezoelectric ceramic composition has a piezoelectric g31 constant of not less than $7 \times 10^{-3}$ Vm/N. In this case, it is possible to make use of the high piezoelectric $g_{31}$ constant of at least $7 \times 10^{-3}$ Vm/N and utilize the piezoelectric ceramic composition for a superior booster ratio piezoelectric transformer, ultrasonic motor, sensor, etc.

If the piezoelectric $g_{31}$ constant is less than $7 \times 10^{-3}$ Vm/N, the piezoelectric ceramic composition is liable to be unable to be utilized for a piezoelectric element requiring a superior booster ratio. Further, to obtain an element more superior in booster ratio, the piezoelectric $g_{31}$ constant is more preferably made at least $8 \times 10^{-3}$ Vm/N.

Next, preferably the piezoelectric ceramic composition has a relative dielectric constant of not less than 400. In this case, it is possible to make use of the high relative dielectric constant of at least 400 and utilize the piezoelectric ceramic composition for a capacitor having a large electrostatic capacity or other dielectric element.

If the relative dielectric constant is less than 400, the electrostatic capacity drops and the piezoelectric ceramic composition is liable to be unable to be utilized for a capacitor or other dielectric element. The relative dielectric constant is more preferably at least 430. Still more preferably, it is at least 600.

Next, preferably the piezoelectric ceramic composition has a dielectric loss of not more than 0.09. In this case, it is possible to make use of the low dielectric loss of not more than 0.09 and utilize the piezoelectric ceramic composition for a capacitor or other dielectric element or a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the dielectric loss is more than 0.09, the piezoelectric ceramic composition is liable to be unable to be utilized for a capacitor or other dielectric element or piezoelectric transformer, ultrasonic motor, etc. Further, the dielectric loss is more preferably not more than 0.035. More preferably, it should be not more than 0.025.

Next, preferably the piezoelectric ceramic composition has a Curie temperature Tc of not less than 200° C. In this case, it is possible to make use of the high Curie temperature Tc of at least 200° C. and utilize the piezoelectric ceramic composition in a high temperature environment exceeding 100° C. such as near an automobile engine. If the Curie temperature Tc is less than 200° C., if using the piezoelectric ceramic composition at a high temperature location such as near an automobile engine, the piezoelectric $d_{31}$ constant, electromechanical coupling coefficient Kp, and other properties are liable to drop. Further, the Curie temperature Tc is more preferably at least 250° C.

Next, preferably the piezoelectric ceramic composition has a piezoelectric $d_{31}$ constant of not less than 30 pm/V and a Curie temperature Tc of not less than 200° C. In this case, it is possible to use the piezoelectric ceramic composition in a high temperature environment of a temperature of over 100° C. as a high sensitivity sensor, ultrasonic motor, actuator, piezoelectric transformer, piezoelectric vibrator, etc.

Further, to obtain more sensitive superior piezoelectric sensor properties or larger piezoelectric actuator properties, the piezoelectric $d_{31}$ constant is more preferably at least 40 pm/V. Still more preferably, it is at least 80 pm/V. Even more preferably, the piezoelectric $d_{31}$ constant should be at least 100 pm/V. Further, the Curie temperature Tc is more preferably at least 250° C.

Next, preferably, the piezoelectric ceramic composition has a piezoelectric $g_{31}$ constant of not less than $7 \times 10^{-3}$ Vm/N and a Curie temperature Tc of not less than 200° C. In this case, it is possible to use the piezoelectric ceramic composition in a high temperature environment of a temperature of over 100° C. as a superior booster ratio piezoelectric transformer, ultrasonic motor, sensor, etc.

Further, to obtain a more superior booster ratio, the piezoelectric $g_{31}$ constant is more preferably at least $8 \times 10^{-3}$ Vm/N. Further, the Curie temperature Tc is more preferably at least 250° C.

Next, preferably, the piezoelectric ceramic composition has an electromechanical coupling coefficient Kp of not less than 0.3 and a Curie temperature Tc of not less than 200° C. In this case, it is possible to use the piezoelectric ceramic composition in a high temperature environment of a temperature of over 100° C as a piezoelectric element superior in conversion efficiency of mechanical energy and electrical energy such as a piezoelectric actuator, piezoelectric vibrator, sensor, piezoelectric transformer, ultrasonic motor, etc.

Further, to obtain a more superior conversion efficiency of mechanical energy and electrical energy, the electromechanical coupling coefficient Kp is more preferably at least 0.34. More preferably, it should be at least 0.4. Further, the Curie temperature Tc is more preferably at least 250° C.

Next, preferably the piezoelectric ceramic composition has a dielectric loss of not more than 0.09 and a Curie temperature Tc of not less than 200° C. In this case, it is possible to use the piezoelectric ceramic composition in a high temperature environment of a temperature of over 100° C. as a capacitor or other dielectric element or a piezoelectric transformer, ultrasonic motor, sensor, etc. Further, the dielectric loss is more preferably not more than 0.035. More preferably, it should be not more than 0.02. Further, the Curie temperature Tc is more preferably at least 250° C.

Next, preferably the piezoelectric ceramic composition has a piezoelectric $d_{31}$ constant of not less than 30 pm/V, an electromechanical coupling coefficient Kp of not less than 0.3, and a Curie temperature Tc of not less than 200° C. In this case, it is possible to use the piezoelectric ceramic composition in a high temperature environment of a temperature of over 100° C. and obtain a superior sensitivity and conversion efficiency of mechanical energy and electrical energy.

Further, to obtain more sensitive superior piezoelectric sensor properties or larger piezoelectric actuator properties, the piezoelectric $d_{31}$ constant is more preferably at least 40 pm/V. Further, the electromechanical coupling coefficient Kp is more preferably at least 0.34.

Further, in a seventh or eighth aspect of the invention, the additive includes at least one metal element selected from palladium, silver, gold, ruthenium, rhodium, rhenium, osmium, iridium, and platinum or a compound including these metal elements.

As a result of addition of the additive, the metal element contained in the additive sometimes is included in the piezoelectric ceramic composition as an added element by substitution of at least part of at least one type of the lithium, potassium, sodium, niobium, tantalum, and antimony of the compound of the general formula $\{Li_x(K_{1-y}Na_y)_{1-x}\}(Nb_{1-z-w}Ta_zSb_w)O_3$ after sintering. Further, sometimes the metal elements or oxides or perovskite structure compounds containing the metal elements are included in the grains or at the grain boundaries of the piezoelectric ceramic composition.

Further, in the eighth aspect of the invention, the compound containing lithium includes for example $Li_2CO_3$, $Li_2O$, $LiNO_3$, $LiOH$, etc. The compound containing sodium includes $Na_2CO_3$, $NaHCO_3$, $NaNO_3$, etc.

Further, the compound containing potassium includes $K_2CO_3$, $KNO_3$, $KNbO_3$, $KTaO_3$, etc. The compound containing niobium includes for example $Nb_2O_5$, $Nb_2O_3$, $NbO_2$, etc. The compound containing tantalum includes $Ta_2O_5$ etc. The compound containing antimony includes for example $Sb_2O_5$, $Sb_2O_3$, $Sb_2O_4$, etc.

Preferably, the compound containing lithium is $Li_2CO_3$, the compound containing sodium is $Na_2CO_3$, the compound containing potassium is $K_2CO_3$, the compound containing niobium is $Nb_2O_5$, the compound containing tantalum is $Ta_2O_5$, and the compound containing antimony is $Sb_2O_5$ or $Sb_2O_3$. The additive is preferably at least one type selected from $PdO_2$, $Ag_2O$, $Au$, $Au_2O$, $Ru_2O$, $RhO$, $Re_2O_5$, $OsO_2$, $IrO_{21}$ and $PtO_2$. In this case, it is possible to easily fabricate the piezoelectric ceramic composition.

Next, in the ninth or 10th aspect of the invention, the piezoelectric element includes for example a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor.

Next, in the 11th or 12th aspect of the invention, the dielectric element includes for example a capacitor, multilayer capacitor, etc.

(3) Invention III

In the 13th to 15th aspects of the invention, the piezoelectric ceramic composition of the general formula $\{Li_x(K_{1-y}Na_y)_{1-x}\}(Nb_{1-z-w}Ta_zSb_w)O_3$ has ranges of x, y, z, and w of $0<x\leq 0.2$, $0\leq y\leq 1$, $0<z\leq 0.4$, and $0<w\leq 0.2$. Here, when $x>0.2$, $z>0.4$, $w>0.2$, $z=0$, or $w=0$, the piezoelectric $d_{31}$ constant and other piezoelectric properties and dielectric properties drop and a piezoelectric ceramic composition having the desired properties is liable to not be able to be obtained any longer.

Further, the range of y in the general formula $\{Li_x(K_{1-y}Na_y)_{1-x}\}(Nb_{1-z-w}Ta_zSb_w)O_3$ is preferably $0\leq x\leq 0.85$.

Further, the range of x in the general formula $\{Li_x(K_{1-y}Na_y)_{1-x}\}(Nb_{1-z-w}Ta_zSb_w)O_3$ is preferably $0\leq x\leq 0.2$. In this case, since lithium becomes an essential ingredient, the piezoelectric ceramic composition can be more easily sintered at the time of production, the piezoelectric properties can be further improved, and the Curie temperature Tc can be further raised. This is because the inclusion of lithium as an essential ingredient in the above range causes the sintering temperature to drop, the lithium functions as a sintering aid, and sintering with little pores becomes possible.

Further, the value of x in the general formula $\{Li_x(K_{1-y}Na_y)_{1-x}\}(Nb_{1-z-w}Ta_zSb_w)O_3$ can be made $x=0$. In this case, the above formula is expressed by $(K_{1-y}Na_y)(Nb_{1-z-w}Ta_zSb_w)O_3$. Further, in this case, when preparing the piezoelectric ceramic composition, since the materials do not include any compound containing the lightest weight lithium such as $Li_2CO_2$, when mixing the materials to prepare the piezoelectric ceramic composition, it is possible to reduce the variation in properties due to segregation of the powder materials. Further, in this case, a high relative dielectric constant and relatively large piezoelectric g constant can be realized.

In the 13th aspect of the invention, the piezoelectric ceramic composition contains at least one type of metal element selected from nickel, iron, manganese, copper, and zinc as an added element and the total of the contents of the added elements is 0.001 mol to 0.08 mol with respect to 1 mol. of the compound of the above general formula.

If the total of the contents is less than 0.001 mol or over 0.08 mol, the piezoelectric $d_{31}$ constant, the mechanical quality factor Qm, etc. of the piezoelectric ceramic composition drop and a piezoelectric ceramic composition having the desired properties is liable to be unable to be obtained. Note that the contents of the added elements are the number of moles of the metal elements of nickel, iron, manganese, copper, and zinc.

The added elements may be present as the form of at least one type of metal element selected from nickel, iron, manganese, copper, and zinc substituting at least part of the lithium, potassium, sodium, niobium, tantalum, and antimony of the compound of the general formula $\{Li_x(K_{1-y}Na_y)_{1-x}\}(Nb_{1-z-w}Ta_zSb_w)O_3$ or in the form of the above metal elements, oxides or perovskite structure compounds, or other compounds containing the same present in the grains or at the grain boundaries of the piezoelectric ceramic composition.

The above additive may be added to the above piezoelectric ceramic composition having the general formula by substitutional addition or external addition.

In particular, copper, nickel, iron, zinc, and other metal elements which can become +1 or +2 values can be present substituting at least part of the lithium, potassium, sodium, niobium, tantalum, and antimony of the compound of the above general formula. On the other hand, iron, manganese, and other metal elements which can become +3 to +6 values may be present substituting at least part of the niobium, tantalum, and antimony of the compound of the above general formula. Further, by adopting such a substitution and solid solution state, the piezoelectric $d_{31}$ constant and other properties can be further improved.

Next, preferably the piezoelectric $d_{31}$ constant of the piezoelectric ceramic composition is larger than a piezoelectric $d_{31}$ constant of a piezoelectric ceramic composition of the above general formula not containing the added elements. The "larger than a piezoelectric $d_{31}$ constant of a piezoelectric ceramic composition of the above general formula not containing the added elements" means that the piezoelectric $d_{31}$ constant of the piezoelectric ceramic composition containing the added elements is larger than that of the basic piezoelectric ceramic composition having the basic composition of the piezoelectric ceramic composition and not containing the above added elements. The same is true for the later mentioned electromechanical coupling coefficient Kp, piezoelectric $g_{31}$ constant, mechanical quality factor Qm, relative dielectric constant, dielectric loss, and Curie temperature Tc as well.

Next, preferably an electromechanical coupling coefficient Kp of the piezoelectric ceramic composition is larger than an electromechanical coupling coefficient Kp of a piezoelectric ceramic composition of the above general formula not containing the added elements.

Next, preferably a mechanical quality factor Qm of the piezoelectric ceramic composition is larger than a mechanical quality factor Qm of a piezoelectric ceramic composition of the above general formula not containing the added elements.

If the piezoelectric $d_{31}$ constant, electromechanical coupling coefficient Kp, piezoelectric $g_{31}$ constant, and mechanical quality factor Qm of the piezoelectric ceramic composition are larger than those of the basic piezoelectric ceramic composition of the above general formula not containing the added elements, the effects of the added elements can be sufficiently obtained and application to a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor becomes easier.

Next, preferably a relative dielectric constant of the piezoelectric ceramic composition is larger than a relative dielectric constant of a piezoelectric ceramic composition of the above general formula not containing the added elements. If larger than the relative dielectric constant of a piezoelectric ceramic composition of the above general formula not containing the added elements (basic piezoelectric ceramic composition), the effects of the added elements can be sufficiently obtained and application to a capacitor or other dielectric element becomes easier.

Next, preferably a dielectric loss of the piezoelectric ceramic composition is smaller than a dielectric loss of a piezoelectric ceramic composition of the above general formula not containing the added elements. If smaller than the dielectric loss of a piezoelectric ceramic composition of the above general formula not containing the added elements (basic piezoelectric ceramic composition), the effects of the added elements can be sufficiently obtained and application to a capacitor or other dielectric element becomes easier.

Next, preferably a Curie temperature Tc of the piezoelectric ceramic composition is larger than a Curie temperature of a piezoelectric ceramic composition of the above general formula not containing the added elements. If larger than the Curie temperature Tc of a piezoelectric ceramic composition of the above general formula not containing the added elements (basic piezoelectric ceramic composition), the effects of the added elements can be sufficiently obtained and use in a high temperature environment of over 100° C. such as near an automobile engine becomes easier.

Next, preferably the piezoelectric ceramic composition has a piezoelectric $d_{31}$ constant of not less than 30 pm/V. In this case, it is possible to make use of the high piezoelectric $d_{31}$ constant of at least 30 pm/V and utilize the piezoelectric ceramic composition for a high sensitivity piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the piezoelectric $d_{31}$ constant is less than 30 pm/V, the piezoelectric ceramic composition is liable to be unable to be utilized for a piezoelectric element of properties sufficient for practical use. Further, to obtain more sensitive superior piezoelectric sensor properties or larger piezoelectric actuator properties, the piezoelectric $d_{31}$ constant is more preferably at least 40 pm/V. Still more preferably, it is at least 80 pm/V. Even more preferably, the piezoelectric $d_{31}$ constant should be at least 100 pm/V.

Next, preferably the piezoelectric ceramic composition has an electromechanical coupling coefficient Kp of not less than 0.3. In this case, it is possible to make use of the high electromechanical coupling coefficient Kp of at least 0.3 and utilize the piezoelectric ceramic composition for a piezoelectric element superior in conversion efficiency of mechanical energy and electrical energy such as a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the electromechanical coupling coefficient is less than 0.3, the piezoelectric ceramic composition is liable to be unable to be utilized for a piezoelectric element requiring a superior conversion efficiency of mechanical energy and electrical energy. Further, to obtain more superior conversion efficiency of mechanical energy and electrical energy, the electromechanical coupling coefficient Kp is more preferably at least 0.34 Still more preferably, it is at least 0.4. Even more preferably, the electromechanical coupling coefficient Kp should be at least 0.45.

Next, preferably the piezoelectric ceramic composition has a piezoelectric $g_{31}$ constant of not less than $7 \times 10^{-3}$ Vm/N. In this case, it is possible to make use of the high piezoelectric $g_{31}$ constant of at least $7 \times 10^{-3}$ Vm/N and utilize the piezoelectric ceramic composition for a superior booster ratio piezoelectric transformer, ultrasonic motor, sensor, etc.

If the piezoelectric $g_{31}$ constant is less than $7 \times 10^{-3}$ Vm/N, the piezoelectric ceramic composition is liable to be unable to be utilized for a piezoelectric element requiring a superior booster ratio. Further, to obtain an element more superior in booster ratio, the piezoelectric $g_{31}$ constant is more preferably made at least $8 \times 10^{-3}$ Vm/N.

Next, preferably the piezoelectric ceramic composition has a mechanical quality factor Qm of not less than 50. In this case, it is possible to make use of the high mechanical quality factor Qm of at least 50 and utilize the piezoelectric ceramic composition for a piezoelectric element with little heat generation and superior in conversion efficiency of mechanical energy and electrical energy such as a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the mechanical quality factor Qm is less than 50, the piezoelectric ceramic composition is liable to be unable to be utilized for a piezoelectric element requiring a superior conversion efficiency of mechanical energy and electrical energy. Further, to obtain more superior conversion efficiency of mechanical energy and electrical energy, the mechanical quality factor Qm is more preferably at least 501 more preferably at least 60.

Next, preferably the piezoelectric ceramic composition has a relative dielectric constant of not less than 400. In this case, it is possible to make use of the high relative dielectric constant of at least 400 and utilize the piezoelectric ceramic composition for a capacitor having a large electrostatic capacity or other dielectric element.

If the relative dielectric constant is less than 400, the electrostatic capacity drops and the piezoelectric ceramic composition is liable to be unable to be utilized for a capacitor or other dielectric element. The relative dielectric constant is more preferably at least 430. Still more preferably, it is at least 600.

Next, preferably the piezoelectric ceramic composition has a dielectric loss of not more than 0.09. In this case, it is possible to make use of the low dielectric loss of not more than 0.09 and utilize the piezoelectric ceramic composition for a capacitor or other dielectric element or a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the dielectric loss is more than 0.09, the piezoelectric ceramic composition is liable to be unable to be utilized for a capacitor or other dielectric element or piezoelectric transformer, ultrasonic motor, etc. Further, the dielectric loss is more preferably not more than 0.035. More preferably, it should be not more than 0.025.

Next, preferably the piezoelectric ceramic composition has a Curie temperature Tc of not less than 200° C. In this case, it is possible to make use of the high Curie temperature Tc of at least 200° C. and utilize the piezoelectric ceramic composition in a high temperature environment exceeding 100° C. such as near an automobile engine. If the Curie temperature Tc is less than 200° C., if using the piezoelectric ceramic composition at a high temperature location such as near an automobile engine, the piezoelectric $d_{31}$ constant, electromechanical coupling coefficient Kp, and other properties are liable to drop. Further, the Curie temperature Tc is more preferably at least 250° C.

Next, preferably the piezoelectric ceramic composition has a piezoelectric $d_{31}$ constant of not less than 30 pm/V and a Curie temperature Tc of not less than 200° C. In this case, it is possible to use the piezoelectric ceramic composition in a high temperature environment of a temperature of over 100° C. as a high sensitivity sensor, ultrasonic motor, actuator, piezoelectric transformer, piezoelectric vibrator, etc.

Further, to obtain more sensitive superior piezoelectric sensor properties or larger piezoelectric actuator properties, the piezoelectric dl constant is more preferably at least 40 pm/V. Still more preferably, it is at least 80 pm/V. Even more preferably, the piezoelectric $d_{31}$ constant should be at least 100 pm/V. Further, the Curie temperature Tc is more preferably at least 250° C.

Next, preferably, the piezoelectric ceramic composition has a piezoelectric $g_{31}$ constant of not less than $7 \times 10^{-3}$ Vm/N and a Curie temperature Tc of not less than 200° C. In this case, it is possible to use the piezoelectric ceramic composition in a high temperature environment of a temperature of over 100° C. as a superior booster ratio piezoelectric transformer, ultrasonic motor, sensor, etc.

Further, to obtain a more superior booster ratio, the piezoelectric $g_{31}$ constant is more preferably at least $8 \times 10^{-3}$ Vm/N. Further, the Curie temperature Tc is more preferably at least 250° C.

Next, preferably the piezoelectric ceramic composition has an electromechanical coupling coefficient Kp of not less than 0.3 and a Curie temperature Tc of not less than 200° C. In this case, it is possible to use the piezoelectric ceramic composition in a high temperature environment of a temperature of over 100° C. as a piezoelectric element superior in conversion efficiency of mechanical energy and electrical energy such as a piezoelectric actuator, piezoelectric vibrator, sensor, piezoelectric transformer, ultrasonic motor, etc.

Further, to obtain a more superior conversion efficiency of mechanical energy and electrical energy, the electromechanical coupling coefficient Kp is more preferably at least 0.34. More preferably, it should be at least 0.4. Further, the Curie temperature Tc is more preferably at least 250° C.

Next, preferably the piezoelectric ceramic composition has a mechanical quality factor Qm of not less than 50 and a Curie temperature TC of not less than 200° C. In this case, it is possible to use the piezoelectric ceramic composition in a high temperature environment of a temperature of over 100° C. as a piezoelectric element with little heat generation and superior in conversion efficiency of mechanical energy and electrical energy such as a piezoelectric actuator, piezoelectric vibrator, sensor, piezoelectric transformer, ultrasonic motor, etc. Further, the Curie temperature Tc is more preferably at least 250° C.

Next, preferably the piezoelectric ceramic composition has a dielectric loss of not more than 0.09 and a Curie temperature Tc of not less than 200° C. In this case, it is possible to use the piezoelectric ceramic composition in a high temperature environment of a temperature of over 100° C. as a capacitor or other dielectric element or a piezoelectric transformer, ultrasonic motor, sensor, etc. Further, the dielectric loss is more preferably not more than 0.035. More preferably, it should be not more than 0.025. Further, the Curie temperature Tc is more preferably at least 250° C.

Next, preferably the piezoelectric ceramic composition has a piezoelectric $d_{31}$ constant of not less than 30 pm/V, an electromechanical coupling coefficient Kp of not less than 0.3, and a Curie temperature Tc of not less than 200° C. In this case, it is possible to use the piezoelectric ceramic composition in a high temperature environment of a temperature of over 100° C. and obtain a superior sensitivity and conversion efficiency of mechanical energy and electrical energy.

Further, to obtain more sensitive superior piezoelectric sensor properties or larger piezoelectric actuator properties, the piezoelectric $d_{31}$ constant is more preferably at least 40 pm/V. Further, the electromechanical coupling coefficient Kp is more preferably at least 0.34.

Further, in a 14th or 15th aspect of the invention, the additive includes at least one metal element selected from nickel, iron, manganese, copper, and zinc or a compound including these metal elements.

As a result of addition of the additive, the metal element contained in the additive sometimes is included in the piezoelectric ceramic composition as an added element by substitution of at least part of at least one type of the lithium, potassium, sodium, niobium, tantalum, and antimony of the compound of the general formula $\{Li_x(K_{1-y}Na_y)_{1-x}\}(Nb_{1-z-w}Ta_zSb_w)O_3$ after sintering. Further, sometimes the metal elements or oxides or perovskite structure compounds containing the metal elements are included in the grains or at the grain boundaries of the piezoelectric ceramic composition.

The above additive may be added to the above piezoelectric ceramic composition having the general formula by substitutional addition or external addition.

Further, in the 15th aspect of the invention, the compound containing lithium includes for example $Li_2CO_3$, $Li_2O$, $LiNO_3$, LiOH, etc. The compound containing sodium includes $Na_2CO_3$, $NaHCO_3$, $NaNO_3$, etc.

Further, the compound containing potassium includes $K_2CO_3$, $KNO_3$, $KNbO_3$, $KTaO_3$, etc. The compound containing niobium includes for example $Nb_2O_5$, $Nb_2O_3$, $NbO_2$, etc. The compound containing tantalum includes $Ta_2O_5$ etc. The compound containing antimony includes for example $Sb_2O_5$, $Sb_2O_3$, $Sb_2O_4$, etc.

Preferably, the compound containing lithium is $Li_2CO_3$, the compound containing sodium is $Na_2CO_3$, the compound containing potassium is $K_2CO_3$, the compound containing niobium is $Nb_2O_5$, the compound containing tantalum is $Ta_2O_5$, and the compound containing antimony is $Sb_2O_5$ or $Sb_2O_3$. The additive is preferably at least one type selected from NiO, $Fe_2O_3$, $Mn_2O_5$, $Cu_2O$, and ZnO. In this case, it is possible to easily fabricate the piezoelectric ceramic composition.

Next, in the 16th or 17th aspect of the invention, the piezoelectric element includes for example a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor.

Next, in the 18th or 19th aspect of the invention, the dielectric element includes for example a capacitor, multilayer capacitor, etc.

(4) Invention IV

In the present invention, the compound of the general formula $\{Li_x(K_{1-y}Na_y)_{1-x}\}(Nb_{1-z-w}Ta_zSb_w)O_3$ has ranges of x, y, z, and w of $0 \leq x \leq 0.2$, $0 \leq y \leq 1$, $0 < z \leq 0.4$, and $0 < w \leq 0.2$. Here, when $x > 0.2$, $z > 0.4$, $w > 0.2$, $z = 0$, or $w = 0$, the piezoelectric $d_{31}$ constant and other piezoelectric properties and dielectric properties drop and a piezoelectric ceramic composition having properties able to withstand practical use is liable to not be able to be obtained any longer.

Further, the range of y in the general formula $\{Li_x(K_{1-y}Na_y)_{1-x}\}(Nb_{1-z-w}Ta_zSb_w)O_3$ is preferably $0 \leq x \leq 0.85$.

Further, the range of x in the general formula $\{Li_x(K_{1-y}Na_y)_{1-x}\}(Nb_{1-z-w}Ta_zSb_w)O_3$ is preferably $0 < x \leq 0.2$. In this case, since lithium becomes an essential ingredient, the piezoelectric ceramic composition can be more easily sintered at the time of production, the piezoelectric properties can be further improved, and the Curie temperature Tc can be further raised. This is because the inclusion of lithium as an essential ingredient in the above range causes the sintering temperature to drop, the lithium functions as a sintering aid, and sintering with little pores becomes possible.

Further, the value of x in the general formula $\{Li_x(K_{1-y}Na_y)_{1-x}\}(Nb_{1-z-w}Ta_zSb_w)O_3$ can be made $x=0$. In this case, the above formula is expressed by $(K_{1-y}Na_y)(Nb_{1-z-w}Ta_zSb_w)O_3$. Further, in this case, when preparing the piezoelectric ceramic composition, since the materials do not include any compound containing the lightest weight lithium such as $Li_2CO_3$, when mixing the materials to prepare the piezoelectric ceramic composition, it is possible to reduce the variation in properties due to segregation of the powder materials. Further, in this case, a high relative dielectric constant and relatively large piezoelectric g constant can be realized.

In the 20th aspect of the invention, the piezoelectric ceramic composition contains at least one type of metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymiun, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium as an added element and the total of the contents of the added elements is 0.0005 mol to 0.15 mol with respect to 1 mol of the compound of the above general formula.

If the total of the contents is less than 0.0005 mol, the effects of the apparent density being high and the porosity and open porosity becoming low are liable to be unable to be sufficiently obtained. On the other hand, if the total of the contents is more than 0.15 mol, the sintering at the time of fabrication of the piezoelectric ceramic composition becomes difficult. Further, after sintering, a crystal phase different from the crystalline structure of the base composition appears and the apparent density of the sintered piezoelectric ceramic composition is liable to drop. Further, pores form at the front surface and interior of the piezoelectric ceramic composition, the porosity and open porosity become higher, and the mechanical strength of the piezoelectric ceramic composition is liable to drop.

Note that the contents of the added elements are the number of moles of the metal elements of silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium.

The added elements may be present as the form of at least one type of metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium substituting at least part of the lithium, potassium, sodium, niobium, tantalum, and antimony of the compound of the general formula $\{Li_x(K_{1-y}Na_y)_{1-x}\}(Nb_{1-z-w}Ta_zSb_w)O_3$ or in the form of the above metal elements, oxides or perovskite structure compounds, or other compounds containing the same present in the grains or at the grain boundaries of the piezoelectric ceramic composition.

In the piezoelectric ceramic composition of the present invention, no matter in which form of the above two forms the additive is contained, it is possible to similarly simultaneously obtain a superior apparent density, open porosity, and porosity.

Further, the open porosity of the piezoelectric ceramic composition is not more than 0.4 vol %. If the open porosity of the piezoelectric ceramic composition is over 0.4 vol %, the mechanical strength of the piezoelectric ceramic composition becomes insufficient and application to a piezoelectric element or dielectric element is liable to become difficult.

Next, preferably the apparent density of the piezoelectric ceramic composition is larger than the apparent density of a piezoelectric ceramic composition of the above general formula not containing the added elements. If the apparent density of the piezoelectric ceramic composition is smaller than the apparent density of a piezoelectric ceramic composition of the above general formula not containing the added elements (basic piezoelectric ceramic composition), not only cannot the effects of the additive be sufficiently obtained, but also the mechanical strength of the piezoelectric ceramic composition is liable to become insufficient.

The "larger than the apparent density of a piezoelectric ceramic composition of the above general formula not containing the added elements" means that the apparent density of the piezoelectric ceramic composition containing the added elements is larger than that of the basic piezoelectric ceramic composition having the basic composition of the piezoelectric ceramic composition not containing the above added elements.

Next, preferably at least one of the porosity and open porosity of the piezoelectric ceramic composition is smaller than the porosity or open porosity of a piezoelectric ceramic composition of the above general formula not containing the added elements. If larger than the porosity or open porosity of a piezoelectric ceramic composition of the above general formula not containing the added elements, not only cannot the effects of the additive be sufficiently obtained, but also the mechanical strength of the piezoelectric ceramic composition is liable to become insufficient.

The "smaller than the porosity or open porosity of a piezoelectric ceramic composition of the above general formula not containing the added elements" means that the porosity or open porosity of the piezoelectric ceramic composition containing the added elements is smaller than that of the basic piezoelectric ceramic composition having the basic composition of the piezoelectric ceramic composition not containing the above added elements.

Further, in a 21st or 22nd aspect of the invention, the additive includes at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium or a compound including these metal elements.

As a result of addition of the additive, the metal element contained in the additive sometimes is included in the piezoelectric ceramic composition as an added element by substitution of at least part of at least one type of the lithium, potassium, sodium, niobium, tantalum, and antimony of the compound of the general formula $\{Li_x(K_{1-y}Na_y)_{1-x}\}(Nb_{1-z-w}Ta_zSb_w)O_3$ after sintering. Further, sometimes the metal elements or oxides or perovskite structure compounds containing the metal elements are included in the grains or at the grain boundaries of the piezoelectric ceramic composition.

Further, in the 22nd aspect of the invention, the compound containing lithium includes for example $Li_2CO_3$, $Li_2O$, $LiNO_3$, $LiOH$, etc. The compound containing sodium includes $Na_2CO_3$, $NaHCO_3$, $NaNO_3$, etc.

Further, the compound containing potassium includes $K_2CO_3$, $KNO_3$, $KNbO_3$, $KTaO_3$, etc. The compound containing niobium includes for example $Nb_2O_5$, $Nb_2O_3$, $NbO_2$, etc. The compound containing tantalum includes $Ta_2O_5$ etc. The compound containing antimony includes for example $Sb_2O_5$, $Sb_2O_3$, $Sb_2O_4$, etc.

Preferably, the compound containing lithium is $Li_2CO_3$, the compound containing sodium is $Na_2CO_3$, the compound containing potassium is $K_2CO_5$, the compound containing niobium is $Nb_2O_5$, the compound containing tantalum is $Ta_2O_5$, and the compound containing antimony is $Sb_2O_5$ or $Sb_2O_3$. The additive is preferably at least one type selected from $Ag_2O$, $Al_2O_3$, $Au$, $Au_2O_3$, $B_2O_3$, $H_3BO_3$, $BaO$, $BaO_2$, $BaCO_3$, $Bi_2O_3$, $CaO$, $CaCO_3$, $CeO_2$, $Ce_2(CO_3)_3$, $CoO$, $Co_3O_4$, $CoCo_3$, $Cs_2Co_3$, $CuO$, $Cu_2O$, $Dy_2O_3$, $Er_2O_3$, $Eu_2O_3$, $Fe_2O_3$, $Ga_2O_3$, $Gd_2O_3$, $GeO_2$, $HfO_2$, $Ho_2O_3$, $In_2O_3$, $IrO_2$, $Ir_2O_3$, $La_2O_3$, $Lu_2O_3$, $MgO$, $MgC_2O_4$, $MnO$, $MnO_2$, $Mn_2O_3$, $Mn_3O_4$, $Nd_2O_3$, $Nd_2CO_3$, $NiO$, $NiCO_3$, $PdO$, $Pr_2O_3$, $Pr_6O_{11}$, $Pr_2(Co_3)_3$), $PtO_2$, $Rb_2O$, $Rb_2CO_3$, $Re_2O_7$, $RuO_2$, $Sc_2O_3$, $SiO_2$, $SiO$, $SiC$, $Sm_2O_3$, $SnO$, $SnO_2$, $SrO$, $SrCO_3$, $Tb_4O_7$, $TiO$, $Ti_2O_3$, $TiO_2$, $Tm_2O_3$, $V_2O_3$, $V_2O_4$, $V_2O_5$, $Y_2O_3$, $Y_2(CO_3)_3$, $Yb_2O_3$, $ZnO$, and $ZrO_2$. In this case, it is possible to easily fabricate the piezoelectric ceramic composition.

Next, in the 23rd or 24th aspect of the invention, the piezoelectric element includes for example a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor.

Next, in the 25th or 26th aspect of the invention, the dielectric element includes for example a capacitor, multilayer capacitor, etc.

(5) Invention V

In the 27th to 35th aspects of the invention, the piezoelectric ceramic composition of the general formula $\{Li_x(K_{1-y}Na_y)_{1-x}\}(Nb_{1-z-w}Ta_zSb_w)O_3$ has ranges of x, y, z, and w of $0 \leq x \leq 0.2$, $0 \leq y \leq 1$, $0 < z \leq 0.4$, and $0 < w \leq 0.2$. Here, when x>0.2, z>0.4, w>0.2, z=0, or w=0, the piezoelectric $d_{31}$ constant and other piezoelectric properties and dielectric properties drop and a piezoelectric ceramic composition having the desired properties is liable to not be able to be obtained any longer.

Further, the range of y in the general formula $\{Li_x(K_{1-y}Na_y)_{1-x}\}(Nb_{1-z-w}Ta_zSb_w)O_3$ is preferably $0 \leq x \leq 0.85$.

Further, the range of x in the general formula $\{Li_x(K_{1-y}Na_y)_{1-x}\}(Nb_{1-z-w}Ta_zSb_w)O_3$ is preferably $0 < x \leq 0.2$. In this case, since lithium becomes an essential ingredient, the piezoelectric ceramic composition can be more easily sintered at the time of production, the piezoelectric properties can be further improved, and the Curie temperature Tc can be further raised. This is because the inclusion of lithium as an essential ingredient in the above range causes the sintering temperature to drop, the lithium functions as a sintering aid, and sintering with little pores becomes possible.

Further, the value of x in the general formula $\{Li_x(K_{1-y}Na_y)_{1-x}\}(Nb_{1-z-w}Ta_zSb_w)O_3$ can be made x=0. In this case, the above formula is expressed by $(K_{1-y}Na_y)(Nb_{1-z-w}Ta_zSb_w)O_3$. Further, in this case, when preparing the piezoelectric ceramic composition, since the materials do not include any compound containing the lightest weight lithium such as $Li_2CO_3$, when mixing the materials to prepare the piezoelectric ceramic composition, it is possible to reduce the variation in properties due to segregation of the powder materials. Further, in this case, a high relative dielectric constant and relatively large piezoelectric g constant can be realized.

In the 27th aspect of the invention, the piezoelectric ceramic composition contains at least one type of metal element selected from magnesium, calcium, strontium, and barium as an added element and the total of the contents of the added elements is 0.0001 mol to 0.10 mol with respect to 1 mol of the compound of the above general formula.

The above additive may be added to the above piezoelectric ceramic composition having the general formula by substitutional addition or external addition.

If the total of the contents is less than 0–0001 mol or over 0.10 mol, the piezoelectric $d_{31}$ constant, the electromechanical coupling coefficient Kp, the relative dielectric constant $\in_{33r}/\in_0$, etc. of the piezoelectric ceramic composition drop and a piezoelectric ceramic composition having the desired piezoelectric properties and dielectric properties is liable to be unable to be obtained. Note that the contents of the added elements are the number of moles of the metal elements of magnesium, calcium, strontium, and barium.

The added elements may be present as the form of at least one type of metal element selected from magnesium, calcium, strontium, and barium substituting at least part of the lithium, potassium, sodium, niobium, tantalum, and antimony of the compound of the general formula $\{Li_x(K_{1-y}Na_y)_{1-x}\}(Nb_{1-z-w}Ta_zSb_w)O_3$. Atoms of magnesium, calcium, strontium, and barium which can become +2 values can be easily made present substituting at least part of the lithium, potassium, and sodium of the compound of the above general formula.

On the other hand, the added elements may be the above metal elements, oxides or perovskite structure compounds, or other compounds containing the same present in the grains or at the grain boundaries of the piezoelectric ceramic composition.

Preferably, the added elements are contained substituting at least part of the lithium, potassium, and sodium of the compound of the above general formula. In this case, the piezoelectric $d_{31}$ constant, electromechanical coupling coefficient Kp, and other piezoelectric properties and relative dielectric constant $\in_{33T}/\in_0$ and other dielectric properties of the piezoelectric ceramic composition can be further improved.

Particularly preferably, the added elements may be contained substituting at least part of the lithium, potassium, and sodium of the compound of the above general formula. In this case, the piezoelectric $d_{31}$ constant, electromechanical coupling coefficient Kp, and other piezoelectric properties and relative dielectric constant $\in_{33T}/\in_0$ and other dielectric properties of the piezoelectric ceramic composition can be further improved.

Particularly preferably, the at least one type of metal elements selected from magnesium, calcium, strontium, and barium serving as the added elements substitutes at least part of the potassium and/or sodium of the compound of the above general formula and the piezoelectric ceramic composition becomes a compound of the general formula $\{Li_x(K_{1-y}Na_y)_{1-x-2u}Ma_u\}(Nb_{1-z-w}Ta_zSb_w)O_3$ (where, Ma is at least one type of metal element selected from magnesium, calcium, strontium, and barium and x, y, z, w, and u of $0 \leq x \leq 0.2$, $0 \leq y \leq 1$, $0 < z \leq 0.4$, $0 < w \leq 0.2$, $0.0005 \leq u \leq 0.1$). In this case, the piezoelectric $d_{31}$ constant, electromechanical coupling coefficient Kp, and other piezoelectric properties and relative dielectric constant $\in_{33T}/\in_0$ and other dielectric properties of the piezoelectric ceramic composition can be further improved.

Further, in the 28th aspect of the invention, the piezoelectric ceramic composition contains at least one metal element selected from silicon, indium, and scandium as added elements and the total of the contents of the added elements is not more than 0.08 mol with respect to 1 mol of the compound of the above general formula.

The above additive may be added to the above piezoelectric ceramic composition having the general formula by substitutional addition or external addition.

If the total of the contents exceeds 0.08, the piezoelectric $d_{31}$ constant, electromechanical coupling coefficient Kp, and other piezoelectric properties and relative dielectric constant $\in_{33T}/\in_0$ and other dielectric properties of the piezoelectric ceramic composition drop and a piezoelectric ceramic composition having the desired piezoelectric properties and dielectric properties is liable to be unable to be obtained.

The lower limit of the total of the contents is preferably made 0.0001 mol so as to sufficiently obtain the effects of the added elements.

Note that the contents of the added elements are the number of moles of the metal elements of silicon, indium, and scandium.

The added elements may be present as the form of at least one type of metal element selected from silicon, indium, and scandium substituting at least part of the niobium, tantalum, and antimony of the compound of the general formula $\{Li_x(K_{1-y}Na_y)_{1-x}\}(Nb_{1-z-w}Ta_zSb_w)O_3$. A metal element able to become a +3 or +4 value such as silicon, indium, and scandium may be easily present substituting at least part of the niobium, tantalum, and antimony of the compound of the above general formula.

On the other hand, the above metal elements may also be the above metal elements, oxides or perovskite structure compounds, or other compounds containing the same present in the grains or at the grain boundaries of the piezoelectric ceramic composition.

The above additive may be added to the above piezoelectric ceramic composition having the general formula by substitutional addition or external addition.

In the piezoelectric ceramic composition of the 28th aspect of the invention, no matter in which form of the above two forms the added elements are contained, it is possible to similarly obtain superior piezoelectric properties and dielectric properties.

Further, in the 29th aspect of the invention, the piezoelectric ceramic composition contains bismuth as an added element and the content of the added element is 0.0001 mol to 0.004 mol with respect to 1 mol of the compound of the above general formula.

In the piezoelectric ceramic composition of the 29th aspect of the invention, by including bismuth in the small amount of 0.0001 mol to 0.004 mol, the piezoelectric $d_{31}$ constant and other properties are improved. If the total of the content is less than 0.0001 mol or over 0.004 mol, the piezoelectric $d_{31}$ constant, electromechanical coupling coefficient Kp, relative dielectric constant $\in_{33T}/\in_0$, etc. of the piezoelectric ceramic composition drop and a piezoelectric ceramic composition having the desired piezoelectric properties and dielectric properties is liable to be unable to be obtained.

Note that the content of the added element is the number of moles of the metal element bismuth.

The added element may be present as the form of bismuth atoms substituting at least part of the niobium, tantalum, and antimony of the compound of the general formula $\{Li_x(K_{1-y}Na_y)_{1-x}\}(Nb_{1-z-w}Ta_zSb_w)O_3$. A metal element able to become a +3 value such as bismuth may be easily present substituting at least part of the niobium, tantalum, and antimony of the compound of the above general formula.

On the other hand, the above metal element may also be the bismuth atoms, oxides or perovskite structure compounds, or other compounds containing the same present in the grains or at the grain boundaries of the piezoelectric ceramic composition.

The above additive may be added to the above piezoelectric ceramic composition having the general formula by substitutional addition or external addition.

In the piezoelectric ceramic composition of the 29th aspect of the invention, no matter in which form of the above two forms the added elements are contained, it is possible to similarly obtain superior piezoelectric properties and dielectric properties.

Next, in the 27th to 29th aspects of the invention, preferably the piezoelectric $d_{31}$ constant of the piezoelectric ceramic composition is larger than a piezoelectric $d_{31}$ constant of a piezoelectric ceramic composition of the above general formula not containing the added elements.

Next, preferably an electromechanical coupling coefficient Kp of the piezoelectric ceramic composition is larger than an electromechanical coupling coefficient Kp of a piezoelectric ceramic composition of the above general formula not containing the added elements.

Next, preferably a piezoelectric $g_{31}$ constant of the piezoelectric ceramic composition is larger than an piezoelectric $g_{31}$ constant of a piezoelectric ceramic composition of the above general formula not containing the added elements.

Next, preferably a mechanical quality factor Qm of the piezoelectric ceramic composition is larger than a mechanical quality factor Qm of a piezoelectric ceramic composition of the above general formula not containing the added elements.

If the piezoelectric $d_{31}$ constant, electromechanical coupling coefficient Kp, piezoelectric $g_{31}$ constant, and mechanical quality factor Qm of the piezoelectric ceramic composition are larger than those of the basic piezoelectric ceramic composition of the above general formula not containing the added elements, the effects of the added elements can be sufficiently obtained and application to a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor becomes easier.

Next, preferably a relative dielectric constant of the piezoelectric ceramic composition is larger than a relative dielectric constant of a piezoelectric ceramic composition of the above general formula not containing the added elements. If smaller than the relative dielectric constant of a piezoelectric ceramic composition of the above general formula not containing the added elements (basic piezoelectric ceramic composition), not only cannot the effects of the added elements be sufficiently obtained, but also application to a capacitor or other dielectric element becomes difficult.

Next, preferably a dielectric loss of the piezoelectric ceramic composition is smaller than a dielectric loss of a piezoelectric ceramic composition of the above general formula not containing the added elements. If larger than the dielectric loss of a piezoelectric ceramic composition of the above general formula not containing the added elements (basic piezoelectric ceramic composition), not only cannot the effects of the added elements be sufficiently obtained, but also application to a capacitor or other dielectric element becomes difficult.

Next, preferably a Curie temperature Tc of the piezoelectric ceramic composition is larger than a Curie temperature of a piezoelectric ceramic composition of the above general formula not containing the added elements. If larger than the Curie temperature Tc of a piezoelectric ceramic composition of the above general formula not containing the added elements (basic piezoelectric ceramic composition), the effects of the added elements can be sufficiently obtained and use in a high temperature environment of over 100° C. such as near an automobile engine becomes easier.

Next, preferably the piezoelectric ceramic composition has a piezoelectric $d_{31}$ constant of not less than 30 pm/V. In this case, it is possible to make use of the high piezoelectric $d_{31}$ constant of at least 30 pm/V and utilize the piezoelectric ceramic composition for a high sensitivity piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the piezoelectric $d_{31}$ constant is less than 30 pm/V, the piezoelectric ceramic composition is liable to be unable to be utilized for a piezoelectric element of properties sufficient for practical use. Further, to obtain more sensitive superior piezoelectric sensor properties or larger piezoelectric actuator properties, the piezoelectric $d_{31}$ constant is more preferably at least 40 pm/V. Still more preferably, it is at least 80 pm/V. Even more preferably, the piezoelectric $d_{31}$ constant should be at least 100 pm/V.

Next, preferably the piezoelectric ceramic composition has an electromechanical coupling coefficient Kp of not less than 0.3. In this case, it is possible to make use of the high electromechanical coupling coefficient Kp of at least 0.3 and utilize the piezoelectric ceramic composition for a piezoelectric element superior in conversion efficiency of mechanical energy and electrical energy such as a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the electromechanical coupling coefficient is less than 0.3, the piezoelectric ceramic composition is liable to be unable to be utilized for a piezoelectric element requiring a superior conversion efficiency of mechanical energy and electrical energy. Further, to obtain more superior conversion efficiency of mechanical energy and electrical energy, the electromechanical coupling coefficient Kp is more preferably at least 0.34. Still more preferably, it is at least 0.4. Even more preferably, the electromechanical coupling coefficient Kp should be at least 0.45.

Next, preferably the piezoelectric ceramic composition has a piezoelectric $g_{31}$ constant of not less than $7 \times 10^{-3}$ Vm/N. In this case, it is possible to make use of the high piezoelectric $g_{31}$ constant of at least $7 \times 10^{-3}$ Vm/N and utilize the piezoelectric ceramic composition for a superior booster ratio piezoelectric transformer, ultrasonic motor, sensor, etc.

If the piezoelectric $g_{31}$ constant is less than $7 \times 10^{-3}$ Vm/N, the piezoelectric ceramic composition is liable to be unable to be utilized for a piezoelectric element requiring a superior booster ratio. Further, to obtain an element more superior in booster ratio, the piezoelectric $g_{31}$ constant is more preferably made at least $8 \times 10^{-3}$ Vm/N.

Next, preferably the piezoelectric ceramic composition has a mechanical quality factor Qm of not less than 50. In this case, it is possible to make use of the high mechanical quality factor Qm of at least 50 and utilize the piezoelectric ceramic composition for a piezoelectric element with little heat generation and superior in conversion efficiency of mechanical energy and electrical energy such as a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the mechanical quality factor Qm is less than 50, the piezoelectric ceramic composition is liable to be unable to be utilized for a piezoelectric element requiring a superior conversion efficiency of mechanical energy and electrical energy. Further, to obtain more superior conversion efficiency of mechanical energy and electrical energy, the mechanical quality factor Qm is more preferably at least 40, more preferably at least 50.

Next, preferably the piezoelectric ceramic composition has a relative dielectric constant of not less than 400. In this case, it is possible to make use of the high relative dielectric constant of at least 400 and utilize the piezoelectric ceramic composition for a capacitor having a large electrostatic capacity or other dielectric element.

If the relative dielectric constant is less than 400, the electrostatic capacity drops and the piezoelectric ceramic composition is liable to be unable to be utilized for a capacitor or other dielectric element. The relative dielectric constant is more preferably at least 430. Still more preferably, it is at least 600.

Next, preferably the piezoelectric ceramic composition has a dielectric loss of not more than 0.09. In this case, it is possible to make use of the low dielectric loss of not more than 0.09 and utilize the piezoelectric ceramic composition for a capacitor or other dielectric element or a piezoelectric actuator, piezoelectric filter, piezoelectric vibrator, piezoelectric transformer, piezoelectric ultrasonic motor, piezoelectric gyroscope, knock sensor, yaw rate sensor, air bag sensor, back sonar, corner sonar, piezoelectric buzzer, piezoelectric speaker, piezoelectric ignitor, etc.

If the dielectric loss is more than 0.09, the piezoelectric ceramic composition is liable to be unable to be utilized for a capacitor or other dielectric element or piezoelectric transformer, ultrasonic motor, etc. Further, the dielectric loss is more preferably not more than 0.035. More preferably, it should be not more than 0.03.

Next, preferably the piezoelectric ceramic composition has a Curie temperature Tc of not less than 200° C. In this case, it is possible to make use of the high Curie temperature Tc of at least 200° C. and utilize the piezoelectric ceramic composition in a high temperature environment exceeding 100° C. such as near an automobile engine. If the Curie temperature Tc is less than 200° C., if using the piezoelectric ceramic composition at a high temperature location such as near an automobile engine, the piezoelectric $d_{31}$ constant, electromechanical coupling coefficient Kp, and other properties are liable to drop. Further, the Curie temperature Tc is more preferably at least 250° C.

Next, preferably the piezoelectric ceramic composition has a piezoelectric $d_{31}$ constant of not less than 30 pm/V and a Curie temperature Tc of not less than 200° C. In this case, it is possible to use the piezoelectric ceramic composition in a high temperature environment of a temperature of over 100° C. as a high sensitivity sensor, ultrasonic motor, actuator, piezoelectric transformer, piezoelectric vibrator, etc.

Further, to obtain more sensitive superior piezoelectric sensor properties or larger piezoelectric actuator properties, the piezoelectric $d_{31}$ constant is more preferably at least 40 pm/V. Still more preferably, it is at least 80 pm/V. Even more preferably, the piezoelectric $d_{31}$ constant should be at least 100 pm/V. Further, the Curie temperature Tc is more preferably at least 250° C.

Next, preferably, the piezoelectric ceramic composition has a piezoelectric $g_{31}$ constant of not less than $7 \times 10^{-3}$ Vm/N and a Curie temperature Tc of not less than 200° C. In this case, it is possible to use the piezoelectric ceramic composition in a high temperature environment of a temperature of over 100° C. as a superior booster ratio piezoelectric transformer, ultrasonic motor, sensor, etc.

Further, to obtain a more superior booster ratio, the piezoelectric $g_{31}$ constant is more preferably at least $8 \times 10^{-3}$ Vm/N. Further, the Curie temperature Tc is more preferably at least 250° C.

Next, preferably, the piezoelectric ceramic composition has an electromechanical coupling coefficient Kp of not less than 0.3 and a Curie temperature Tc of not less than 200° C. In this case, it is possible to use the piezoelectric ceramic composition in a high temperature environment of a temperature of over 100° C. as a piezoelectric element superior in conversion efficiency of mechanical energy and electrical energy such as a piezoelectric actuator, piezoelectric vibrator, sensor, piezoelectric transformer, ultrasonic motor, etc.

Further, to obtain a more superior conversion efficiency of mechanical energy and electrical energy, the electromechanical coupling coefficient Kp is more preferably at least 0.34. More preferably, it should be at least 0.4. Further, the Curie temperature Tc is more preferably at least 250° C.

Next, preferably the piezoelectric ceramic composition has a mechanical quality factor Qm of not less than 50 and a Curie temperature Tc of not less than 200° C. In this case, it is possible to use the piezoelectric ceramic composition in a high temperature environment of a temperature of over 100° C. as a piezoelectric element with little heat generation and superior in conversion efficiency of mechanical energy and electrical energy such as a piezoelectric actuator, piezoelectric vibrator, sensor, piezoelectric transformer, ultrasonic motor, etc. To obtain a more superior conversion efficient of mechanical energy and electrical energy, the mechanical quality factor Qm is more preferably at least 40. More preferably, it should be at least 50. Further, the Curie temperature Tc is more preferably at least 250° C.

Next, preferably the piezoelectric ceramic composition has a dielectric loss of not more than 0.09 and a Curie temperature Tc of not less than 200° C. In this case, it is possible to use the piezoelectric ceramic composition in a high temperature environment of a temperature of over 100° C. as a capacitor or other dielectric element or a piezoelectric transformer, ultrasonic motor, sensor, etc. Further, the dielectric loss is more preferably not more than 0.035. More preferably, it should be not more than 0.03. Further, the Curie temperature Tc is more preferably at least 250° C.

Next, preferably the piezoelectric ceramic composition has a piezoelectric $d_{31}$ constant of not less than 30 pm/V, an electromechanical coupling coefficient Kp of not less than 0.3, and a Curie temperature Tc of not less than 200° C. In this case, it is possible to use the piezoelectric ceramic composition in a high temperature environment of a temperature of over 100° C. and obtain a superior sensitivity and conversion efficiency of mechanical energy and electrical energy.

Further, to obtain more sensitive superior piezoelectric sensor properties or larger piezoelectric actuator properties, the piezoelectric do constant is more preferably at least 40 pm/V. Further, the electromechanical coupling coefficient Kp is more preferably at least 0.34.

Further, in a 30th or 33rd aspect of the invention, the additive includes at least one metal element selected from magnesium, calcium, strontium, and barium or a compound including these metal elements.

The metal elements included in the additive sometimes are included in the piezoelectric ceramic composition as added elements by substitution of at least part of the lithium, potassium, and sodium of the compound of the general formula $\{Li_x(K_{1-y}Na_y)_{1-x}\}(Nb_{1-z-w}Ta_zSb_w)O_3$ after sintering. Further, sometimes the metal elements or oxides or perovskite structure compounds containing the metal elements are included in the grains or at the grain boundaries of the piezoelectric ceramic composition.

Further, in a 31st or 34th aspect of the invention, the additive includes at least one type of metal element selected from silicon, indium, and scandium or a compound including these metal elements.

The above metal elements included in the additive sometimes are included in the piezoelectric ceramic composition as added elements by substitution of at least part of the niobium, tantalum, and antimony of the compound of the general formula $\{Li_x(K_{1-y}Na_y)_{1-x}\}(Nb_{1-z-w}Ta_zSb_w)O_3$ after sintering. Further, sometimes the metal elements atoms or oxides or perovskite structure compounds containing the metal elements are included in the grains or at the grain boundaries of the piezoelectric ceramic composition.

Further, in a 32nd or 35th aspect of the invention, the additive includes bismuth atoms or a compound including bismuth atoms.

The bismuth included in the additive sometimes is included in the piezoelectric ceramic composition as an added element by substitution of at least part of the niobium, tantalum, and antimony of the compound of the general formula $\{Li_x(K_{1-y}Na_y)_{1-x}\}(Nb_{1-z-w}Ta_zSb_w)O_3$ after sintering. Further, sometimes the bismuth atoms or oxides or perovskite structure compounds containing the bismuth atoms are included in the grains or at the grain boundaries of the piezoelectric ceramic composition.

Further, in the 33rd to 35th aspects of the invention, the compound containing lithium includes for example $Li_2CO_3$, $Li_2O$, $LiNO_3$, $LiOH$, etc. The compound containing sodium includes $Na_2CO_3$, $NaHCO_3$, $NaNO_3$, etc.

Further, the compound containing potassium includes $K_2CO_3$, $KNO_3$, $KNbO_3$, $KTaO_3$, etc. The compound containing niobium includes for example $Nb_2O_5$, $Nb_2O_3$, $NbO_2$, etc. The compound containing tantalum includes $Ta_2O_5$ etc. The compound containing antimony includes for example $Sb_2O_5$, $Sb_2O_3$, $Sb_2O_4$, etc.

In the 33rd aspect of the invention, preferably the compound containing lithium is $Li_2CO_3$, the compound containing sodium is $Na_2CO_3$, the compound containing potassium is $K_2CO_3$, the compound containing niobium is $Nb_2O_5$, the compound containing tantalum is $Ta_2O_5$, the compound containing antimony is $Sb_2O_5$ or $Sb_2O_3$, and the additive is at least one type selected from MgO, $MgCO_3$, CaO, $CaCO_3$, SrO, $SrCO_3$, BaO, and $BaCO_3$. In this case, it is possible to easily fabricate the piezoelectric ceramic composition of the 27th aspect of the invention.

In the 34th aspect of the invention, preferably the compound containing lithium is $Li_2CO_3$, the compound containing sodium is $Na_2CO_3$, the compound containing potassium is $K_2CO_3$, the compound containing niobium is $Nb_2O_5$, the compound containing tantalum is $Ta_2O_5$, the compound containing antimony is $Sb_2O_5$ or $Sb_2O_3$, and the additive is at least one type selected from $SiO_2$, $In_2O_3$, and $Sc_2O_3$. In this case, it is possible to easily fabricate the piezoelectric ceramic composition of the 28th aspect of the invention.

In the 35th aspect of the invention, preferably the compound containing lithium is $Li_2CO_3$, the compound containing sodium is $Na_2CO_3$, the compound containing potassium is $K_2CO_3$, the compound containing niobium is $Nb_2O_5$, the compound containing tantalum is $Ta_2O_5$, the compound containing antimony is $Sb_2O_5$ or $Sb_2O_3$, and the additive is $Bi_2O_3$. In this case, it is possible to easily fabricate the piezoelectric ceramic composition of the 29th aspect of the invention.

Next, in the 36th or 37th aspect of the invention, the piezoelectric element includes for example a piezoelectric actuator, piezoelectric filter, piezoelectric vibrator, piezoelectric transformer, piezoelectric ultrasonic motor, piezoelectric gyrosensor, knock sensor, yaw rate sensor, air bag sensor, back sonar, corner sonar, piezoelectric buzzer, piezoelectric speaker, and piezoelectric ignitor.

Next, in the 38th or 39th aspect of the invention, the dielectric element includes for example a capacitor, multilayer capacitor, etc.

EXAMPLE GROUP I

Next, piezoelectric ceramic compositions of Example Group I will be explained. In these examples, piezoelectric ceramic compositions were produced and measured in physical properties. The piezoelectric ceramic compositions of these examples were piezoelectric ceramic compositions of a general formula $\{Li_x(K_{1-y}Na_y)_{1-x}\}(Nb_{1-z-w}Ta_zSb_w)O_3$ where x, y, z, and were in the ranges of $0 \leq x \leq 0.2$, $0 \leq y \leq 1$, $0 < z \leq 0.4$, and $0 < w \leq 0.2$.

Next, a method of production of the piezoelectric ceramic compositions of these examples will be explained. First, as the materials of the piezoelectric ceramic compositions, over 99% purity high purity $Li_2CO_3$, $Na_2CO_3$, $K_2CO_3$, $Nb_2O_5$, $Ta_2O_5$, and $Sb_2O_5$ were prepared. These materials were mixed by a stoichiometric ratio giving a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$.

Here, as shown in the later mentioned Table 1 to Table 6, x was made 0, 0.01, 0.02, 0.03, 0.04, 0.06, 0.08, 0.10, 0.15, and 0.20. Further, y was made 0, 0.05, 0.1, 0.2, 0.3, 0.4, 0.42, 0.44, 0.45, 0.46, 0.47, 0.48, 0.49, 0.5, 0.51, 0.52, 0.53, 0.54, 0.55, 0.56, 0.58, 0.60, 0.70, 0.75, 0.8, and 1.0. Further, z was made 0.002, 0.08, 0.10, 0.12, 0.14, 0.16, 0.18, 0.20, 0.22, and 0.30. Further, w was made 0.02, 0.04, 0.05, 0.06, and 0.07.

Further, the materials blended to give each of these stoichiometric ratios were mixed in ball mills in acetone for 24 hours to prepare mixtures.

Next, the mixtures were calcined at 750° C. for 5 hours, then the calcined mixtures were pulverized by ball mills for 24 hours. Next, polyvinyl butyral was added as a binder and granules were formed.

The powders after granulation were press formed into disk shapes of a diameter of 18 mm and a thickness of 1 mm. The shaped articles were sintered at 1000 to 1300° C. for 1 hour to prepare sintered bodies. Note that the sintering temperature at this time was the temperature giving the greatest density selected from 1000° C. to 1300° C.

Next, the two surfaces of the sintered bodies after sintering were cylindrically polished, then the two surfaces of the disk samples were provided with metal electrodes by sputtering. Further, a DC voltage of 1 to 5 kV/mm was supplied between the electrodes for 10 minutes in 100° C. silicone oil to give polarization in the thickness direction and produce the piezoelectric ceramic compositions.

In this way, piezoelectric ceramic compositions having 180 types of stoichiometric compositions (Samples 1 to 180) were prepared. The stoichiometric ratios of the samples are shown in Table 1 to Table 6.

Further, in this example, to clarify the superior properties of the piezoelectric ceramic compositions, Comparisons 1 to 5 were fabricated in the following way. First, as materials of Comparison 1, at least 99% purity high purity $K_2CO_3$, $Na_2CO_3$, and $Nb_2O_5$ were prepared. These materials were mixed by a stoichiometric ratio giving the general formula $(K_{0.5}Na_{0.5})NbO_3$, then mixed by a ball mill in acetone for 24 hours to obtain a mixture. This mixture was calcined, granulated, shaped, sintered, and polarized in the same way as in Samples 1 to 161 to obtain Comparison 1.

Further, at least 99% purity high purity $Li_2CO_3$, $K_2CO_3$, $Na_2CO_3$, $Nb_2O_6$, $Ta_2O_5$, and $Sb_2O_5$ were prepared and samples of the formulas $\{Li_x(K_{1-y}Na_y)_{1-x}\}(Nb_{1-z-w}Ta_zSb_w)O_3$ where x=0.22, y=0.50, z=0.45, and w=0.22, where x=0.22, y=0.50, z=0.10, and w=0.22, where x=0.22, y=0.50, z=0.45, and w=0.02, and where x=0.02, y=0.50, z=0.10, and w=0.22 were fabricated by similar methods as Comparisons 2, 3, 4, and 5. The chemical formulas of Comparisons 1 to 5 are shown in Table 6.

Next, Samples 1 to 180 and Comparisons 1 to 5 were measured for the piezoelectric $d_{31}$ constant, piezoelectric $g_{31}$ constant, electromechanical coupling coefficient Kp, Curie temperature Tc, relative dielectric constant $\in_{33T}/\in_0$, and dielectric loss tan δ.

Here, the piezoelectric $d_{31}$ constant, piezoelectric $g_{31}$ constant, and electromechanical coupling coefficient Kp were measured by the resonance-antiresonance method using an impedance analyzer. The dielectric loss and relative dielectric constant were measured by a measurement frequency of 1 kHz using an impedance analyzer. Further, for the Curie temperature Tc, the temperature of the highest relative dielectric constant was made the Curie temperature Tc. The results are shown in Table 7 to Table 12.

Samples 2, 4, 8, 15, 16, 31 to 34, 40, 41, 48, 49, 71, 72, 74, 75, 79, 80, 81, 88 to 90, 103, 104, 107, 110, 112, 115, 118, 119, 123 to 129, 133, 134, 136 to 140, 143, 145, 151, and 152 and Comparison 1 were measured for the long-term stability of the dielectric loss.

As the method for measurement of the long-term stability of the dielectric loss, first the dielectric losses tan δ of the samples and Comparison 1 after polarization were measured using an impedance analyzer at a Measurement frequency of 1 kHz in the same way as above and the values used as the initial tan δ. Further, the dielectric losses tan δ 50 days, 100 days, and 200 days after the polarization were measured and compared with the values of the initial tan δ so as to evaluate the long-term stability of the dielectric losses. The results are shown in Table 13 to Table 14.

TABLE 1

|  | x | y | z | w |
|---|---|---|---|---|
| Sample 1 | 0 | 0.5 | 0.002 | 0.02 |
| Sample 2 | 0.02 | 0.5 | 0.002 | 0.02 |
| Sample 3 | 0.04 | 0.5 | 0.002 | 0.02 |
| Sample 4 | 0.06 | 0.5 | 0.002 | 0.02 |
| Sample 5 | 0.08 | 0.5 | 0.002 | 0.02 |
| Sample 6 | 0.1 | 0.5 | 0.002 | 0.02 |
| Sample 7 | 0 | 0.5 | 0.1 | 0.02 |
| Sample 8 | 0.02 | 0.5 | 0.1 | 0.02 |
| Sample 9 | 0.04 | 0.5 | 0.1 | 0.02 |
| Sample 10 | 0.06 | 0.5 | 0.1 | 0.02 |
| Sample 11 | 0.08 | 0.5 | 0.1 | 0.02 |
| Sample 12 | 0.1 | 0.5 | 0.1 | 0.02 |
| Sample 13 | 0.15 | 0.5 | 0.1 | 0.02 |
| Sample 14 | 0.2 | 0.5 | 0.1 | 0.02 |
| Sample 15 | 0 | 0.5 | 0.2 | 0.02 |
| Sample 16 | 0.02 | 0.5 | 0.2 | 0.02 |
| Sample 17 | 0.04 | 0.5 | 0.2 | 0.02 |
| Sample 18 | 0.06 | 0.5 | 0.2 | 0.02 |
| Sample 19 | 0.08 | 0.5 | 0.2 | 0.02 |
| Sample 20 | 0.1 | 0.5 | 0.2 | 0.02 |
| Sample 21 | 0.15 | 0.5 | 0.2 | 0.02 |
| Sample 22 | 0.2 | 0.5 | 0.2 | 0.02 |
| Sample 23 | 0 | 0.5 | 0.3 | 0.02 |

TABLE 1-continued

|  | x | y | z | w |
|---|---|---|---|---|
| Sample 24 | 0.02 | 0.5 | 0.3 | 0.02 |
| Sample 25 | 0.04 | 0.5 | 0.3 | 0.02 |
| Sample 26 | 0.06 | 0.5 | 0.3 | 0.02 |
| Sample 27 | 0.08 | 0.5 | 0.3 | 0.02 |
| Sample 28 | 0.1 | 0.5 | 0.3 | 0.02 |
| Sample 29 | 0.15 | 0.5 | 0.3 | 0.02 |
| Sample 30 | 0.2 | 0.5 | 0.3 | 0.02 |

TABLE 2

|  | x | y | z | w |
|---|---|---|---|---|
| Sample 31 | 0 | 0.5 | 0.002 | 0.04 |
| Sample 32 | 0.02 | 0.5 | 0.002 | 0.04 |
| Sample 33 | 0.04 | 0.5 | 0.002 | 0.04 |
| Sample 34 | 0.06 | 0.5 | 0.002 | 0.04 |
| Sample 35 | 0.08 | 0.5 | 0.002 | 0.04 |
| Sample 36 | 0.1 | 0.5 | 0.002 | 0.04 |
| Sample 37 | 0.15 | 0.5 | 0.002 | 0.04 |
| Sample 38 | 0.2 | 0.5 | 0.002 | 0.04 |
| Sample 39 | 0 | 0.5 | 0.1 | 0.04 |
| Sample 40 | 0.02 | 0.5 | 0.1 | 0.04 |
| Sample 41 | 0.04 | 0.5 | 0.1 | 0.04 |
| Sample 42 | 0.06 | 0.5 | 0.1 | 0.04 |
| Sample 43 | 00.8 | 0.5 | 0.1 | 0.04 |
| Sample 44 | 0.1 | 0.5 | 0.1 | 0.04 |
| Sample 45 | 0.15 | 0.5 | 0.1 | 0.04 |
| Sample 46 | 0.2 | 0.5 | 0.1 | 0.04 |
| Sample 47 | 0 | 0.5 | 0.2 | 0.04 |
| Sample 48 | 0.02 | 0.5 | 0.2 | 0.04 |
| Sample 49 | 0.04 | 0.5 | 0.2 | 0.04 |
| Sample 50 | 0.06 | 0.5 | 0.2 | 0.04 |
| Sample 51 | 0.08 | 0.5 | 0.2 | 0.04 |
| Sample 52 | 0.1 | 0.5 | 0.2 | 0.04 |
| Sample 53 | 0.15 | 0.5 | 0.2 | 0.04 |
| Sample 54 | 0.2 | 0.5 | 0.2 | 0.04 |
| Sample 55 | 0 | 0.5 | 0.3 | 0.04 |
| Sample 56 | 0.02 | 0.5 | 0.3 | 0.04 |
| Sample 57 | 0.04 | 0.5 | 0.3 | 0.04 |
| Sample 58 | 0.06 | 0.5 | 0.3 | 0.04 |
| Sample 59 | 0.08 | 0.5 | 0.3 | 0.04 |
| Sample 60 | 0.1 | 0.5 | 0.3 | 0.04 |
| Sample 61 | 0.15 | 0.5 | 0.3 | 0.04 |
| Sample 62 | 0.2 | 0.5 | 0.3 | 0.04 |

TABLE 3

|  | x | y | z | w |
|---|---|---|---|---|
| Sample 63 | 0 | 0.5 | 0.4 | 0.04 |
| Sample 64 | 0.02 | 0.5 | 0.4 | 0.04 |
| Sample 65 | 0.04 | 0.5 | 0.4 | 0.04 |
| Sample 66 | 0.06 | 0.5 | 0.4 | 0.04 |
| Sample 67 | 0.08 | 0.5 | 0.4 | 0.04 |
| Sample 68 | 0.1 | 0.5 | 0.4 | 0.04 |
| Sample 69 | 0.15 | 0.5 | 0.4 | 0.04 |
| Sample 70 | 0.2 | 0.5 | 0.4 | 0.04 |
| Sample 71 | 0 | 0.5 | 0.002 | 0.06 |
| Sample 72 | 0.02 | 0.5 | 0.002 | 0.06 |
| Sample 73 | 0.04 | 0.5 | 0.002 | 0.06 |
| Sample 74 | 0.06 | 0.5 | 0.002 | 0.06 |
| Sample 75 | 0.08 | 0.5 | 0.002 | 0.06 |
| Sample 76 | 0.1 | 0.5 | 0.002 | 0.06 |
| Sample 77 | 0.15 | 0.5 | 0.002 | 0.06 |
| Sample 78 | 0.2 | 0.5 | 0.002 | 0.06 |
| Sample 79 | 0 | 0.5 | 0.1 | 0.06 |
| Sample 80 | 0.02 | 0.5 | 0.1 | 0.06 |
| Sample 81 | 0.04 | 0.5 | 0.1 | 0.06 |
| Sample 82 | 0.06 | 0.5 | 0.1 | 0.06 |
| Sample 83 | 0.08 | 0.5 | 0.1 | 0.06 |
| Sample 84 | 0.1 | 0.5 | 0.1 | 0.06 |
| Sample 85 | 0.15 | 0.5 | 0.1 | 0.06 |

TABLE 3-continued

|  | x | y | z | w |
|---|---|---|---|---|
| Sample 86 | 0.2 | 0.5 | 0.1 | 0.06 |
| Sample 87 | 0 | 0.5 | 0.2 | 0.06 |
| Sample 88 | 0.02 | 0.5 | 0.2 | 0.06 |
| Sample 89 | 0.04 | 0.5 | 0.2 | 0.06 |
| Sample 90 | 0.06 | 0.5 | 0.2 | 0.06 |
| Sample 91 | 0.08 | 0.5 | 0.2 | 0.06 |
| Sample 92 | 0.1 | 0.5 | 0.2 | 0.06 |
| Sample 93 | 0.15 | 0.5 | 0.2 | 0.06 |
| Sample 94 | 0.2 | 0.5 | 0.2 | 0.06 |

TABLE 4

|  | x | y | z | w |
|---|---|---|---|---|
| Sample 95 | 0 | 0.5 | 0.3 | 0.06 |
| Sample 96 | 0.02 | 0.5 | 0.3 | 0.06 |
| Sample 97 | 0.04 | 0.5 | 0.3 | 0.06 |
| Sample 98 | 0.06 | 0.5 | 0.3 | 0.06 |
| Sample 99 | 0.08 | 0.5 | 0.3 | 0.06 |
| Sample 100 | 0.1 | 0.5 | 0.3 | 0.06 |
| Sample 101 | 0.15 | 0.5 | 0.3 | 0.06 |
| Sample 102 | 0.2 | 0.5 | 0.3 | 0.06 |
| Sample 103 | 0.02 | 0.5 | 0.012 | 0.04 |
| Sample 104 | 0.04 | 0.5 | 0.012 | 0.04 |
| Sample 105 | 0.06 | 0.5 | 0.012 | 0.04 |
| Sample 106 | 0.02 | 0.5 | 0.014 | 0.04 |
| Sample 107 | 0.04 | 0.5 | 0.014 | 0.04 |
| Sample 108 | 0.06 | 0.5 | 0.014 | 0.04 |
| Sample 109 | 0.02 | 0.5 | 0.016 | 0.04 |
| Sample 110 | 0.04 | 0.5 | 0.016 | 0.04 |
| Sample 111 | 0.06 | 0.5 | 0.016 | 0.04 |
| Sample 112 | 0.02 | 0.5 | 0.18 | 0.04 |
| Sample 113 | 0.04 | 0.5 | 0.18 | 0.04 |
| Sample 114 | 0.01 | 0.5 | 0.2 | 0.04 |
| Sample 115 | 0.03 | 0.5 | 0.2 | 0.04 |
| Sample 116 | 0.02 | 0.5 | 0.22 | 0.04 |
| Sample 117 | 0.04 | 0.5 | 0.22 | 0.04 |
| Sample 118 | 0.02 | 0.5 | 0.08 | 0.05 |
| Sample 119 | 0.04 | 0.5 | 0.08 | 0.05 |
| Sample 120 | 0.06 | 0.5 | 0.08 | 0.05 |
| Sample 121 | 0.02 | 0.5 | 0.1 | 0.05 |
| Sample 122 | 0.04 | 0.5 | 0.1 | 0.05 |
| Sample 123 | 0.06 | 0.5 | 0.1 | 0.05 |
| Sample 124 | 0.02 | 0.5 | 0.12 | 0.05 |
| Sample 125 | 0.04 | 0.5 | 0.12 | 0.05 |
| Sample 126 | 0.06 | 0.5 | 0.12 | 0.05 |
| Sample 127 | 0.02 | 0.5 | 0.14 | 0.05 |
| Sample 128 | 0.04 | 0.5 | 0.14 | 0.05 |
| Sample 129 | 0.06 | 0.5 | 0.14 | 0.05 |

TABLE 5

|  | x | y | z | w |
|---|---|---|---|---|
| Sample 130 | 0.02 | 0.5 | 0.16 | 0.05 |
| Sample 131 | 0.04 | 0.5 | 0.16 | 0.05 |
| Sample 132 | 0.06 | 0.5 | 0.16 | 0.05 |
| Sample 133 | 0.02 | 0.5 | 0.08 | 0.06 |
| Sample 134 | 0.04 | 0.5 | 0.08 | 0.06 |
| Sample 135 | 0.06 | 0.5 | 0.08 | 0.06 |
| Sample 136 | 0.03 | 0.5 | 0.1 | 0.06 |
| Sample 137 | 0.05 | 0.5 | 0.1 | 0.06 |
| Sample 138 | 0.02 | 0.5 | 0.012 | 0.06 |
| Sample 139 | 0.04 | 0.5 | 0.012 | 0.06 |
| Sample 140 | 0.06 | 0.5 | 0.012 | 0.06 |
| Sample 141 | 0.02 | 0.5 | 0.014 | 0.06 |
| Sample 142 | 0.04 | 0.5 | 0.014 | 0.06 |
| Sample 143 | 0.06 | 0.5 | 0.014 | 0.06 |
| Sample 144 | 0.02 | 0.5 | 0.016 | 0.06 |
| Sample 145 | 0.04 | 0.5 | 0.016 | 0.06 |
| Sample 146 | 0.06 | 0.5 | 0.016 | 0.06 |
| Sample 147 | 0.02 | 0.5 | 0.08 | 0.07 |

TABLE 5-continued

|  | x | y | z | w |
|---|---|---|---|---|
| Sample 148 | 0.04 | 0.5 | 0.08 | 0.07 |
| Sample 149 | 0.06 | 0.5 | 0.08 | 0.07 |
| Sample 150 | 0.02 | 0.5 | 0.1 | 0.07 |
| Sample 151 | 0.04 | 0.5 | 0.1 | 0.07 |
| Sample 152 | 0.06 | 0.5 | 0.1 | 0.07 |
| Sample 153 | 0.02 | 0.5 | 0.12 | 0.07 |
| Sample 154 | 0.04 | 0.5 | 0.12 | 0.07 |

TABLE 6

|  | x | y | z | w |
|---|---|---|---|---|
| Sample 155 | 0.04 | 0 | 0.1 | 0.06 |
| Sample 156 | 0.04 | 0.2 | 0.1 | 0.06 |
| Sample 157 | 0.04 | 0.4 | 0.1 | 0.06 |
| Sample 158 | 0.04 | 0.5 | 0.1 | 0.06 |
| Sample 159 | 0.04 | 0.6 | 0.1 | 0.06 |
| Sample 160 | 0.04 | 0.8 | 0.1 | 0.06 |
| Sample 161 | 0.04 | 1 | 0.1 | 0.06 |
| Sample 162 | 0.04 | 0.05 | 0.1 | 0.06 |
| Sample 163 | 0.04 | 0.1 | 0.1 | 0.06 |
| Sample 164 | 0.04 | 0.3 | 0.1 | 0.06 |
| Sample 165 | 0.04 | 0.42 | 0.1 | 0.06 |
| Sample 166 | 0.04 | 0.44 | 0.1 | 0.06 |
| Sample 167 | 0.04 | 0.45 | 0.1 | 0.06 |
| Sample 168 | 0.04 | 0.46 | 0.1 | 0.06 |
| Sample 169 | 0.04 | 0.47 | 0.1 | 0.06 |
| Sample 170 | 0.04 | 0.48 | 0.1 | 0.06 |
| Sample 171 | 0.04 | 0.49 | 0.1 | 0.06 |
| Sample 172 | 0.04 | 0.51 | 0.1 | 0.06 |
| Sample 173 | 0.04 | 0.52 | 0.1 | 0.06 |
| Sample 174 | 0.04 | 0.53 | 0.1 | 0.06 |
| Sample 175 | 0.04 | 0.54 | 0.1 | 0.06 |
| Sample 176 | 0.04 | 0.55 | 0.1 | 0.06 |
| Sample 177 | 0.04 | 0.56 | 0.1 | 0.06 |
| Sample 178 | 0.04 | 0.58 | 0.1 | 0.06 |
| Sample 179 | 0.04 | 0.7 | 0.1 | 0.06 |
| Sample 180 | 0.04 | 0.75 | 0.1 | 0.06 |
| Sample 181 | 0.02 | 0.5 | 0.1 | 0.1 |
| Sample 182 | 0.02 | 0.5 | 0.1 | 0.2 |
| Comp. 1 | 0 | 0.5 | 0 | 0 |
| Comp. 2 | 0.22 | 0.5 | 0.45 | 0.22 |
| Comp. 3 | 0.22 | 0.5 | 0.1 | 0.02 |
| Comp. 4 | 0.02 | 0.5 | 0.45 | 0.02 |
| Comp. 5 | 0.02 | 0.5 | 0.1 | 0.22 |

TABLE 7

|  | $d_{31}$ (pm/V) | Kp | $g_{31}$ (× $10^{-3}$ Vm/N) | $\epsilon_{33r}/\epsilon_0$ | tanδ | Tc (° C.) |
|---|---|---|---|---|---|---|
| Sample 1 | 52.1 | 0.463 | 12.1 | 486 | 0.032 | 369 |
| Sample 2 | 52.9 | 0.444 | 11.3 | 526 | 0.046 | 394 |
| Sample 3 | 69.0 | 0.451 | 10.2 | 810 | 0.040 | 398 |
| Sample 4 | 84.3 | 0.457 | 8.7 | 1092 | 0.072 | 430 |
| Sample 5 | 72.5 | 0.411 | 7.5 | 1090 | 0.099 | 441 |
| Sample 6 | 49.6 | 0.291 | 5.0 | 1122 | 0.041 | 453 |
| Sample 7 | 39.2 | 0.360 | 10.0 | 1193 | 0.026 | 244 |
| Sample 8 | 66.4 | 0.446 | 9.5 | 786 | 0.040 | 335 |
| Sample 9 | 88.9 | 0.463 | 8.3 | 1209 | 0.037 | 355 |
| Sample 10 | 83.0 | 0.468 | 8.3 | 1124 | 0.040 | 374 |
| Sample 11 | 66.4 | 0.404 | 7.3 | 1028 | 0.089 | 385 |
| Sample 12 | 50.5 | 0.355 | 7.1 | 825 | 0.062 | 396 |
| Sample 13 | 38.2 | 0.284 | 5.8 | 739 | 0.059 | 407 |
| Sample 14 | 25.2 | 0.200 | 4.7 | 607 | 0.042 | 413 |
| Sample 15 | 58.6 | 0.346 | 6.1 | 1090 | 0.037 | 218 |
| Sample 16 | 84.0 | 0.450 | 7.5 | 1272 | 0.036 | 292 |
| Sample 17 | 87.2 | 0.444 | 7.6 | 1290 | 0.029 | 270 |
| Sample 18 | 67.9 | 0.428 | 7.7 | 996 | 0.029 | 316 |
| Sample 19 | 53.4 | 0.389 | 7.5 | 809 | 0.047 | 331 |
| Sample 20 | 45.1 | 0.341 | 6.6 | 775 | 0.029 | 330 |
| Sample 21 | 33.6 | 0.275 | 5.8 | 651 | 0.025 | 343 |

TABLE 7-continued

|  | $d_{31}$ (pm/V) | Kp | $g_{31}$ (× $10^{-3}$ Vm/N) | $\epsilon_{33T}/\epsilon_0$ | tan$\delta$ | Tc (° C.) |
|---|---|---|---|---|---|---|
| Sample 22 | 28.7 | 0.226 | 4.8 | 679 | 0.129 | 352 |
| Sample 23 | 13.0 | 0.076 | 1.2 | 1489 | 0.107 | 192 |
| Sample 24 | 33.8 | 0.160 | 2.6 | 1454 | 0.048 | 214 |
| Sample 25 | 63.8 | 0.368 | 5.9 | 1213 | 0.022 | 227 |
| Sample 26 | 56.7 | 0.382 | 6.8 | 947 | 0.041 | 248 |
| Sample 27 | 45.8 | 0.339 | 6.4 | 812 | 0.092 | 269 |
| Sample 28 | 41.5 | 0.310 | 5.8 | 812 | 0.116 | 276 |
| Sample 29 | 29.8 | 0.230 | 5.3 | 641 | 0.129 | 296 |
| Sample 30 | 22.9 | 0.179 | 3.9 | 661 | 0.116 | 296 |

TABLE 8

|  | $d_{31}$ (pm/V) | Kp | $g_{31}$ (× $10^{-3}$ Vm/N) | $\epsilon_{33T}/\epsilon_0$ | tan$\delta$ | Tc (° C.) |
|---|---|---|---|---|---|---|
| Sample 31 | 86.2 | 0.623 | 16.2 | 603 | 0.032 | 330 |
| Sample 32 | 62.9 | 0.478 | 12.7 | 559 | 0.050 | 346 |
| Sample 33 | 65.3 | 0.433 | 9.2 | 798 | 0.059 | 370 |
| Sample 34 | 99.8 | 0.484 | 8.0 | 1407 | 0.086 | 384 |
| Sample 35 | 61.7 | 0.363 | 6.6 | 1057 | 0.040 | 399 |
| Sample 36 | 55.8 | 0.344 | 6.3 | 1008 | 0.095 | 407 |
| Sample 37 | 42.2 | 0.282 | 5.5 | 873 | 0.129 | 437 |
| Sample 38 | 26.6 | 0.194 | 4.2 | 706 | 0.138 | 448 |
| Sample 39 | 74.8 | 0.452 | 6.6 | 1275 | 0.029 | 275 |
| Sample 40 | 85.4 | 0.465 | 9.5 | 1233 | 0.035 | 292 |
| Sample 41 | 70.1 | 0.452 | 7.8 | 1389 | 0.026 | 309 |
| Sample 42 | 76.8 | 0.426 | 7.2 | 1204 | 0.019 | 328 |
| Sample 43 | 58.7 | 0.355 | 6.4 | 1043 | 0.031 | 337 |
| Sample 44 | 52.9 | 0.342 | 6.0 | 1000 | 0.057 | 347 |
| Sample 45 | 35.9 | 0.250 | 4.8 | 851 | 0.085 | 358 |
| Sample 46 | 39.4 | 0.274 | 5.2 | 849 | 0.082 | 361 |
| Sample 47 | 81.0 | 0.440 | 8.1 | 1133 | 0.025 | 209 |
| Sample 48 | 108.0 | 0.452 | 7.0 | 1907 | 0.028 | 231 |
| Sample 49 | 88.9 | 0.440 | 7.0 | 1437 | 0.018 | 252 |
| Sample 50 | 67.7 | 0.416 | 7.0 | 1091 | 0.020 | 272 |
| Sample 51 | 53.7 | 0.355 | 6.3 | 956 | 0.017 | 280 |
| Sample 52 | 46.4 | 0.323 | 5.8 | 907 | 0.034 | 289 |
| Sample 53 | 31.3 | 0.231 | 4.5 | 790 | 0.039 | 302 |
| Sample 54 | 27.5 | 0.214 | 4.4 | 713 | 0.033 | 319 |
| Sample 55 | 55.0 | 0.321 | 2.7 | 2274 | 0.023 | 140 |
| Sample 56 | 81.6 | 0.341 | 4.2 | 2199 | 0.026 | 168 |
| Sample 57 | 70.5 | 0.370 | 5.4 | 1478 | 0.019 | 196 |
| Sample 58 | 62.3 | 0.376 | 7.0 | 1098 | 0.021 | 212 |
| Sample 59 | 46.1 | 0.322 | 5.5 | 944 | 0.024 | 225 |
| Sample 60 | 36.6 | 0.269 | 4.7 | 874 | 0.019 | 232 |
| Sample 61 | 23.7 | 0.185 | 3.5 | 776 | 0.023 | 247 |
| Sample 62 | 20.4 | 0.164 | 3.3 | 700 | 0.035 | 260 |

TABLE 9

|  | $d_{31}$ (pm/V) | Kp | $g_{31}$ (× $10^{-3}$ Vm/N) | $\epsilon_{33T}/\epsilon_0$ | tan$\delta$ | Tc (° C.) |
|---|---|---|---|---|---|---|
| Sample 63 | 4.9 | 0.080 | 0.2 | 3625 | 0.085 | 76 |
| Sample 64 | 19.9 | 0.080 | 0.8 | 2656 | 0.032 | 104 |
| Sample 65 | 34.8 | 0.179 | 8.0 | 1687 | 0.026 | 132 |
| Sample 66 | 36.3 | 0.223 | 3.2 | 1269 | 0.023 | 150 |
| Sample 67 | 41.0 | 0.288 | 4.8 | 972 | 0.018 | 173 |
| Sample 68 | 30.1 | 0.226 | 3.8 | 889 | 0.019 | 177 |
| Sample 69 | 22.3 | 0.178 | 3.3 | 757 | 0.016 | 199 |
| Sample 70 | 16.1 | 0.129 | 2.5 | 719 | 0.018 | 201 |
| Sample 71 | 66.3 | 0.452 | 9.7 | 769 | 0.040 | 289 |
| Sample 72 | 66.8 | 0.435 | 9.2 | 819 | 0.036 | 307 |
| Sample 73 | 86.9 | 0.476 | 8.8 | 1121 | 0.035 | 326 |
| Sample 74 | 104.0 | 0.502 | 8.4 | 1399 | 0.018 | 341 |
| Sample 75 | 78.9 | 0.400 | 7.3 | 1386 | 0.136 | 365 |
| Sample 76 | 71.2 | 0.397 | 7.0 | 1146 | 0.073 | 389 |
| Sample 77 | 67.9 | 0.388 | 7.0 | 1094 | 0.040 | 386 |
| Sample 78 | 40.6 | 0.287 | 5.5 | 849 | 0.040 | 400 |
| Sample 79 | 61.4 | 0.311 | 5.1 | 1358 | 0.040 | 227 |
| Sample 80 | 85.1 | 0.425 | 7.0 | 1414 | 0.035 | 253 |

TABLE 9-continued

|  | $d_{31}$ (pm/V) | Kp | $g_{31}$ (× $10^{-3}$ Vm/N) | $\epsilon_{33T}/\epsilon_0$ | tan$\delta$ | Tc (° C.) |
|---|---|---|---|---|---|---|
| Sample 81 | 114.9 | 0.494 | 7.1 | 1841 | 0.027 | 272 |
| Sample 82 | 83.6 | 0.444 | 7.0 | 1358 | 0.017 | 290 |
| Sample 83 | 66.0 | 0.387 | 6.4 | 1159 | 0.029 | 306 |
| Sample 84 | 54.8 | 0.344 | 6.1 | 1021 | 0.027 | 318 |
| Sample 85 | 40.1 | 0.283 | 5.4 | 845 | 0.040 | 351 |
| Sample 86 | 26.2 | 0.200 | 4.1 | 721 | 0.056 | 371 |
| Sample 87 | 38.4 | 0.152 | 3.7 | 1175 | 0.037 | 166 |
| Sample 88 | 90.6 | 0.346 | 4.4 | 2305 | 0.030 | 192 |
| Sample 89 | 83.3 | 0.384 | 5.3 | 1769 | 0.021 | 216 |
| Sample 90 | 68.2 | 0.389 | 5.9 | 1298 | 0.020 | 233 |
| Sample 91 | 50.0 | 0.318 | 5.3 | 1060 | 0.018 | 247 |
| Sample 92 | 40.5 | 0.272 | 4.7 | 980 | 0.017 | 249 |
| Sample 93 | 32.7 | 0.238 | 4.7 | 784 | 0.025 | 288 |
| Sample 94 | 24.4 | 0.181 | 3.5 | 797 | 0.092 | 296 |

TABLE 10

|  | $d_{31}$ (pm/V) | Kp | $g_{31}$ (× $10^{-3}$ Vm/N) | $\epsilon_{33T}/\epsilon_0$ | tan$\delta$ | Tc (° C.) |
|---|---|---|---|---|---|---|
| Sample 95 | 0.0 | 0.000 | 0.0 | 3058 | 0.110 | 105 |
| Sample 96 | 16.7 | 0.061 | 0.8 | 2422 | 0.065 | 130 |
| Sample 97 | 54.8 | 0.258 | 3.5 | 1786 | 0.025 | 156 |
| Sample 98 | 48.5 | 0.277 | 4.1 | 1351 | 0.022 | 173 |
| Sample 99 | 38.6 | 0.245 | 3.8 | 1161 | 0.022 | 186 |
| Sample 100 | 33.8 | 0.221 | 3.4 | 1109 | 0.022 | 188 |
| Sample 101 | 26.9 | 0.200 | 3.8 | 803 | 0.024 | 248 |
| Sample 102 | 22.7 | 0.184 | 3.8 | 670 | 0.023 | 252 |
| Sample 103 | 73.5 | 0.426 | 7.9 | 1050 | 0.031 | 280 |
| Sample 104 | 92.1 | 0.447 | 7.2 | 1453 | 0.024 | 302 |
| Sample 105 | 80.9 | 0.452 | 7.7 | 1190 | 0.029 | 273 |
| Sample 106 | 84.7 | 0.468 | 8.3 | 1150 | 0.030 | 265 |
| Sample 107 | 99.4 | 0.480 | 7.7 | 1466 | 0.016 | 289 |
| Sample 108 | 73.1 | 0.429 | 7.4 | 1122 | 0.014 | 307 |
| Sample 109 | 90.7 | 0.449 | 7.3 | 1406 | 0.032 | 253 |
| Sample 110 | 104.3 | 0.483 | 7.4 | 1597 | 0.019 | 276 |
| Sample 111 | 72.3 | 0.428 | 7.3 | 1127 | 0.038 | 291 |
| Sample 112 | 101.9 | 0.445 | 6.7 | 1715 | 0.030 | 245 |
| Sample 113 | 89.0 | 0.425 | 6.7 | 1503 | 0.017 | 265 |
| Sample 114 | 115.2 | 0.449 | 6.4 | 2024 | 0.024 | 221 |
| Sample 115 | 113.4 | 0.488 | 7.3 | 1748 | 0.021 | 243 |
| Sample 116 | 84.1 | 0.398 | 6.8 | 1393 | 0.035 | 221 |
| Sample 117 | 89.2 | 0.436 | 6.5 | 1552 | 0.017 | 243 |
| Sample 118 | 70.3 | 0.429 | 8.0 | 988 | 0.043 | 281 |
| Sample 119 | 97.0 | 0.466 | 7.5 | 1458 | 0.022 | 297 |
| Sample 120 | 86.5 | 0.461 | 7.4 | 1314 | 0.040 | 317 |
| Sample 121 | 70.5 | 0.403 | 7.2 | 1099 | 0.033 | 266 |
| Sample 122 | 107.2 | 0.473 | 7.1 | 1698 | 0.022 | 290 |
| Sample 123 | 82.3 | 0.447 | 7.3 | 1276 | 0.056 | 309 |
| Sample 124 | 74.3 | 0.416 | 7.4 | 1140 | 0.031 | 258 |
| Sample 125 | 123.6 | 0.548 | 8.4 | 1665 | 0.024 | 273 |
| Sample 126 | 75.2 | 0.422 | 7.0 | 1218 | 0.020 | 295 |
| Sample 127 | 79.7 | 0.406 | 7.2 | 1396 | 0.034 | 248 |
| Sample 128 | 103.9 | 0.469 | 7.0 | 1688 | 0.018 | 270 |
| Sample 129 | 77.3 | 0.445 | 7.4 | 1183 | 0.012 | 286 |

TABLE 11

|  | $d_{31}$ (pm/V) | Kp | $g_{31}$ (× $10^{-3}$ Vm/N) | $\epsilon_{33T}/\epsilon_0$ | tan$\delta$ | Tc (° C.) |
|---|---|---|---|---|---|---|
| Sample 130 | 96.5 | 0.434 | 7.1 | 1527 | 0.033 | 236 |
| Sample 131 | 97.8 | 0.444 | 6.4 | 1722 | 0.018 | 253 |
| Sample 132 | 74.4 | 0.428 | 6.9 | 1211 | 0.030 | 274 |
| Sample 133 | 68.8 | 0.380 | 6.6 | 1177 | 0.033 | 264 |
| Sample 134 | 107.5 | 0.487 | 7.1 | 1708 | 0.030 | 278 |
| Sample 135 | 81.1 | 0.425 | 6.6 | 1381 | 0.022 | 294 |
| Sample 136 | 105.1 | 0.454 | 7.1 | 1738 | 0.037 | 259 |
| Sample 137 | 92.5 | 0.463 | 7.0 | 1497 | 0.014 | 280 |
| Sample 138 | 87.8 | 0.416 | 7.1 | 1392 | 0.033 | 236 |
| Sample 139 | 107.4 | 0.478 | 7.0 | 1740 | 0.020 | 260 |

TABLE 11-continued

|  | $d_{31}$ (pm/V) | Kp | $g_{31}$ (× $10^{-3}$ Vm/N) | $\epsilon_{33T}/\epsilon_0$ | tanδ | Tc (° C.) |
|---|---|---|---|---|---|---|
| Sample 140 | 79.9 | 0.434 | 6.9 | 1302 | 0.022 | 273 |
| Sample 141 | 86.8 | 0.402 | 6.4 | 1527 | 0.032 | 226 |
| Sample 142 | 95.5 | 0.431 | 6.1 | 1759 | 0.019 | 247 |
| Sample 143 | 75.8 | 0.422 | 6.8 | 1250 | 0.013 | 265 |
| Sample 144 | 106.6 | 0.438 | 6.3 | 1921 | 0.030 | 215 |
| Sample 145 | 100.6 | 0.444 | 6.4 | 1761 | 0.016 | 234 |
| Sample 146 | 70.1 | 0.397 | 6.4 | 1240 | 0.014 | 250 |
| Sample 147 | 82.1 | 0.425 | 6.9 | 1349 | 0.035 | 240 |
| Sample 148 | 107.5 | 0.447 | 6.2 | 1955 | 0.022 | 265 |
| Sample 149 | 90.3 | 0.448 | 6.7 | 1532 | 0.028 | 278 |
| Sample 150 | 85.3 | 0.416 | 6.4 | 1506 | 0.034 | 228 |
| Sample 151 | 111.1 | 0.458 | 6.1 | 2053 | 0.022 | 256 |
| Sample 152 | 78.5 | 0.404 | 6.1 | 1464 | 0.026 | 265 |
| Sample 153 | 78.0 | 0.357 | 5.1 | 1725 | 0.037 | 217 |
| Sample 154 | 111.5 | 0.457 | 6.0 | 2100 | 0.024 | 235 |

TABLE 12

|  | $d_{31}$ (pm/V) | Kp | $g_{31}$ (× $10^{-3}$ Vm/N) | $\epsilon_{33T}/\epsilon_0$ | tanδ | Tc (° C.) | $d_{31}$ ratio |
|---|---|---|---|---|---|---|---|
| Sample 155 | 36.0 | 0.246 | 4.8 | 846 | 0.041 | 286 | 0.31 |
| Sample 156 | 51.9 | 0.305 | 5.3 | 1103 | 0.044 | 270 | 0.45 |
| Sample 157 | 96.2 | 0.439 | 6.6 | 1636 | 0.027 | 270 | 0.84 |
| Sample 158 | 114.9 | 0.494 | 7.1 | 1841 | 0.027 | 269 | 1 |
| Sample 159 | 106.2 | 0.454 | 6.7 | 1780 | 0.025 | 270 | 0.92 |
| Sample 160 | 25.1 | 0.260 | 7.5 | 377 | 0.036 | 264 | 0.22 |
| Sample 161 | 18.0 | 0.222 | 7.5 | 301 | 0.027 | 265 | 0.16 |
| Sample 162 | 40.0 | 0.261 | 4.9 | 910 | 0.042 | 282 | 0.35 |
| Sample 163 | 44.0 | 0.275 | 5.1 | 975 | 0.043 | 278 | 0.38 |
| Sample 164 | 80.0 | 0.372 | 6.0 | 1369 | 0.036 | 270 | 0.7 |
| Sample 165 | 104.4 | 0.470 | 7.5 | 1582 | 0.024 | 270 | 0.91 |
| Sample 166 | 113.4 | 0.483 | 7.2 | 1798 | 0.023 | 270 | 0.99 |
| Sample 167 | 122.3 | 0.496 | 6.9 | 2013 | 0.022 | 270 | 1.06 |
| Sample 168 | 126.9 | 0.509 | 7.1 | 2033 | 0.021 | 270 | 1.1 |
| Sample 169 | 125.1 | 0.506 | 7.1 | 1980 | 0.021 | 270 | 1.09 |
| Sample 170 | 122.2 | 0.488 | 6.6 | 2091 | 0.019 | 270 | 1.06 |
| Sample 171 | 123.3 | 0.501 | 7.0 | 2004 | 0.022 | 270 | 1.07 |
| Sample 172 | 123.3 | 0.496 | 6.9 | 2017 | 0.025 | 270 | 1.07 |
| Sample 173 | 127.3 | 0.509 | 7.0 | 2051 | 0.020 | 270 | 1.11 |
| Sample 174 | 127.5 | 0.503 | 6.9 | 2079 | 0.021 | 270 | 1.11 |
| Sample 175 | 132.4 | 0.511 | 7.0 | 2136 | 0.021 | 270 | 1.15 |
| Sample 176 | 124.7 | 0.491 | 6.8 | 2066 | 0.021 | 270 | 1.09 |
| Sample 177 | 123.9 | 0.488 | 6.8 | 2045 | 0.023 | 270 | 1.08 |
| Sample 178 | 123.0 | 0.485 | 6.9 | 2023 | 0.024 | 270 | 1.07 |
| Sample 179 | 60.0 | 0.357 | 7.1 | 1078 | 0.030 | 267 | 0.52 |
| Sample 180 | 45.0 | 0.309 | 7.3 | 727 | 0.033 | 266 | 0.39 |
| Sample 181 | 66.2 | 0.239 | 4 | 1733 | 0.04 | 185.5 | |
| Sample 182 | 47.1 | 0.061 | 1.2 | 2312 | 0.04 | 80.5 | |
| Comp. 1 | 37.6 | 0.334 | 9.9 | 429 | 0.036 | 415 | |
| Comp. 2 | 0.5 | 0.027 | 0.0 | 1762 | 0.111 | <room temp. | |
| Comp. 3 | 9.8 | 0.069 | 1.6 | 680 | 0.141 | 400 | |
| Comp. 4 | 42.6 | 0.193 | 2.3 | 2093 | 0.025 | 114.2 | |
| Comp. 5 | 13.3 | 0.053 | 0.6 | 2471 | 0.041 | 72 | |

TABLE 13

|  | Initial tanδ | tanδ after 50 days | tanδ after 100 days | tanδ after 200 days |
|---|---|---|---|---|
| Sample 2 | 0.046 |  | 0.132 |  |
| Sample 4 | 0.072 |  | 0.253 |  |
| Sample 5 | 0.099 |  | 0.432 |  |
| Sample 8 | 0.040 |  |  | 0.053 |
| Sample 15 | 0.037 |  | 0.038 |  |
| Sample 16 | 0.036 |  | 0.036 |  |
| Sample 31 | 0.032 |  | 0.041 |  |
| Sample 32 | 0.050 |  | 0.050 |  |

TABLE 13-continued

|  | Initial tanδ | tanδ after 50 days | tanδ after 100 days | tanδ after 200 days |
|---|---|---|---|---|
| Sample 33 | 0.059 |  |  | 0.088 |
| Sample 34 | 0.086 |  |  | 0.141 |
| Sample 40 | 0.035 |  |  | 0.033 |
| Sample 41 | 0.026 |  |  | 0.023 |
| Sample 48 | 0.028 |  |  | 0.029 |
| Sample 49 | 0.018 |  |  | 0.017 |
| Sample 71 | 0.040 |  | 0.040 |  |
| Sample 72 | 0.036 |  | 0.046 |  |
| Sample 74 | 0.018 |  | 0.020 |  |
| Sample 75 | 0.056 |  | 0.130 |  |
| Sample 79 | 0.038 |  |  | 0.035 |
| Sample 80 | 0.035 |  |  | 0.042 |
| Sample 81 | 0.027 |  |  | 0.024 |
| Sample 88 | 0.030 | 0.030 |  |  |
| Sample 89 | 0.021 |  | 0.019 |  |
| Sample 90 | 0.020 |  | 0.044 |  |
| Sample 103 | 0.031 | 0.032 |  |  |
| Sample 104 | 0.024 | 0.24 |  |  |

TABLE 14

|  | Initial tanδ | tanδ after 50 days | tanδ after 100 days | tanδ after 200 days |
|---|---|---|---|---|
| Sample 107 | 0.016 | 0.017 |  |  |
| Sample 110 | 0.019 | 0.022 |  |  |
| Sample 112 | 0.030 | 0.029 |  |  |
| Sample 115 | 0.021 |  | 0.032 |  |
| Sample 118 | 0.043 | 0.043 |  |  |
| Sample 119 | 0.022 | 0.020 |  |  |
| Sample 123 | 0.056 | 0.059 |  |  |
| Sample 124 | 0.031 | 0.033 |  |  |
| Sample 125 | 0.024 | 0.020 |  |  |
| Sample 126 | 0.020 |  | 0.027 |  |
| Sample 127 | 0.034 | 0.034 |  |  |
| Sample 128 | 0.018 | 0.021 |  |  |
| Sample 129 | 0.012 |  | 0.014 |  |
| Sample 133 | 0.033 | 0.032 |  |  |
| Sample 134 | 0.030 | 0.030 |  |  |
| Sample 136 | 0.027 | 0.029 |  |  |
| Sample 137 | 0.014 |  | 0.015 |  |
| Sample 138 | 0.033 |  | 0.031 |  |
| Sample 139 | 0.020 |  | 0.025 |  |
| Sample 140 | 0.022 |  | 0.032 |  |
| Sample 143 | 0.013 |  | 0.012 |  |
| Sample 145 | 0.016 | 0.013 |  |  |
| Sample 151 | 0.022 | 0.023 |  |  |
| Sample 152 | 0.026 | 0.020 |  |  |
| Comp. 1 | 0.036 | 0.120 | 0.220 | 0.250 |

As will be understood from Table 6 to Table 12, Samples 1 to 13, 15 to 20, 25 to 28, 31 to 37, 39, 44, 46 to 52, 55 to 59, 67, 71 to 85, 87 to 92, 97 to 99, 103 to 154, 156 to 159, and 162 to 180 exhibited piezoelectric $d_{31}$ constants higher than Comparison 1.

Here, Table 12 shows the various piezoelectric properties and dielectric properties when fixing the values of x, z, and w and changing the value of y in the above general formula $\{Li_x(K_{1-y}Na_y)_{1-x}\}(Nb_{1-z-w}Ta_zSb_w)O_3$. In Table 12, to clarify the change in the piezoelectric $d_{31}$ constant when changing the value of y, the ratios of the values of the piezoelectric $d_{31}$ constants of Samples 155 to 180 with respect to the value of the piezoelectric $d_{31}$ constant when y=0.5 (sample 158) are shown as the $d_{31}$ ratios.

Further, as will be understood from Table 5 to Table 12, Samples 1 to 5, 7 to 12, 15 to 20, 25 to 28, 31 to 36, 39 to 44, 47 to 51, 56 to 58, 71 to 78, 80 to 84, 88 to 90, 103 to 154, 157 to 159, and 164 to 179 exhibited electromechanical coupling coefficients Kp higher than Comparison 1.

Samples 1 to 159 and Samples 162 to 180 exhibited high relative dielectric constants of at least 430 and were superior to even Comparison 1.

Samples 1 to 5, 7 to 12, 16 to 20, 31 to 34, 40 to 42, 47 to 50, 58, 65, 71 to 77, 80 to 82, 103 to 111, 115, 118 to 130, 134, 136 to 139, 158, 160 to 161, 165 to 166, 168 to 169, 171, 173, and 175 and Samples 179 to 180 exhibited high piezoelectric $g_{31}$ constants of at least $7.0 \times 10^{-3}$ Vm/M.

Samples 1 to 22, 24 to 54, 58 to 62, 70 to 86, 89 to 94, and 101 to 180 exhibited high Curie temperatures Tc of at least 200° C.

Samples 1 to 22, 24 to 26, 31 to 35, 39 to 74, 76 to 94, and 96 to 180 exhibited low dielectric losses tan δ of not more than 0.09.

As will be understood from Table 13 and Table 14, the dielectric losses of the samples did not rise much even after the elapse of 50 days, 100 days, and 200 days and therefore were superior in stability. As opposed to this, the dielectric loss of Comparison 1 increases to over 3-times the initial tan δ after the elapse of 50 days and over 6-times after 100 days. Further, it increased close to 7-times the initial tan δ after the elapse of 200 days. There was therefore a problem in stability.

Here, if taking note of the piezoelectric $d_{31}$ constant, as will be understood from Table 1 to Table 12, when x=0.04, y=0.54, z=0.1, and w=0.05 (Sample 175), the piezoelectric $d_{31}$ constant exhibited its highest value of 132.4 pm/V.

Further, as will be understood from Table 6 and Table 12, if fabricating the piezoelectric ceramic compositions while changing the value of y in the above general formula $\{Li_x(K_{1-y}Na_y)_{1-x}\}(Nb_{1-z-w}Ta_zSb_w)O_3$, the piezoelectric $d_{31}$ constant changes greatly. Therefore, to make the relationship between the value of y in the above general formula and the piezoelectric $d_{31}$ constant more readily understandable, the results of the piezoelectric $d_{31}$ constant in Table 12 are shown in FIG. 1. FIG. 1 shows the value of y in the above general formula on the abscissa and the piezoelectric $d_{31}$ constant on the ordinate.

As will be understood from FIG. 1, to realize a high piezoelectric $d_{31}$ constant of at least 40 pm/V, the value of y in the above general formula $\{Li_x(K_{1-y}Na_y)_{1-x}\}(Nb_{1-z-w}Ta_zSb_w)O_3$ is preferably made $0.05 \leq y \leq 0.75$. If the range of the value of y is $0.35 \leq y \leq 0.65$, it is possible to realize a high piezoelectric $d_{31}$ constant of at least 80 pmV. Further, if the range of the value of y is $0.42 \leq y \leq 0.60$, it is possible to realize an even higher piezoelectric $d_{31}$ constant of over 100 pm/V. However, the preferable ranges of y change when the values of x, z, and w in the above general formula change.

When using the composition as a charge detection type circuit or a current detection type circuit, in general the piezoelectric $d_{31}$ constant is proportional to the output voltage of an accelerator sensor, weight sensor, impact sensor, knock sensor, and other piezoelectric type sensors. Seen from this point, it is possible to prepare a sensor with a charge sensor output larger the higher the piezoelectric $d_{31}$ constant of the piezoelectric ceramic composition. Further, to fabricate a sensor having properties equal to or better than Comparison 1, it can be said to be preferable to have a piezoelectric $d_{31}$ constant of at least 30 pm/V. Further, to fabricate a high sensitivity sensor raised in the signal-to-noise ratio (SN ratio) and output voltage, the piezoelectric $d_{31}$ constant should be at least 80 pm/V. More preferably it should be at least 100 pm/V.

Further, when using the composition as an actuator, in general the piezoelectric $d_{31}$ constant is proportional to the generated distortion or displacement of the piezoelectric actuator. Seen from this point, it is possible to produce an actuator with a larger generated distortion or displacement the higher the piezoelectric $d_{31}$ constant of the piezoelectric ceramic composition. Further, to fabricate an actuator having properties equal to or better than Comparison 1, it can be said preferable to have a piezoelectric $d_{31}$ constant of at least 30 pmV. More preferably it should be at least 40 pm/V. Further, to fabricate an actuator with a large displacement, the piezoelectric $d_{31}$ constant should be at least 80 pm/V. More preferably, it should be at least 100 pm/V.

Further, taking note of the electromechanical coupling coefficient Kp, as will be understood from Table 1 to Table 10, when x=0, y=0.5, z=0.002, and w=0.04 (Sample 31), the electromechanical coupling coefficient Kp exhibits its highest value of 0.623.

In general, the electromechanical coupling coefficient Kp is proportional to the electromechanical energy conversion efficiency of the piezoelectric transformer, ultrasonic motor, actuator, ultrasonic vibrator, etc. Seen from this viewpoint, it is possible to produce a piezoelectric transformer, ultrasonic motor, actuator, ultrasonic vibrator, etc. having a higher electromechanical energy conversion efficiency the higher the electromechanical coupling coefficient Kp of the piezoelectric ceramic composition. Further, to fabricate a piezoelectric transformer, ultrasonic motor, actuator, ultrasonic vibrator, etc. having properties equal to or better than the Comparison 1, it can be said to be preferable to have an electromechanical coupling coefficient Kp of at least 0.3. More preferably, it should be at least 0.34. Still more preferably, it should be at least 0.4. Most preferably, it should be at least 0.5.

Taking note of the Curie temperature Tc, the Curie temperatures Tc of the piezoelectric ceramic compositions of Samples 1 to 22, 24 to 54, 58 to 62, 70 to 86, 89 to 94, and 101 to 180 are high values of at least 200° C. Therefore, the piezoelectric ceramic compositions of the present example in the above composition region can be utilized as knock sensors or other high temperature sensor components, actuator components, ultrasonic motor components, etc. able to be used stably over a long period at high temperature locations such as near an automobile engine.

For further long-term stable use as a high temperature sensor component, actuator component, ultrasonic motor component, etc., the Curie temperature Tc is preferably at least 200° C. More preferably it should be at least 250° C.

Taking note of the piezoelectric $g_{31}$ constant, as will be understood from Table 1 to Table 10, when x=0, y=0.5, z=0.002, and w=0.04 (Sample 31), the piezoelectric $g_{31}$ constant exhibits its highest value at $16.2 \times 10^{-3}$ Vm/N.

The piezoelectric $g_{31}$ constant, like the piezoelectric $d_{31}$ constant, is proportional to the output voltage of a piezoelectric sensor, piezoelectric element, ultrasonic motor, etc. Therefore, it is possible to produce a sensor with a larger voltage sensor output the higher the piezoelectric $g_{31}$ constant of the piezoelectric ceramic composition. Further, to fabricate a sensor having properties equal to or better than the Comparison 1, it can be said to be preferable to have a piezoelectric $g_{31}$ constant of at least $7 \times 10^{-3}$ Vm/N. More preferably, it should be at least $10 \times 10^{-3}$ Vm/N.

Taking note of the relative dielectric constant $\epsilon_{33T}/\epsilon_0$, the relative dielectric constants $\epsilon_{33T}/\epsilon_0$ of the Samples 1 to 159 and Samples 162 to 180 are high values of at least 430.

The relative dielectric constant $\epsilon_{33T}/\epsilon_0$ is generally proportional to the electrostatic capacity of a multilayer capacitor or other capacitor. Seen from this point, it is possible to produce a capacitor with a larger electrostatic capacity the higher the relative dielectric constant of the piezoelectric ceramic composition. To fabricate a capacitor, it can be said to be preferable to have a relative dielectric constant of at least 400. More preferably, it should be at least 430. Still more preferably, it should be at least 600.

Taking note of the dielectric loss tan δ, the dielectric losses tan δ of the Samples 1 to 22, 24 to 26, 31 to 35, 39 to 74, 76 to 94, and 96 to 180 are low values of not more than 0.09.

The dielectric loss is proportional to the heat energy lost by a capacitor component or other capacitor, piezoelectric ultrasonic motor, piezoelectric actuator, piezoelectric transformer, or other component when applying an AC voltage to that component. Seen from this point, it is possible to fabricate a capacitor with a smaller energy loss or a piezoelectric ultrasonic motor, piezoelectric actuator, or piezoelectric transformer with a smaller heat generation the smaller the dielectric loss of the piezoelectric ceramic composition. Further, to fabricate a component with a small dielectric loss, it is preferable to have a dielectric loss of not more than 0.09. More preferably, it should be not more than 0.035.

Taking note of the long-term stability of the dielectric loss, as shown in Table 13 and Table 14, there is the defect that with a sample with a z of 0.002, that is, with an extremely small content of tantalum, the dielectric loss becomes larger if the sample is allowed to stand in the atmosphere for a long period. On the other hand, with a sample with a z greater than 0.002 and a w not equal to 0, there is little change in the dielectric loss and the value of the dielectric loss is kept to a small value of not more than 0.09 even if the sample is allowed to stand in the atmosphere for a long period of time. In this way, the dielectric loss tan δ of the piezoelectric ceramic composition of the present example of the general formula $\{Li_x(K_{1-y}Na_y)_{1-x}\}(Nb_{1-z-w}Ta_zSb_w)O_3$ wherein $0 \leq x \leq 0.2$, $0 \leq y \leq 0.11$, $0 < z \leq 0.4$, and $0 < w \leq 0.2$ has long-term stability.

Further, as shown in Table 12, it is learned that Comparisons 2, 3, and 5 not included in the composition region of the piezoelectric ceramic composition of the present invention all have piezoelectric $d_{31}$ constants of low values of 0.5, 9.81, and 13.31 pm/V. Further, Comparison 4 has a piezoelectric $d_{31}$ constant of 42.62 pm/V, but has a Curie temperature of a low 117° C. and therefore cannot be used as an auto part which requires a Curie temperature of at least 200° C.

EXAMPLE GROUP II

Next, piezoelectric ceramic compositions of Example Group II will be explained. In these examples, piezoelectric ceramic compositions were produced and measured in physical properties. The piezoelectric ceramic compositions of these examples were piezoelectric ceramic compositions containing as main ingredients compounds of a general formula $\{Li_x(K_{1-y}Na_y)_{1-x}\}(Nb_{1-z-w}Ta_zSb_w)O_3$ where x, y, z, and w were in the ranges of $0 \leq x \leq 0.2$, $0 \leq y \leq 1$, $0 < z \leq 0.4$, and $0 < w \leq 0.2$. The piezoelectric ceramic compositions included added elements of at least one metal element selected from palladium, silver, gold, ruthenium, rhodium, rhenium, osmium, iridium, and platinum. Further, the total of the contents of the added elements was from 0.001 mol to 0.15 mol with respect to 1 mol of the compound of the above general formula.

The above additive may be added to the above piezoelectric ceramic composition having the general formula by substitutional addition or external addition.

The method of production of a piezoelectric ceramic composition of these examples comprises mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$, mixing an additive containing at least one metal element selected from palladium, silver, gold, ruthenium, rhodium, rhenium, osmium, iridium, and platinum, and sintering the result.

Next, the method of production of the piezoelectric ceramic compositions of these examples will be explained in more detail.

First, as the materials of the piezoelectric ceramic compositions, over 99% purity high purity $Li_2CO_3$, $Na_2CO_3$, $K_2CO_3$, $Nb_2O_5$, $Ta_2O_3$, and $Sb_2O$ and, as the additive, $PdO_2$, $Ag_2O$, $Au$, $RuO_2$, $Re_2O_7$, $IrO_2$, and $PtO_2$ were prepared.

Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving a general formula $\{Li_x(K_{1-y}Na_y)_{1-x}\}(Nb_{1-z-w}Ta_zSb_w)O_3$ where x, y, z, and w are x=0.04, y=0.5, z=0.1, and w=0.04, that is, a stoichiometric ratio whereby the general formula becomes $\{Li_{0.04}(K_{0.5}Na_{0.5})_{0.96}\}(Nb_{0.96}Ta_{0.1}Sb_{0.04}))O_3$, then the $PdO_2$, $Ag_2O$, $Au$, $RuO_2$, $Re_2O_7$, $IrO_2$, and $PtO_2$ serving as the additives were mixed to obtain seven types of formulations.

Regarding the amounts of incorporation of these additives, the $PdO_2$, $Ag_2O$, $Au$, $RuO_2$, $Re_2O_7$, $IrO_2$, and $PtO_2$ of the additives were included in amounts of 0.01 mol, 0.005 mol, 0.01 mol, 0.01 mol, 0.005 mol, 0.01 mol, and 0.01 mol, respectively, with respect to 1 mol of the compound $\{Li_{0.04}(K_{0.5}Na_{0.5})_{0.96}\}(Nb_{0.86}Ta_{0.1}Sb_{0.04}))O_3$ expected to be obtained by formulation by the above stoichiometric ratio. That is, 0.01 mol of the metal element included in each additive was incorporated.

The formulations were kneaded by ball mills in acetone for 24 hours to fabricate mixtures.

Next, the mixtures were calcined at 750° C. for 5 hours, then the calcined mixtures were pulverized by ball mills for 24 hours. Next, polyvinyl butyral was added as a binder and the results granulated.

The powders after granulation were press formed into disk shapes of a diameter of 13 mm and a thickness of 2 mm by a pressure of 2 tons/cm². The shaped articles were sintered at 1000 to 1300° C. for 1 hour to prepare sintered bodies. Note that the sintering temperature at this time was the temperature giving the greatest density by 1 hour of sintering selected from 1000° C. to 1300° C. Further, at this time, the sintered bodies were densified to a relative density of at least 98%.

Next, the two surfaces of the sintered bodies after sintering were cylindrically polished, then the two surfaces of the disk samples were provided with metal electrodes by sputtering. Further, a DC voltage of 1 to 5 kV/mm was supplied between the electrodes for 10 minutes in 100° C. silicone oil to give polarization in the thickness direction and produce the piezoelectric ceramic compositions.

In this way, seven types of piezoelectric ceramic compositions (Samples E1 to E7) were prepared. The ratios of the materials and additives in the samples are shown in Table 15.

These samples were prepared by external addition of each additive as described above.

Note that as a method different from the method of production of these examples, it is also possible to fabricate piezoelectric ceramic compositions similar to the Samples E1 to E7 by fabricating a compound of the above $\{Li_{0.04}(K_{0.5}Na_{0.5})_{0.96}\}(Nb_{0.86}Ta_{0.1}Sb_{0.04})O_3$ by sintering, pulverizing this, mixing the result with the above additives, then calcining, granulating, shaping, and sintering the results in the same way as the method of production of the present examples.

Further, in Samples E1 to E7 of these examples, the $PdO_2$, $Ag_2O$, Au, $RuO_2$, $Re_2O_7$, $IrO_2$, or $PtO_2$ of the additives may be contained in the grains or at the grain boundaries of the piezoelectric ceramic compositions in part in their inherent form or in the form of compounds such as perovskite structure compounds with at least one of the basic composition elements lithium, sodium, potassium, niobium, tantalum, and antimony and may be contained in part in a state with the palladium, silver, gold, ruthenium, rhodium, rhenium, osmium, iridium, and platinum, atoms substituting at least part of the lithium, potassium, sodium, niobium, tantalum, and antimony of the compound of the above $\{Li_{0.04}(K_{0.5}Na_{0.5})_{0.96}\}(Nb_{0.86}Ta_{0.1}Sb_{0.04})O_3$. In particular, metal elements which can become +1 or +2 values such as silver, palladium, and gold easily substitute at least part of the lithium, potassium, and sodium of the compound. Further, metal elements which can become +3 to +6 values such as palladium, ruthenium, rhodium, rhenium, osmium, iridium, and platinum easily substitute at least part of the niobium, tantalum, and antimony of the compound.

Next, in these examples, to clarify the superior properties of the piezoelectric ceramic compositions, comparisons (Sample C1 and Sample C2) were fabricated in the following way. First, as materials of the comparisons, at least 99% purity high purity $Li_2CO_3$, $Na_2CO_3$, $K_2CO_3$, $Nb_2O_5$, $Ta_2O_4$, and $Sb_2O_5$ were prepared.

Among these materials, the $K_2CO_3$, $Na_2CO_3$, and $Nb_2O_5$ were mixed by a stoichiometric ratio giving the above general formula $\{Li_x(K_{1-y}Na_y)_{1-x}\}(Nb_{1-z-w}Ta_zSb_w)O_3$ wherein x=z=w=0 and y=0.5, that is, a stoichiometric ratio giving the above general formula $(K_{0.5}Na_{0.5})NbO_3$, then mixed by a ball mill in acetone for 24 hours to obtain a mixture. This mixture was calcined, granulated, shaped, sintered, and polarized in the same way as in Samples E1 to E7 to obtain a piezoelectric ceramic composition as a comparison (Comparison C1). The Sample C1 was a piezoelectric ceramic composition containing $(K_{0.5}Na_{0.5})NbO_3$.

Next, the Sample C2 was fabricated as follows: First, the $Li_2CO_3$, $Na_2CO_3$, $K_2CO_3$, $Nb_2O_5$, $Ta_2O_5$, and $Sb_2O_5$ of the above prepared materials were mixed by a stoichiometric ratio giving the above general formula $\{Li_x(K_{1-y}Na_y)_{1-x}\}(Nb_{1-z-w}Ta_zSb_w)O_3$ wherein x=0.04, y=0.5, z=0.1, and w=0.04 after sintering, that is, a stoichiometric ratio giving the above general formula $\{Li_{0.04}(K_{0.5}Na_{0.5})_{0.96}\}Nb_{0.86}Ta_{0.1}Sb_{0.04})O_3$, then mixed by a ball mill in acetone for 24 hours to obtain a mixture. This mixture was calcined, granulated, shaped, sintered, and polarized in the same way as in Samples E1 to E7 to obtain a piezoelectric ceramic composition as a comparison (Comparison C2). The Sample C2, in the same way as the Samples E1 to E7, was a piezoelectric ceramic composition which contained $\{Li_{0.04}(K_{0.5}Na_{0.5})_{0.96}\}(Nb_{0.86}Ta_{0.1}Sb_{0.04})O_3$ as a main ingredient, but did not contain the above added elements.

The compositions of the Sample C1 and Sample C2 are shown in Table 15.

TABLE 15

| | Composition ratio of sample | | | | Additive | | Added element | |
|---|---|---|---|---|---|---|---|---|
| | x | y | z | w | Comp. | Am't (mol) | Type | Am't added (mol) |
| Sample E1 | 0.04 | 0.5 | 0.1 | 0.4 | $RuO_2$ | 0.01 | Ru | 0.01 |
| Sample E2 | 0.04 | 0.5 | 0.1 | 0.4 | $PdO_2$ | 0.01 | Pd | 0.01 |
| Sample E3 | 0.04 | 0.5 | 0.1 | 0.4 | $Ag_2O$ | 0.005 | Ag | 0.01 |
| Sample E4 | 0.04 | 0.5 | 0.1 | 0.4 | $Re_2O_7$ | 0.005 | Re | 0.01 |
| Sample E5 | 0.04 | 0.5 | 0.1 | 0.4 | $IrO_2$ | 0.01 | Ir | 0.01 |
| Sample E6 | 0.04 | 0.5 | 0.1 | 0.4 | $PtO_2$ | 0.01 | Pt | 0.01 |
| Sample E7 | 0.04 | 0.5 | 0.1 | 0.4 | Au | 0.01 | Au | 0.01 |
| Sample C1 | 0 | 0.5 | 0 | 0 | — | 0 | — | — |
| Sample C2 | 0.04 | 0.5 | 0.1 | 0.4 | — | 0 | — | — |

Next, the Samples E1 to E7 and Samples C1 and C2 were measured for the piezoelectric $d_{31}$ constant, electromechanical coupling coefficient Kp, piezoelectric $g_{31}$ constant, relative dielectric constant $\epsilon_{33\tau}/\epsilon_0$, dielectric loss tan δ, and Curie temperature Tc. The piezoelectric $d_{31}$ constant, piezoelectric $g_{31}$ constant, and electromechanical coupling coefficient Kp were measured by the resonance-antiresonance method using an impedance analyzer (Precision Impedance Analyzer 4294A made by Agilent Co.) The dielectric loss tan δ and relative dielectric constant $\epsilon_{33\tau}/\epsilon_0$ were measured at a measurement frequency of 1 kHz using an impedance analyzer the same as the above. For the Curie temperature Tc, the temperature giving the highest relative dielectric constant $\epsilon_{33\tau}/\epsilon_0$ was made the Curie temperature Tc. The results are shown in Table 16.

TABLE 16

| | $d_{31}$ (pm/V) | Kp | $g_{31}$ (× $10^{-3}$ Vm/N) | $\epsilon_{33\tau}/\epsilon_0$ | tan δ | Tc (° C.) |
|---|---|---|---|---|---|---|
| Sample E1 | 102.6 | 0.494 | 7.96 | 1457 | 0.015 | 315 |
| Sample E2 | 122.4 | 0.531 | 8.74 | 1583 | 0.019 | 309 |
| Sample E3 | 99.2 | 0.466 | 7.63 | 1467 | 0.023 | 300 |
| Sample E4 | 89.4 | 0.436 | 7.51 | 1344 | 0.021 | 312 |
| Sample E5 | 85.7 | 0.438 | 7.30 | 1326 | 0.016 | 313 |
| Sample E6 | 111.9 | 0.512 | 8.32 | 1519 | 0.022 | 313 |
| Sample E7 | 110.7 | 0.498 | 8.94 | 1399 | 0.019 | 305 |
| Sample C1 | 37.6 | 0.334 | 9.9 | 429 | 0.036 | 415 |
| Sample C2 | 96.1 | 0.452 | 7.81 | 1389 | 0.026 | 308 |

As will be understood from Table 16, the Samples E1 to E7 had superior properties compared with the conventional piezoelectric ceramic composition of the Sample C1 in the piezoelectric $d_{31}$ constant, electromechanical coupling coefficient Kp, relative dielectric constant $\epsilon_{33\tau}/\epsilon_0$, and dielectric loss tan δ. Further, the Samples E1 to E7 had equal or better properties even compared with the Sample C2 in the piezoelectric $d_{31}$ constant, electromechanical coupling coefficient Kp, piezoelectric $g_{31}$ constant, relative dielectric constant $\epsilon_{33\tau}/\epsilon_0$, dielectric loss tan δ, and Curie temperature Tc. In particular, for the piezoelectric $d_{31}$ constant, electromechanical coupling coefficient Kp, and relative dielectric constant $\epsilon_{33\tau}/\epsilon_0$, almost all of the Samples E1 to E7 were superior to the Sample C1 and the Sample C2, while for the dielectric loss tan δ, all of the Samples E1 to E7 were superior to the Sample C1 and Sample C2.

Here, taking note of the piezoelectric $d_{31}$ constant, as will be understood from Table 16, the piezoelectric $d_{31}$ constant of the Sample E2 exhibited the highest value of 122.4 pm/V.

When using the composition as a charge detection type circuit or a current detection type circuit, in general the piezoelectric $d_{31}$ constant is proportional to the output voltage of an accelerator sensor, weight sensor, impact sensor, knock sensor, and other piezoelectric type sensors. Seen from this point, it is possible to prepare a sensor with a charge sensor output larger the higher the piezoelectric $d_{31}$ constant of the piezoelectric ceramic composition. Further, to fabricate a sensor having properties equal to or better than Sample C1, it can be said to be preferable to have a piezoelectric $d_{31}$ constant of at least 30 pm/V. Further, to fabricate a high sensitivity sensor raised in the signal-to-noise ratio (SN ratio) and output voltage, the piezoelectric $d_{31}$ constant should be at least 80 pm/V. More preferably it should be at least 100 pm/V.

Further, when using the composition as an actuator, in general the piezoelectric $d_{31}$ constant is proportional to the generated distortion or displacement of the piezoelectric actuator. Seen from this point, it is possible to produce an actuator with a larger generated distortion or displacement the higher the piezoelectric $d_{31}$ constant of the piezoelectric ceramic composition. Further, to fabricate an actuator having properties equal to or better than the comparison, it can be said preferable to have a piezoelectric $d_{31}$ constant of at least 30 pmV. More preferably it should be at least 40 pm/V. Further, to fabricate an actuator with a large displacement, the piezoelectric $d_{31}$ constant should be at least 80 pm/V. More preferably, it should be at least 100 pm/V.

Further, taking note of the electromechanical coupling coefficient Kp, as will be understood from Table 16, the electromechanical coupling coefficient Kp of Sample E2 exhibits its highest value of 0.531.

In general, the electromechanical coupling coefficient Kp is proportional to the electromechanical energy conversion efficiency of the piezoelectric transformer, ultrasonic motor, actuator, ultrasonic vibrator, etc. Seen from this viewpoint, it is possible to produce a piezoelectric transformer, ultrasonic motor, actuator, ultrasonic vibrator, etc. having a higher electromechanical energy conversion efficiency the higher the electromechanical coupling coefficient Kp of the piezoelectric ceramic composition. Further, to fabricate a piezoelectric transformer, ultrasonic motor, actuator, ultrasonic vibrator, etc. having properties equal to or better than the comparison Sample C1, it can be said to be preferable to have an electromechanical coupling coefficient Kp of at least 0.3. More preferably, it should be at least 0.34. Still more preferably, it should be at least 0.4. Most preferably, it should be at least 0.5.

Taking note of the Curie temperature Tc, the Curie temperatures Tc of Samples E1 to E7 are all high values of at least 200° C. Therefore, the piezoelectric ceramic compositions of the present examples (Samples E1 to E7) can be utilized as knock sensors or other high temperature sensor components, actuator components, ultrasonic motor components, etc. able to be used stably over a long period at high temperature locations such as near an automobile engine.

For further long-term stable use as a high temperature sensor component, actuator component, ultrasonic motor component, etc., the Curie temperature Tc is preferably at least 200° C. More preferably it should be at least 250° C.

Taking note of the piezoelectric $g_{31}$ constant, as will be understood from Table 16, the piezoelectric $g_{31}$ constant of Sample E7 exhibits its highest value at $8.94 \times 10^{-3}$ Vm/N.

The piezoelectric $g_{31}$ constant, like the piezoelectric $d_{31}$ constant, is proportional to the output voltage of a piezoelectric sensor, piezoelectric element, ultrasonic motor, etc. Therefore, it is possible to produce a sensor with a larger voltage sensor output the higher the piezoelectric $g_{31}$ constant of the piezoelectric ceramic composition. Further, to fabricate a sensor having properties equal to or better than the Comparison 1, it can be said to be preferable to have a piezoelectric $g_{31}$ constant of at least $7 \times 10^{-3}$ Vm/N. More preferably, it should be at least $8 \times 10^{-3}$ Vm/N.

Taking note of the relative dielectric constant $\in_{33T}/\in_0$, the relative dielectric constants $\in_{33T}/\in_0$ of the Samples E1 to E7 are extremely high values of at least 1300.

The relative dielectric constant $\in_{33T}/\in_0$ is generally proportional to the electrostatic capacity of a multilayer capacitor or other capacitor. Seen from this point, it is possible to produce a capacitor with a larger electrostatic capacity the higher the relative dielectric constant of the piezoelectric ceramic composition. To fabricate a capacitor, it can be said to be preferable to have a relative dielectric constant of at least 400. More preferably, it should be at least 430. Still more preferably, it should be at least 600.

Taking note of the dielectric loss tan $\in$, the dielectric losses tan $\delta$ of the Samples E1 to E7 are extremely low values of not more than 0.23.

The dielectric loss is proportional to the heat energy lost by a capacitor component or other capacitor, piezoelectric ultrasonic motor, piezoelectric actuator, piezoelectric transformer, or other component when applying an AC voltage to that component. Seen from this point, it is possible to fabricate a capacitor with a smaller energy loss or a piezoelectric ultrasonic motor, piezoelectric actuator, or piezoelectric transformer with a smaller heat generation the smaller the dielectric loss of the piezoelectric ceramic composition. Further, to fabricate a component with a small dielectric loss, it is preferable to have a dielectric loss of not more than 0.09. More preferably, it should be not more than 0.035. Still more preferably, it should be not more than 0.025.

As explained above, the piezoelectric ceramic compositions (Sample E1 to Sample E7) of the present examples are of compositions not containing lead and have superior piezoelectric properties and dielectric properties. Therefore, they are safe to the environment and can be utilized for high performance piezoelectric elements and dielectric elements.

EXAMPLE GROUP III

These examples are of compounds of the above general formula $\{Li_x(K_{1-y}Na_y)_{1-x}\}(Nb_{1-z-w}Ta_zSb_w)O_3$ containing different amounts of $Ag_2O$ as additives in order to determine the critical range of content of the additive.

First, as the materials of the piezoelectric ceramic composition, over 99% purity high purity $Li_2CO_3$, $Na_2CO_2$, $K_2CO_3$, $Nb_2O_5$, $Ta_2O_5$, and $Sb_2O_5$ and, as the additive, $Ag_2O$ were prepared.

Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving a general formula $\{Li_w(K_{1-y}Na_y)_{1-x}\}(Nb_{1-z-w}Ta_zSb_w)O_3$ where x, y, z, and w are x=0.04, y=0.5, z=0.1, and w=0.06, then the $Ag_2O$ serving as the additive was mixed n different amounts to obtain 16 types of formulations.

Regarding the amounts of incorporation of the $Ag_2O$, the $Ag_2O$ of the additive was included in amounts of 0.0005 mol to 0.25 mol with respect to 1 mol of the compound $\{Li_{0.04}(K_{0.5}Na_{0.5})_{0.96}\}(Nb_{0.86}Ta_{0.1}Sb0.06)O_3$, expected to be obtained by formulation by the above stoichiometric ratio and sintering. That is, 0.001 to 0.5 mol of the silver was incorporated.

The formulations were mixed by ball mills in acetone for 24 hours to fabricate mixtures.

Next, in the same way as Sample E1 to Sample E7 of the Example Group II, the mixtures were calcined, granulated, shaped, sintered, and polarized to prepare 16 types of piezoelectric ceramic compositions. These were used as Sample X1 to Sample X16. The ratios of the materials and additive in the samples are shown in Table 17.

Further, in Samples X1 to X16 obtained here, the $Ag_2O$ of the additive may be contained in the grains or at the grain boundaries of the piezoelectric ceramic compositions in part in its inherent form or in the form of compounds such as perovskite structure compounds with at least one of the basic composition elements lithium, sodium, potassium, niobium, tantalum, and antimony and may be contained in part in a state with the silver in the $Ag_2O$ substituting at least part of the lithium, potassium, and sodium of the $\{Li_{0.04}(K_{0.5}Na_{0.5})_{0.96}\}(Nb_{0.86}Ta_{0.1}Sb_{0.04})O_3$. In particular, when the amount added of the $Ag_2O$ exceeds 0.1 mol with respect to 1 mol of the compound of the above $\{Li_{0.04}(K_{0.5}Na_{0.5})_{0.96}\}(Nb_{0.86}Ta_{0.1}Sb_{0.04})O_3$, that is, when the content of the metal element silver exceeds 0.2 mol, the $Ag_2O$ of the additive easily precipitates in the form of silver and or $Ag_2O$ or a compound containing silver at the grain boundaries of the piezoelectric ceramic compositions.

In these examples, to clarify the effects of the incorporation of Ag, samples were prepared by substitutional addition that part of $(K_{0.5}Na_{0.5})$ is substituted by Ag. For example, sample X8 had a composition of $\{Li_{0.04}(K_{0.5}Na_{0.5})_{0.86}Ag_{0.10}\}(Nb_{0.84}Ta_{0.1}Sb_{0.06})O_3$.

Next, in these examples, to clarify the effects of the incorporation of $Ag_2O$, a sample not containing $Ag_2O$ as an additive was prepared.

Specifically, first, at least 99% purity high purity $Li_2CO_3$, $Na_2CO_3$, $K_2CO_3$, $Nb_2O_5$, $Ta_2O_4$, and $Sb_2O_5$ were prepared. These materials were mixed by a stoichiometric ratio giving a compound of $\{Li_{0.04}(K_{0.5}Na_{0.5})_{0.96}\}(Nb0.84Ta_{0.1}Sb0.06)O_3$, then mixed by a ball mill in acetone for 24 hours to obtain a mixture. This mixture was calcined, granulated, shaped, sintered, and polarized in the same way as in Samples E1 to E7 of the examples of the Invention II obtain a piezoelectric ceramic composition (Sample Y1). The composition of the Sample Y1 is shown in Table 17.

TABLE 17

| Sample | Composition ratio of sample | | | | Additive Comp. | Am't added (mol) | Added element Type | Am't added (mol) |
|---|---|---|---|---|---|---|---|---|
| | x | y | z | w | | | | |
| Sample X1 | 0.04 | 0.5 | 0.1 | 0.6 | $Ag_2O$ | 0.0005 | Ag | 0.001 |
| Sample X2 | 0.04 | 0.5 | 0.1 | 0.6 | $Ag_2O$ | 0.0015 | Ag | 0.003 |
| Sample X3 | 0.04 | 0.5 | 0.1 | 0.6 | $Ag_2O$ | 0.0025 | Ag | 0.005 |
| Sample X4 | 0.04 | 0.5 | 0.1 | 0.6 | $Ag_2O$ | 0.005 | Ag | 0.01 |
| Sample X5 | 0.04 | 0.5 | 0.1 | 0.6 | $Ag_2O$ | 0.01 | Ag | 0.02 |
| Sample X6 | 0.04 | 0.5 | 0.1 | 0.6 | $Ag_2O$ | 0.02 | Ag | 0.04 |
| Sample X7 | 0.04 | 0.5 | 0.1 | 0.6 | $Ag_2O$ | 0.04 | Ag | 0.08 |
| Sample X8 | 0.04 | 0.5 | 0.1 | 0.6 | $Ag_2O$ | 0.05 | Ag | 0.01 |
| Sample X9 | 0.04 | 0.5 | 0.1 | 0.6 | $Ag_2O$ | 0.075 | Ag | 0.15 |
| Sample X10 | 0.04 | 0.5 | 0.1 | 0.6 | $Ag_2O$ | 0.1 | Ag | 0.2 |
| Sample X11 | 0.04 | 0.5 | 0.1 | 0.6 | $Ag_2O$ | 0.125 | Ag | 0.25 |
| Sample X12 | 0.04 | 0.5 | 0.1 | 0.6 | $Ag_2O$ | 0.15 | Ag | 0.3 |
| Sample X13 | 0.04 | 0.5 | 0.1 | 0.6 | $Ag_2O$ | 0.175 | Ag | 0.36 |
| Sample X14 | 0.04 | 0.5 | 0.1 | 0.6 | $Ag_2O$ | 0.2 | Ag | 0.4 |
| Sample X15 | 0.04 | 0.5 | 0.1 | 0.6 | $Ag_2O$ | 0.225 | Ag | 0.45 |
| Sample X16 | 0.04 | 0.5 | 0.1 | 0.6 | $Ag_2O$ | 0.25 | Ag | 0.5 |
| Sample Y1 | 0.04 | 0.5 | 0.1 | 0.6 | — | 0 | | 0 |

Next, the Samples X1 to X16 and Sample Y1 were measured for the piezoelectric $d_{31}$ constant, electromechanical coupling coefficient Kp, piezoelectric $g_{31}$ constant, relative dielectric constant $\epsilon_{33T}/\epsilon_0$, dielectric loss tan δ, and Curie temperature Tc in the same way as in the examples of the Invention II. The results are shown in Table 18. Note that Table 18 also shows the results of Sample C1 prepared in the examples of the Invention II for comparison.

TABLE 18

| | $d_{31}$ (pm/V) | Kp | $g_{31}$ (× $10^{-3}$ Vm/N) | $\epsilon_{33T}/\epsilon_0$ | tan δ | Tc (° C.) |
|---|---|---|---|---|---|---|
| Sample X1 | 117.2 | 0.495 | 7.19 | 1845.2 | 0.023 | 271 |
| Sample X2 | 118.3 | 0.495 | 7.22 | 1849.2 | 0.021 | 271 |
| Sample X3 | 119.5 | 0.498 | 7.20 | 1860.0 | 0.018 | 269 |
| Sample X4 | 120.4 | 0.503 | 7.19 | 1891.2 | 0.016 | 266 |
| Sample X5 | 119.1 | 0.496 | 6.97 | 1894.7 | 0.017 | 263 |
| Sample X6 | 118.7 | 0.494 | 6.81 | 1891.5 | 0.018 | 257 |
| Sample X7 | 118.4 | 0.492 | 6.43 | 1995.1 | 0.018 | 247 |
| Sample X8 | 117.2 | 0.482 | 6.35 | 1978.9 | 0.019 | 238 |
| Sample X9 | 116.1 | 0.450 | 6.00 | 2183.6 | 0.020 | 227 |
| Sample X10 | 101.6 | 0.396 | 5.07 | 2262.1 | 0.022 | 213 |
| Sample X11 | 51.8 | 0.301 | 2.89 | 2024.5 | 0.032 | 198 |
| Sample X12 | 34.1 | 0.255 | 1.39 | 1451.2 | 0.035 | 185 |
| Sample X13 | 22.3 | 0.220 | 1.01 | 1218.0 | 0.037 | 170 |
| Sample X14 | 12.3 | 0.150 | 0.65 | 857.1 | 0.039 | 155 |
| Sample X15 | 8.9 | 0.100 | 0.60 | 841.0 | 0.039 | 140 |
| Sample X16 | 5.6 | 0.050 | 0.55 | 824.8 | 0.040 | 125 |
| Sample C1 | 37.6 | 0.334 | 9.9 | 429 | 0.036 | 415 |
| Sample Y1 | 114.9 | 0.494 | 7.05 | 1840.8 | 0.027 | 269 |

As will be understood from Table 18, the Samples X1 to X9 had a higher piezoelectric $d_{31}$ constant and relative dielectric constant $\epsilon_{33T}/\epsilon_0$ than the Sample Y1 and Sample C1. Further, the dielectric losses tan δ were also smaller than the Sample Y1 and Sample C1 and therefore superior.

That is, as will be understood from Table 17 and Table 18, when the amount of the $Ag_2O$ added as an additive is 0.001 mol to 0.15 mol in content of the added element silver with respect to 1 mol of the compound of the above general formula, the piezoelectric ceramic composition is particularly superior in the piezoelectric $d_{31}$ constant, relative dielectric constant $\epsilon_{33T}/\epsilon_0$, and dielectric loss tan δ.

Further, as will be understood from Table 18, the Samples X1 to X9 exhibited superior properties of about the same extent as the Sample Y1 in the electromechanical coupling coefficient Kp, $pg_{31}c$, and Curie temperature Tc as well.

On the other hand, in the case of Samples X10 to X16, that is, when the amounts of $Ag_2O$ of the additive is over 0.15 mol in terms of content of the added element silver, values lower than even the Sample Y1 were exhibited in all properties such as the piezoelectric $d_{31}$ constant and also the electromechanical coupling coefficient Kp, piezoelectric $g_{31}$ constant, relative dielectric constant $\epsilon_{33T}/\epsilon_0$ dielectric loss tan δ, and Curie temperature Tc.

In this way, according to the present examples, it is found that when the content of the added element is 0.001 mol to 0.15 mol, the properties of the piezoelectric ceramic composition are improved the most remarkably. Note that while not shown in the table, the same effects as in these examples were obtained for the other metal elements as well.

According to our findings, the additives can effectively enhance piezoelectric properties etc. either by substitutional addition or external addition, while not shown in the present examples. Further, the same effect as in these examples were obtained for the other piezoelectric ceramic compositions containing other main ingredients compounds.

EXAMPLE GROUP IV

Next, the piezoelectric ceramic compositions of Example Group IV will be explained. In these examples, piezoelectric ceramic compositions were produced and measured in physical properties. The piezoelectric ceramic compositions of these examples were piezoelectric ceramic compositions containing as main ingredients compounds of a general formula $\{Li_x(K_{1-y}Na_y)_{1-x}\}(Nb_{1-z-w}Ta_zSb_w)O_3$ where x, y, z, and w were in the ranges of $0 \leq x \leq 0.2$, $0 \leq y \leq 1$, $0 < z \leq 0.4$, and $0 < w \leq 0.2$. The piezoelectric ceramic compositions included added elements of at least one metal element selected from nickel, iron, manganese, copper, and zinc. Further, the total of the contents of the added elements was from 0.001 mol to 0.08 mol with respect to 1 mol of the compound of the above general formula.

The method of production of the piezoelectric ceramic compositions of these examples comprises mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$, mixing an additive containing at least one metal element selected from nickel, iron, manganese, copper, and zinc, and sintering the result.

Next, the method of production of the piezoelectric ceramic compositions of these examples will be explained in more detail.

First, as the materials of the piezoelectric ceramic compositions, over 99% purity high purity $Li_2CO_3$, $Na_2CO_3$, $K_2CO_3$, $Nb_2O_5$, $Ta_2O_5$, and $Sb_2O_5$ and, as the additive, NiO, $Fe_2O_3$, $Mn_2O_5$, $Cu_2O$, and ZnO were prepared.

Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving a general formula $\{Li_x(K_{1-y}Na_y)_{1-x}\}(Nb_{1-z-w}Ta_zSb_w)O_3$ where x, y, z, and w are x=0.04, y=0.5, z=0.1, and w=0.04, that is, a stoichiometric ratio whereby the general formula becomes $\{Li_{0.04}(K_{0.5}Na_{0.5})_{0.96}\}(Nb_{0.86}Ta_{0.1}Sb_{0.04})O_3$, then the NiO, $Fe_2O_3$, $Mn_2O_5$, $Cu_2O$, and ZnO serving as the additives were mixed to obtain five types of formulations.

Regarding the amounts of incorporation of these additives, the NiO, $Fe_2O_3$, $Mn_2O_5$, $Cu_2O$, and ZnO of the additives were included in amounts of 0.01 mol, 0.005 mol, 0.005 mol, 0.005 mol, and 0.01 mol, respectively, with respect to 1 mol of the compound $\{Li_{0.04}(K_{0.5}Na_{0.5})_{0.96}\}(Nb_{0.86}Ta_{0.1}Sb_{0.04})O_3$ expected to be obtained by formulation by the above stoichiometric ratio. That is, 0.01 mol of the metal element included in each additive was incorporated.

The formulations were kneaded by ball mills in acetone for 24 hours to fabricate mixtures.

Next, the mixtures were calcined at 750° C. for 5 hours, then the calcined mixtures was pulverized by ball mills for 24 hours. Next, polyvinyl butyral was added as a binder and the results granulated.

The powders after granulation were press formed into disk shapes of a diameter of 13 mm and a thickness of 2 mm by a pressure of 2 tons/cm². The shaped articles were sintered at 1000 to 1300° C. for 1 hour to prepare sintered bodies. Note that the sintering temperature at this time was the temperature giving the greatest density by 1 hour of sintering selected from 1000° C. to 1300° C. Further, at this time, the sintered bodies were densified to a relative density of at least 98%.

Next, the two surfaces of the sintered bodies after sintering were cylindrically polished, then the two surfaces of the disk samples were provided with metal electrodes by sputtering. Further, a DC voltage of 1 to 5 kV/mm was supplied between the electrodes for 10 minutes in 100° C. silicone oil to give polarization in the thickness direction and produce the piezoelectric ceramic compositions.

In this way, five types of piezoelectric ceramic compositions (Samples D1 to D5) were prepared. The ratios of the materials and additives in the samples are shown in Table 19.

These samples were prepared by external addition of each additive as described above.

Note that as a method different from the method of production of these examples, it is also possible to fabricate piezoelectric ceramic compositions similar to the Samples D1 to D5 by fabricating a compound of the above $\{Li_{0.04}(K_{0.5}Na_{0.5})_{0.96}\}(Nb_{0.86}Ta_{0.1}Sb_{0.04})O_3$ by sintering, pulverizing this, mixing the result with the above additives, then calcining, granulating, shaping, and sintering the results in the same way as the method of production of the present examples.

Further, in Samples D1 to D5 of these examples, the NiO, $Fe_2O_3$, $Mn_2O_5$, $Cu_2O$, and ZnO of the additives may be contained in the grains or at the grain boundaries of the piezoelectric ceramic compositions in part in their inherent form or in the form of compounds such as perovskite structure compounds with at least one of the basic composition elements lithium, sodium, potassium, niobium, tantalum, and antimony and may be contained in part in a state with the nickel, iron, manganese, copper, and zinc atoms substituting at least part of the lithium, potassium, sodium, niobium, tantalum, and antimony of the compound of the above $\{Li_{0.04}(K_{0.5}Na_{0.5})_{0.96}\}(Nb_{0.86}Ta_{0.1}Sb_{0.04})O_3$. In particular, metal elements which can become +1 or +2 values such as copper, nickel, iron, and zinc easily substitute at least part of the lithium, potassium, and sodium of the compound. Further, metal elements which can become +3 to +6 values such as iron and manganese easily substitute at least part of the niobium, tantalum, and antimony of the compound.

Next, in these examples, to clarify the superior properties of the piezoelectric ceramic compositions, comparisons (Sample C1 and Sample C2) were fabricated in the same way as in Example Group II. The compositions of the Sample C1 and Sample C2 are shown in Table 19.

TABLE 19

| | Composition ratio of sample | | | | Additive | | Added element | |
|---|---|---|---|---|---|---|---|---|
| | x | y | z | w | Comp. | Am't added (mol) | Type | Am't added (mol) |
| Sample D1 | 0.04 | 0.5 | 0.1 | 0.4 | $Fe_2O_3$ | 0.005 | Fe | 0.01 |
| Sample D2 | 0.04 | 0.5 | 0.1 | 0.4 | NiO | 0.01 | Ni | 0.01 |
| Sample D3 | 0.04 | 0.5 | 0.1 | 0.4 | $Mn_2O_5$ | 0.005 | Mn | 0.01 |
| Sample D4 | 0.04 | 0.5 | 0.1 | 0.4 | ZnO | 0.01 | Zn | 0.01 |
| Sample D5 | 0.04 | 0.5 | 0.1 | 0.4 | $Cu_2O$ | 0.005 | Cu | 0.01 |
| Sample C1 | 0 | 0.5 | 0 | 0 | — | 0 | — | 0 |
| Sample C2 | 0.04 | 0.5 | 0.1 | 0.4 | — | 0 | — | 0 |

Next, the Samples D1 to D5 and Samples C1 and C2 were measured for the piezoelectric $d_{31}$ constant, electromechanical coupling coefficient Kp, piezoelectric $g_{31}$ constant, mechanical quality factor Qm, relative dielectric constant $\epsilon_{33T}/\epsilon_0$, dielectric loss tan δ, and Curie temperature Tc. The piezoelectric $d_{31}$ constant, piezoelectric $g_{31}$ constant, electromechanical coupling coefficient Kp, and mechanical quality factor Qm were measured by the resonance-antiresonance method using an impedance analyzer (Precision Impedance Analyzer 4294A made by Agilent Co.) The dielectric loss tan δ and relative dielectric constant $\epsilon_{33T}/\epsilon_0$ were measured at a measurement frequency of 1 kHz using an impedance analyzer the same as the above. For the Curie temperature Tc, the temperature giving the highest relative dielectric constant $\epsilon_{33T}/\epsilon_0$ was made the Curie temperature Tc. The results are shown in Table 20.

TABLE 20

| | $d_{31}$ (pm/V) | Kp | $g_{31}$ (× $10^{-3}$ Vm/N) | Qm | $\epsilon_{33T}/\epsilon_0$ | tanδ | TC (° C.) |
|---|---|---|---|---|---|---|---|
| Sample D1 | 100.5 | 0.484 | 8.06 | 56.4 | 1408.1 | 0.022 | 299 |
| Sample D2 | 98.6 | 0.496 | 8.63 | 94.6 | 1290.4 | 0.018 | 312 |
| Sample D3 | 86.5 | 0.424 | 6.99 | 67.5 | 1398.3 | 0.019 | 311 |
| Sample D4 | 79.3 | 0.429 | 7.61 | 56.7 | 1176.7 | 0.020 | 311 |
| Sample D5 | 72.7 | 0.419 | 7.82 | 136.5 | 1049.3 | 0.007 | 301 |
| Sample C1 | 37.6 | 0.334 | 9.9 | 100.6 | 329 | 0.036 | 415 |
| Sample C2 | 96.1 | 0.452 | 7.81 | 48.4 | 1389.3 | 0.026 | 308 |

As will be understood from Table 20, the Samples D1 to D5 had superior properties compared with the conventional piezoelectric ceramic composition of the Sample C1 in the piezoelectric $d_{31}$ constant, electromechanical coupling coefficient Kp, mechanical quality factor Qm, relative dielectric constant $\epsilon_{33T}/\epsilon_0$, and dielectric loss tan δ. Further, the Samples D1 to D5 had equal or better properties even compared with the Sample C2 in the piezoelectric $d_{31}$ constant, electromechanical coupling coefficient Kp, piezoelectric $g_{31}$ constant, mechanical quality factor Qm, relative dielectric constant $\epsilon_{33T}/\epsilon_0$, dielectric loss tan δ, and Curie temperature Tc. Further, as will be understood from Table 20, the Samples D1 to D5 had high mechanical quality factors Qm of at least 50 while maintaining high piezoelectric $d_{31}$ constants of at least 70 pm/V and therefore were superior in both the piezoelectric $d_{31}$ constant and the mechanical quality factor Qm. Therefore, the Sample D1 to Sample D5 can be used as high performance piezoelectric elements.

Here, taking note of the piezoelectric $d_{31}$ constant, as will be understood from Table 20, the piezoelectric $d_{31}$ constant of the Sample D1 exhibited the highest value of 100.5 pm/V.

When using the composition as a charge detection type circuit or a current detection type circuit, in general the piezoelectric $d_{31}$ constant is proportional to the output voltage of an accelerator sensor, weight sensor, impact sensor, knock sensor, and other piezoelectric type sensors. Seen from this point, it is possible to prepare a sensor with a charge sensor output larger the higher the piezoelectric $d_{31}$ constant of the piezoelectric ceramic composition. Further, to fabricate a sensor having properties equal to or better than Sample C1, it can be said to be preferable to have a piezoelectric $d_{31}$ constant of at least 30 pm/V. Further, to fabricate a high sensitivity sensor raised in the signal-to-noise ratio (SN ratio) and output voltage, the piezoelectric $d_{31}$ constant should be at least 80 pm/V. More preferably it should be at least 100 pm/V.

Further, when using the composition as an actuator, in general the piezoelectric $d_{31}$ constant is proportional to the generated distortion or displacement of the piezoelectric actuator. Seen from this point, it is possible to produce an actuator with a larger generated distortion or displacement the higher the piezoelectric $d_{31}$ constant of the piezoelectric ceramic composition. Further, to fabricate an actuator having properties equal to or better than the comparison, it can be said preferable to have a piezoelectric $d_{31}$ constant of at least 30 pmV. More preferably it should be at least 40 pm/V. Further, to fabricate an actuator with a large displacement, the piezoelectric $d_{31}$ constant should be at least 80 pm/V. More preferably, it should be at least 100 pm/V.

Further, taking note of the electromechanical coupling coefficient Kp, as will be understood from Table 20, the electromechanical coupling coefficient Kp of Sample D2 exhibits its highest value of 0.496.

In general, the electromechanical coupling coefficient Kp is proportional to the electromechanical energy conversion efficiency of the piezoelectric transformer, ultrasonic motor, actuator, ultrasonic vibrator, etc. Seen from this viewpoint, it is possible to produce a piezoelectric transformer, ultrasonic motor, actuator, ultrasonic vibrator, etc. having a higher electromechanical energy conversion efficiency the higher the electromechanical coupling coefficient Kp of the piezoelectric ceramic composition. Further, to fabricate a piezoelectric transformer, ultrasonic motor, actuator, ultrasonic vibrator, etc. having properties equal to or better than the comparison Sample C1, it can be said to be preferable to have an electromechanical coupling coefficient Kp of at least 0.3. More preferably, it should be at least 0.34. Still more preferably, it should be at least 0.4. Most preferably, it should be at least 0.45.

Taking note of the mechanical quality factor Qm, as will be understood from Table 20, the mechanical quality factor Qm of Sample D5 exhibited the highest value of 136.5.

Taking note of the Curie temperature Tc, the Curie temperatures TC of Samples D1 to D5 are all high values of at least 200° C. Therefore, the piezoelectric ceramic compositions of the present examples (Samples D1 to D5) can be utilized as knock sensors or other high temperature sensors, actuators, ultrasonic motors, etc. able to be used stably over a long period at high temperature locations such as near an automobile engine.

For further long-term stable use as a high temperature sensor, actuator, ultrasonic motor, etc., the Curie temperature Tc is preferably at least 200° C. More preferably it should be at least 250° C.

Taking note of the piezoelectric $g_{31}$ constant, as will be understood from Table 20, the piezoelectric $g_{31}$ constant of Sample D2 exhibits its highest value at 8.63×$10^{-3}$ Vm/N.

The piezoelectric $g_{31}$ constant, like the piezoelectric $d_{31}$ constant, is proportional to the output voltage of a piezoelectric sensor, piezoelectric element, ultrasonic motor, etc. Therefore, it is possible to produce a sensor with a larger voltage sensor output the higher the piezoelectric $g_{31}$ constant of the piezoelectric ceramic composition. Further, to fabricate a sensor having properties equal to or better than the comparison, it can be said to be preferable to have a piezoelectric $g_{31}$ constant of at least $7 \times 10^{-3}$ Vm/N. More preferably, it should be at least $8 \times 10^{-3}$ Vm/N.

Taking note of the relative dielectric constant $\in_{33T}/\in_0$, the relative dielectric constants $\in_{33T}/\in_0$ of the Samples D1 to D5 are extremely high values of at least 1000.

The relative dielectric constant $\in_{33T}/\in_0$ is generally proportional to the electrostatic capacity of a multilayer capacitor or other capacitor. Seen from this point, it is possible to produce a capacitor with a larger electrostatic capacity the higher the relative dielectric constant of the piezoelectric ceramic composition. To fabricate a capacitor, it can be said to be preferable to have a relative dielectric constant of at least 400. More preferably, it should be at least 430. Still more preferably, it should be at least 600.

Taking note of the dielectric loss tan δ, the dielectric losses tan δ of the Samples D1 to D5 are extremely low values of not more than 0.22.

The dielectric loss is proportional to the heat energy lost by a capacitor component or other capacitor, piezoelectric ultrasonic motor, piezoelectric actuator, piezoelectric transformer, or other component when applying an AC voltage to that component. Seen from this point, it is possible to fabricate a capacitor with a smaller energy loss or a piezoelectric ultrasonic motor, piezoelectric actuator, or piezoelectric transformer with a smaller heat generation the smaller the dielectric loss of the piezoelectric ceramic composition. Further, to fabricate a component with a small dielectric loss, it is preferable to have a dielectric loss of not more than 0.09. More preferably, it should be not more than 0.035. Still more preferably, it should be not more than 0.025.

As explained above, the piezoelectric ceramic compositions (Sample D1 to Sample D5) of the present examples are of compositions not containing lead and have superior piezoelectric properties and dielectric properties. Therefore, they are safe to the environment and can be utilized for high performance piezoelectric elements and dielectric elements.

Further, the piezoelectric ceramic compositions of these examples, as explained above, are particularly superior in the mechanical quality factor Qm. Therefore, the piezoelectric ceramic compositions are particularly suitable for piezoelectric actuators, ultrasonic motors, piezoelectric transformers, piezoelectric vibrators, etc. with little heat generation.

EXAMPLE GROUP V

These examples are of compounds of the above general formula $\{Li_x(K_{1-y}Na_y)_{1-x}\}(Nb_{1-z-w}Ta_zSb_w)O_3$ containing different amounts of NiO as additives in order to determine the critical range of content of the additive.

First, as the materials of the piezoelectric ceramic composition, over 99% purity high purity $Li_2CO_3$, $Na_2CO_3$, $K_2CO_3$, $Nb_2O_5$, $Ta_2O_5$, and $Sb_2O_5$ and, as the additive, NiO were prepared.

Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving a general formula $\{Li_x(K_{1-y}Na_y)_{1-x}\}(Nb_{1-z-w}Ta_zSb_w)O_3$ where x, y, z, and w are x=0.04, y=0.5, z=0.1, and w=0.06, then the NiO serving as the additive was mixed in different amounts to obtain five types of formulations.

Regarding the amounts of incorporation of the NiO, the NiO of the additive was included in amounts of 0.001 mol to 0.08 mol with respect to 1 mol of the compound $\{Li_{0.04}(K_{0.5}Na_{0.5})_{0.96}\}(Nb_{0.86}Ta_{0.1}Sb_{0.04})O_3$ expected to be obtained by formulation by the above stoichiometric ratio. At this time, the amount of Ni of the added element was 0.001 to 0.08 mol.

The formulations were kneaded by ball mills in acetone for 24 hours to fabricate mixtures.

Next, in the same way as Sample D1 to Sample D5 of the Example Group IV, the mixtures were calcined, granulated, shaped, sintered, and polarized to prepare five types of piezoelectric ceramic compositions. These were used as Sample G1 to Sample G5. The ratios of the materials and additive in the samples are shown in Table 21.

In these examples, to clarify the effects of the incorporation of Ni, samples were prepared by external addition to main ingredients compounds.

Further, in Samples G1 to G5 obtained here, the NiO of the additive may be contained in the grains or at the grain boundaries of the piezoelectric ceramic compositions in part in its inherent form or in the form of compounds such as perovskite structure compounds with at least one of the basic composition elements lithium, sodium, potassium, niobium, tantalum, and antimony and may be contained in part in a state with the nickel in the NiO substituting at least part of the lithium, potassium, and sodium of the $\{Li_{0.04}(K_{0.5}Na_{0.5})_{0.96}\}(Nb_{0.86}Ta_{0.1}Sb_{0.04})O_2$. In particular, when the amount added of the Ni as the added element included in the additive NiO exceeds 2 mol with respect to 1 mol of the compound of the above $\{Li_{0.04}(K_{0.5}Na_{0.5})_{0.96}\}(Nb_{0.86}Ta_{0.1}Sb_{0.04})O_3$, the NiO of the additive easily precipitates in the form of nickel and or NiO or a compound containing nickel at the grain boundaries of the piezoelectric ceramic compositions.

Next, in these examples, to clarify the effects of the incorporation of NiO, a sample not containing NiO as an additive was prepared.

Specifically, first, at least 99% purity high purity $Li_2CO_3$, $Na_2CO_3$, $K_2CO_3$, $Nb_2O_5$, $Ta_2O_4$, and $Sb_2O_5$ were prepared. These materials were mixed by a stoichiometric ratio giving a compound of $\{Li_{0.04}(K_{0.5}Na_{0.5})_{0.96}\}(Nb0.84Ta_{0.1}Sb_{0.04})O_3$ then mixed by a ball mill in acetone for 24 hours to obtain a mixture. This mixture was calcined, granulated, shaped, sintered, and polarized in the same way as in Samples D1 to D5 of the Example Group IV to obtain a piezoelectric ceramic composition (Sample P1). The composition of the Sample P1 is shown in Table 21.

TABLE 21

| | Composition ratio of sample | | | | Additive | | Added element | |
|---|---|---|---|---|---|---|---|---|
| | | | | | | Am't added | | Am't added |
| Sample no. | x | y | z | w | Comp. | (mol) | Type | (mol) |
| Sample G1 | 0.04 | 0.5 | 0.1 | 0.4 | NiO | 0.001 | Ni | 0.001 |
| Sample G2 | 0.04 | 0.5 | 0.1 | 0.4 | NiO | 0.01 | Ni | 0.01 |
| Sample G3 | 0.04 | 0.5 | 0.1 | 0.4 | NiO | 0.02 | Ni | 0.02 |
| Sample G4 | 0.04 | 0.5 | 0.1 | 0.4 | NiO | 0.04 | Ni | 0.04 |
| Sample G5 | 0.04 | 0.5 | 0.1 | 0.4 | NiO | 0.08 | Ni | 0.08 |
| Sample P1 | 0.04 | 0.5 | 0.1 | 0.4 | — | 0 | — | 0 |

Next, the Samples G1 to G5 and Sample P1 were measured for the piezoelectric $d_{31}$ constant, electromechanical coupling coefficient Kp, piezoelectric $g_{31}$ constant, mechanical quality factor Qm, relative dielectric constant $\in_{33T}/\in_0$, dielectric loss tan δ, and Curie temperature Tc in the same way as in Example Group I. The results are shown in Table 22. Note that Table 22 also shows the results of Sample C1 prepared in Example Group IV for comparison.

TABLE 22

|  | $d_{31}$ (pm/V) | Kp | $g_{31}$ (× $10^{-3}$ Vm/N) | Qm | $\in_{33T}/\in_0$ | tanδ | Tc (° C.) |
|---|---|---|---|---|---|---|---|
| Sample G1 | 97.2 | 0.487 | 7.91 | 65.2 | 1392.3 | 0.022 | 309 |
| Sample G2 | 98.8 | 0.489 | 8.42 | 78.8 | 1266.5 | 0.021 | 312 |
| Sample G3 | 100.5 | 0.489 | 8.11 | 75.3 | 1399.5 | 0.019 | 319 |
| Sample G4 | 97.6 | 0.472 | 7.73 | 78.4 | 1411.5 | 0.020 | 322 |
| Sample G5 | 94.7 | 0.462 | 7.65 | 93.3 | 1398.5 | 0.019 | 325 |
| Sample C1 | 37.6 | 0.334 | 9.9 | 100.6 | 429 | 0.036 | 415 |
| Sample P1 | 96.1 | 0.452 | 7.81 | 48.4 | 1389.3 | 0.026 | 308 |

As will be understood from Table 22, the Samples G1 to G5 had a superior piezoelectric $d_{31}$ constant, electromechanical coupling coefficient Kp, piezoelectric $g_{31}$ constant, mechanical quality factor Qm, relative dielectric constant $\in_{33T}/\in_0$, dielectric loss tan δ, and Curie temperature Tc equal or better than the Sample C1 and Sample P1. In particular, the mechanical quality factor Qm was greatly improved in each of the Samples G1 to G5 compared with the Sample P1 not containing NiO as an additive.

As will be understood from Table 21 and Table 22, when the amount of the NiO added as an additive is 0.001 mol to 0.08 mol in content of the added element nickel with respect to 1 mol of the compound of the above general formula, the piezoelectric ceramic composition is particularly superior in the piezoelectric properties and dielectric properties. Note that while not shown in the tables, the same effects as in these examples were obtained for the other metal elements as well.

According to our findings, the additives can effectively enhance piezoelectric properties etc. either by substitutional addition or external addition, while not shown in the present examples. Further, the same effect as in these examples were obtained for the other piezoelectric ceramic compositions containing other main ingredients compounds.

EXAMPLE GROUP VI

Next, the piezoelectric ceramic compositions of Example Group VI will be explained. In these examples, the above piezoelectric ceramic compositions were produced and measured in physical properties. The piezoelectric ceramic compositions of these examples were piezoelectric ceramic compositions containing as main ingredients compounds of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$. The piezoelectric ceramic compositions included added elements of at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium. Further, the total of the contents of the added elements was 0.01 mol with respect to 1 mol of the compound of the above general formula. Further, the open porosity of the piezoelectric ceramic compositions was not more than 0.4 vol %.

The method of production of the piezoelectric ceramic compositions of these examples comprises mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$, mixing an additive containing at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium, and sintering the result.

Next, the method of production of the piezoelectric ceramic compositions of these examples will be explained in more detail.

First, as the materials of the piezoelectric ceramic compositions, over 99% purity high purity $Li_2CO_3$, $Na_2CO_3$, $K_2CO_3$, $Nb_2O_5$, $Ta_2O_5$, and $Sb_2O_5$ ZnO were prepared.

Next, these materials and at least one compound of $Ag_2O$, $Al_2O_3$, Au, $Au_2O_3$, $B_2O_3$, $H_3BO_3$, BaO, $BaO_2$, $BaCO_3$, $Bi_2O_3$, CaO, $CaCO_3$, $CeO_2$, $Ce_2(CO_3)_3$, CoO, $Co_3O_4$, $CoCO_3$, $Cs_2CO_3$, CuO, $Cu_2O$, $Dy_2O_3$, $Er_2O_3$, $Eu_2O_3$, $Fe_2O_3$, $Ga_2O_3$, $Gd_2O_3$, $GeO_2$, $HfO_2$, $Ho_2O_3$, $In_2O_3$, $IrO_2$, $Ir_2O_3$, $La_2O_3$, $Lu_2O_3$, MgO, $MgC_2O_4$, MnO, $MnO_2$, $Mn_2O_3$, $Mn_3O_4$, $Nd_2O_3$, $Nd_2CO_3$, NiO, $NiCO_3$, PdO, $Pr_2O_3$, $Pr_6O_{11}$, $Pr_2(CO_3)_3$, PtO$_2$, $Rb_2O$, $Rb_2CO_3$, $Re_2O_7$, $RuO_2$, $Sc_2O_3$, $SiO_2$, SiO, SiC, $Sm_2O_3$, SnO, $SnO_2$, SrO, $SrCO_3$, $Tb_4O_7$, TiO, $Ti_2O_3$, $TiO_2$, $Tm_2O_3$, $V_2O_3$, $V_2O_4$, $V_2O_5$, $Y_2O_3$, $Y_2(CO_3)_3$, $Yb_2O_3$, ZnO, and $ZrO_2$ were mixed by compositions of the compound $\{Li_{0.04}(K_{0.5}Na_{0.5})_{0.96}\}(Nb_{0.86}Ta_{0.1}Sb_{0.04})O_3$ containing the metal elements included in the above additives in the piezoelectric ceramic compositions to obtain 47 types of formulations. The elements added may be present in the crystal grains of the piezoelectric ceramic compositions or at the crystal grain boundaries.

Regarding the amounts of incorporation of these additives, the the additives were included in the amounts shown in Table 23 and Table 24 with respect to 1 mol of the compound $\{Li_{0.04}(K_{0.5}Na_{0.5})_{0.96}\}(Nb_{0.86}Ta_{0.1}Sb_{0.04})O_3$ expected to be obtained by formulation by the above stoichiometric ratio and sintering. At this time, the contents of the additives were set so that the amounts of the metal elements included in the additives became 0.01 mol no matter which of the additives included in.

The formulations were mixed by ball mills in acetone for 24 hours to fabricate mixtures.

Next, the mixtures were calcined at 750° C. for 5 hours, then the calcined mixtures was pulverized by ball mills for 24 hours. Next, polyvinyl butyral was added as a binder and the results granulated.

The powders after granulation were press formed into disk shapes of a diameter of 13 mm and a thickness of 2 mm by a pressure of 2 tons/cm². The shaped articles were sintered at 1000 to 1300° C. for 1 hour to prepare sintered bodies. Note that the sintering temperature at this time was the temperature giving the greatest density by 1 hour of sintering selected from 1000° C. to 1300° C. Further, at this time, the sintered bodies were densified to a relative density of at least 98%.

Next, the two surfaces of the sintered bodies after sintering were cylindrically polished, then the two surfaces of the disk samples were provided with metal electrodes by sputtering. Further, a DC voltage of 1 to 5 kV/mm was supplied between the electrodes for 10 minutes in 100° C. silicone oil to give polarization in the thickness direction and produce the piezoelectric ceramic compositions.

In this way, 47 types of piezoelectric ceramic compositions (Samples H1 to H47) were prepared. The ratios of the materials and additives in the samples are shown in Table 23 and Table 24.

Note that as a method different from the method of production of these examples, it is also possible to fabricate piezoelectric ceramic compositions similar to the Samples H1 to H47 by fabricating a compound of the above $\{Li_{0.04}(K_{0.5}Na_{0.5})_{0.96}\}(Nb_{0.86}Ta_{0.1}Sb_{0.04})O_3$ by sintering, pulverizing this, mixing the result with the above additives, then calcining, granulating, shaping, and sintering the results in the same way as the method of production of the present examples.

Next, in these examples, to clarify the superior properties of the piezoelectric ceramic compositions (Samples H1 to H47), three types of comparisons (Sample Q1 to Sample Q3) were fabricated as follows:

First, as materials of the comparisons, at least 99% purity high purity $Li_2CO_3$, $Na_2CO_3$, $K_2CO_3$, $Nb_2O_5$, $Ta_2O_5$, $Sb_2O_5$, $MoO_3$, and $WO_3$ were prepared. Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving the general formula $\{Li_{0.04}(K_{0.5}Na_{0.5})_{0.96}\}(Nb_{0.86}Ta_{0.1}Sb_{0.04})O_3$ to obtain a formulation.

The formulation was mixed by a ball mill in acetone for 24 hours, then, in the same way as Samples H1 to H47, was calcined, granulated, shaped, sintered, and polarized to obtain a piezoelectric ceramic composition for comparison (Sample Q1). This Sample Q1 was a piezoelectric ceramic composition not containing any of the above added elements.

Further, formulations obtained by mixing the ingredients by a stoichiometric ratio to give the above $\{Li_{0.04}(K_{0.5}Na_{0.5})_{0.96}\}(Nb_{0.86}Ta_{0.1}Sb_{0.04})O_3$ had $MoO_3$ or $WO_3$ added to them as additives to prepare two types of formulations. The amounts of the additives added at that time were as shown in Table 24.

Next, these formulations were mixed by ball mills in acetone for 24 hours, then, in the same way as Samples H1 to H47, were calcined, granulated, shaped, sintered, and polarized to obtain piezoelectric ceramic compositions for comparison (Sample Q2 and Sample Q3). The Sample Q2 and Sample Q3 were compounds containing 0.01 mol of the $MoO_3$ and $WO_3$ in terms of metal elements with respect to 1 mol of the $\{Li_{0.04}(K_{0.5}Na_{0.5})_{0.96}\}(Nb_{0.86}Ta_{0.1}Sb_{0.04})O_3$.

Next, the apparent densities and the open porosities of the Samples H1 to H47 and the Samples Q1 to Q3 were measured. The results are shown in Table 23 and Table 24.

Note that the open porosity was measured by the following method:

(Open Porosity)

First, the weight of the sample was measured and this figure used as the dry weight. Next, the sample was completely immersed in water, bubbles were removed by vacuum, and the sample was made to sufficiently absorb water. The sample was weighed in the state with the sample immersed In water by the Archimedes method and this figure used as the weight in water. Next, the sample was pulled out from the water, the excess water was removed, then the weight of the sample was again measured. This figure was used as the weight containing water.

Next, the open porosity (vol %) of the sample was calculated from the thus obtained dry weight, weight in water, and weight containing water using the following equation (1):

$$\text{Open porosity (vol \%)} = \frac{\text{(weight containing water} - \text{dry weight)}}{\text{(weight containing water} - \text{weight in water)}} \quad (1)$$

TABLE 23

| | Additive | | Added element | | Apparent density ρ after sintering (g/cm3) | Open porosity Pop (vol %) |
|---|---|---|---|---|---|---|
| | Comp. | Am't added (mol) | Type | Content (mol) | | |
| Sample H1 | $Ag_2O$ | 0.005 | Ag | 0.01 | 4.752 | 0.077 |
| Sample H2 | $Al_2O_3$ | 0.005 | Al | 0.01 | 4.729 | 0.380 |
| Sample H3 | Au | 0.01 | Au | 0.01 | 4.587 | 0.000 |
| Sample H4 | $B_2O_3$ | 0.005 | B | 0.01 | 4.719 | 0.076 |
| Sample H5 | BaO | 0.01 | Ba | 0.01 | 4.730 | 0.076 |
| Sample H6 | $Bi_2O_3$ | 0.005 | Bi | 0.01 | 4.799 | 0.231 |
| Sample H7 | CaO | 0.01 | Ca | 0.01 | 4.680 | 0.075 |
| Sample H8 | $CeO_2$ | 0.005 | Ce | 0.01 | 4.767 | 0.385 |
| Sample H9 | CoO | 0.01 | Co | 0.01 | 4.750 | 0.078 |
| Sample H10 | $Cs_2CO_3$ | 0.005 | Cs | 0.01 | 7.726 | 0.384 |
| Sample H11 | CuO | 0.01 | Cu | 0.01 | 4.722 | 0.076 |
| Sample H12 | $Dy_2O_3$ | 0.005 | Dy | 0.01 | 4.770 | 0.000 |
| Sample H13 | $Er_2O_3$ | 0.005 | Er | 0.01 | 4.767 | 0.000 |
| Sample H14 | $Eu_2O_3$ | 0.005 | Eu | 0.01 | 4.747 | 0.230 |
| Sample H15 | $Fe_2O_3$ | 0.005 | Fe | 0.01 | 4.774 | 0.156 |
| Sample H16 | $Ga_2O_4$ | 0.005 | Ga | 0.01 | 4.721 | 0.076 |
| Sample H17 | $Gd_2O_3$ | 0.005 | Gd | 0.01 | 4.773 | 0.077 |
| Sample H18 | $GeO_2$ | 0.01 | Ge | 0.01 | 4.705 | 0.151 |
| Sample H19 | $HfO_2$ | 0.01 | Hf | 0.01 | 4.757 | 0.077 |
| Sample H20 | $Ho_2O_3$ | 0.005 | Ho | 0.01 | 4.776 | 0.077 |
| Sample H21 | $In_2O_3$ | 0.005 | In | 0.01 | 4.710 | 0.000 |
| Sample H22 | $IrO_2$ | 0.01 | Ir | 0.01 | 4.757 | 0.248 |
| Sample H23 | $La_2O_3$ | 0.005 | La | 0.01 | 4.766 | 0.380 |
| Sample H24 | $Lu_2O_3$ | 0.005 | Lu | 0.01 | 4.751 | 0.000 |
| Sample H25 | MgO | 0.01 | Mg | 0.01 | 4.731 | 0.378 |
| Sample H26 | MnO | 0.01 | Mn | 0.01 | 4.729 | 0.153 |
| Sample H27 | $Nd_2O_3$ | 0.005 | Nd | 0.01 | 4.749 | 0.154 |
| Sample H28 | NiO | 0.01 | Ni | 0.01 | 4.737 | 0.077 |

TABLE 24

| | Additive | | Added element | | Apparent density ρ after sintering (g/cm3) | Open porosity Pop (vol %) |
|---|---|---|---|---|---|---|
| | Comp. | Am't added (mol) | Type | Content (mol) | | |
| Sample H29 | PdO | 0.01 | Pd | 0.01 | 4.720 | 0.077 |
| Sample H30 | $Pr_2O_3$ | 0.005 | Pr | 0.01 | 4.805 | 0.078 |
| Sample H31 | $PtO_2$ | 0.01 | Pt | 0.01 | 4.774 | 0.166 |
| Sample H32 | $Rb_2O$ | 0.005 | Rb | 0.01 | 4.730 | 0.000 |
| Sample H33 | $Re_2O_7$ | 0.005 | Re | 0.01 | 4.664 | 0.152 |
| Sample H34 | $RuO_2$ | 0.01 | Ru | 0.01 | 4.758 | 0.153 |
| Sample H35 | $Sc_2O_3$ | 0.005 | Sc | 0.01 | 4.731 | 0.076 |
| Sample H36 | $SiO_2$ | 0.01 | Si | 0.01 | 4.721 | 0.000 |
| Sample H37 | $Sm_2O_3$ | 0.005 | Sm | 0.01 | 4.709 | 0.000 |
| Sample H38 | $SnO_2$ | 0.01 | Sn | 0.01 | 4.741 | 0.000 |
| Sample H39 | $SrCO_3$ | 0.01 | Sr | 0.01 | 4.501 | 1.004 |
| Sample H40 | $Tb_4O_7$ | 0.0025 | Tb | 0.01 | 4.752 | 0.000 |
| Sample H41 | $TiO_2$ | 0.01 | Ti | 0.01 | 4.691 | 0.000 |
| Sample H42 | $Tm_2O_3$ | 0.005 | Tm | 0.01 | 4.778 | 0.077 |
| Sample H43 | $V_2O_2$ | 0.01 | V | 0.01 | 4.696 | 0.000 |

TABLE 24-continued

| | Additive | | | Apparent density ρ after sintering (g/cm3) | Open porosity Pop (vol %) |
|---|---|---|---|---|---|
| | Comp. | Am't added (mol) | Added element Type | Content (mol) | |
| Sample H44 | $Y_2O_3$ | 0.005 | Y | 0.01 | 4.767 | 0.000 |
| Sample H45 | $Yb_2O_3$ | 0.005 | Yb | 0.01 | 4.769 | 0.155 |
| Sample H46 | ZnO | 0.01 | Zn | 0.01 | 4.751 | 0.308 |
| Sample H47 | $ZrO_2$ | 0.01 | Zr | 0.01 | 4.744 | 0.076 |
| Sample Q1 | — | — | — | — | 4.617 | 0.408 |
| Sample Q2 | $MoO_3$ | 0.01 | Mo | 0.01 | 4.458 | 4.969 |
| Sample Q3 | $WO_3$ | 0.01 | W | 0.01 | 4.500 | 3.258 |

As will be understood from Table 23 and Table 24, the piezoelectric ceramic compositions of Samples H1 to H47 exhibited equal or higher apparent densities compared with Sample Q1 to Sample Q3 provided as comparisons and exhibited low values of open porosities of not more than 0.4 vol %.

In this way, it is learned that the piezoelectric ceramic compositions of Samples H1 to H47 are superior in mechanical strength.

Further, while not shown in Table 23 and Table 24, the piezoelectric properties and dielectric properties of the Samples H1 to H47 were measured by the resonance-antiresonance method using an impedance analyzer, whereupon it was found that the piezoelectric ceramic compositions of Samples H1 to H47 were superior in the piezoelectric $d_{31}$ constant, electromechanical coupling coefficient Kp, piezoelectric $g_{31}$ constant, mechanical quality factor Qm, relative dielectric constant, dielectric loss, Curie temperature, and other piezoelectric properties and dielectric properties.

Therefore, the piezoelectric ceramic compositions of these examples are superior in mechanical strength and can be utilizes as high performance piezoelectric elements and dielectric elements.

EXAMPLE GROUP VII

In these examples, samples of the general formula $\{Li_x(K_{1-y}Na_y)_{1-x}\}(Nb_{1-z-w}Ta_zSb_w)O_3$ (where $0 \leq x \leq 0.2$, $0 \leq y \leq 1$, $0 < z \leq 0.4$, $0 < w \leq 0.2$) containing additives in a state with at least part of the lithium, potassium, sodium, niobium, tantalum, and antimony substituted by the metal elements in the additives (hereinafter called "suitably substituted samples") and samples containing the additives by external addition (hereinafter called "suitably externally added samples") were prepared and their properties were compared.

First, as the externally added samples, the Sample H1, Sample H5, Sample H7, Sample H10, Sample H25, Sample H32, and Sample H39 prepared in Example Group VI were prepared. These Sample H1, Sample H5, Sample H7, Sample H10, Sample H25, Sample H32, and Sample H39 were obtained by externally adding to the compound $\{Li_{0.4}(K_{0.5}Na_{0.5})_{0.96}\}Nb_{0.86}Ta_{0.1}Sb_{0.04}O_3$ as additives, $Ag_2O$, BaO, $CaCO_3$, $Cs_2CO_2$, MgO, $Rb_2O$, or $SrCO_3$.

Next, the samples with the above additives added by substitution were prepared in the following way.

First, as the materials of the basic composition of the piezoelectric ceramic compositions, at least 99% purity high purity $Li_2CO_3$, $Na_2CO_3$, $K_2CO_3$, $Nb_2O_5$, $Ta_2O_5$, $Sb_2O_5$, and the above additives $Ag_2O$, BaO, $CaCO_3$, $Cs_2CO_3$, MgO, $Rb_2O$, or $SrCO_3$ were prepared.

Next, the materials of the basic composition and one type of the above additive were blended by a stoichiometric ratio giving the compound $\{Li_{0.04}(K_{0.5}Na_{0.5})_{0.96}\}(Nb_{0.86}Ta_{0.1}Sb_{0.04})O_3$ in which the metal element in the additive is present in solid solution by substitution after sintering to thereby prepare seven types of formulations. Specifically, these became $\{Li_{0.04}(K_{0.5}Na_{0.5})_{0.95}Ag_{0.01}\}(Nb_{0.86}Ta_{0.1}Sb_{0.04})O_3$, $\{Li_{0.04}(K_{0.5}Na_{0.5})_{0.94}Ba_{0.01}\}(Nb_{0.86}Ta_{0.1}Sb_{0.04})O_3$, $\{Li_{0.04}(K_{0.5}Na_{0.5})_{0.94}Ca_{0.01}\}(Nb_{0.86}Ta_{0.1}Sb_{0.04})O_3$, $\{Li_{0.04}(K_{0.5}Na_{0.5})_{0.95}Cs_{0.02}\}(Nb_{0.86}Ta_{0.1}Sb_{0.04})O_3$, $\{Li_{0.04}(K_{0.5}Na_{0.5})_{0.95}Mg_{0.01}\}(Nb_{0.86}Ta_{0.1}Sb_{0.04})O_3$, $\{Li_{0.04}(K_{0.5}Na_{0.5})_{0.95}Rb_{0.01}\}(Nb_{0.86}Ta_{0.1}Sb_{0.04})O_3$, and $\{Li_{0.04}(K_{0.5}Na_{0.5})_{0.94}Sr_{0.01}\}(Nb_{0.86}Ta_{0.1}Sb_{0.04})O_3$.

Next, these formulations were mixed by ball mills in acetone for 24 hours to obtain mixtures.

Next, these mixtures were calcined, granulated, shaped, sintered, and polarized in the same way as Samples H1 to H47 of the Example Group VI.

In this way, piezoelectric ceramic compositions having the additives $Ag_2O$, BaO, $CaCO_3$, $Cs_2CO_3$, MgO, $Rb_2O$, and $SrCO_3$ added by substitution were prepared. These were used as the Samples H1a, H5a, H7a, H10a, H25a, H32a, and H39a.

Sample H1 and Sample H1a, Sample H5 and Sample H5a, Sample H7 and Sample H7a, Sample H10 and Sample H10a, Sample H25 and Sample H25a, and Sample H32 and Sample H32a were piezoelectric ceramic compositions containing additives including the same metal elements with—the former being samples obtained by external addition and the latter being samples obtained by substitution.

Next, the samples were measured for apparent density and open porosity. The results are shown in Table 25. Table 25 also shows the apparent density and open porosity of the Sample Q1 prepared in Example Group VI for comparison.

TABLE 25

| | Additive | Added element | Apparent density ρ after sintering (g/cm3) | Open porosity Pop (vol %) |
|---|---|---|---|---|
| Sample H1 | $Ag_2O$ | Ag | 4.752 | 0.077 |
| Sample H1a | $Ag_2O$ | Ag | 4.748 | 0.075 |
| Sample H5 | BaO | Ba | 4.730 | 0.076 |
| Sample H5a | BaO | Ba | 4.752 | 0.075 |
| Sample H7 | $CaCO_3$ | Ca | 4.680 | 0.075 |
| Sample H7a | $CaCO_3$ | Ca | 4.704 | 0.081 |
| Sample H10 | $Cs_2CO_3$ | Cs | 4.726 | 0.384 |
| Sample H10a | $Cs_2CO_3$ | Cs | 4.725 | 0.082 |
| Sample H25 | MgO | Mg | 4.731 | 0.378 |
| Sample H25a | MgO | Mg | 4.731 | 0.081 |
| Sample H32 | $Rb_2O$ | Rb | 4.730 | 0.000 |
| Sample H32a | $Rb_2O$ | Rb | 4.729 | 0.243 |
| Sample H39 | $Sr_2CO_3$ | Sr | 4.501 | 1.004 |
| Sample H39a | $Sr_2CO_3$ | Sr | 4.729 | 0.163 |
| Sample Q1 | — | — | 4.617 | 0.408 |

As will be understood from Table 25, Sample H1 and Sample H1a, Sample H5 and Sample H5a, Sample H7 and Sample H7a, Sample H10 and Sample H10a, Sample H25 and Sample H25a, and Sample H32 and Sample H32a exhibited apparent densities equal to or better than Sample Q1 and open porosities lower than Sample Q1.

From this, it is understood that the piezoelectric ceramic compositions of these examples are superior in apparent density and open porosity both when the additives are incorporated by external addition and incorporated by substitution.

Further, in the case of the Sample H41 and Sample H41a containing strontium, a high apparent density and low open porosity were obtained in the Sample H41a of the substitution composition.

EXAMPLE GROUP VIII

These examples are examples of piezoelectric ceramic compositions containing different amounts of an additive. First, as the materials of the basic composition of the piezoelectric ceramic compositions, over 99% purity high purity $Li_2CO_3$, $Na_2CO_3$, $K_2CO_3$, $Nb_2O_5$, $Ta_2O_5$, and $Sb_2O_5$ and, as the additive, $Bi_2O_3$ were prepared.

Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving a general formula $\{Li_x(K_{1-y}Na_y)_{1-x}\}(Nb_{1-z-w}Ta_zSb_w)O_3$ where x, y, z, and w are x=0.04, y=0.5, z=0.1, and w=0.06, then the $Bi_2O_3$ serving as the additive was mixed in different amounts to obtain formulations.

The additive $Bi_2O_3$ was added in amounts of 0.0025, 0.0005, and 0.00025 mol with respect to 1 mol of the compound $\{Li_{0.04}(K_{0.5}Na_{0.5})_{0.96}\}(Nb_{0.86}Ta_{0.1}Sb_{0.04})O_3$ expected to be obtained by formulation by the above stoichiometric ratio. That is, the metal element (bismuth) in the additive was included in amounts of 0.005, 0.001, and 0.0005 mol.

The formulations were mixed by ball mills in acetone for 24 hours to fabricate mixtures.

Next, in the same way as Sample H1 to Sample H47, the mixtures were calcined, granulated, shaped, sintered, and polarized to prepare three types of piezoelectric ceramic compositions (Sample H6x, Sample H6y, and Sample H6z). The types and amounts of the additive in the samples are shown in Table 26.

Next, the apparent densities and open porosities of the Sample H6x, Sample H6y, and Sample H6z were measured by the same method as in Example Group VI. The results are shown in Table 26.

Note that in Table 26, for comparison, the results of a Sample H6 prepared by the Example Group VI containing 0.01 mol of bismuth as the added element and a Sample Q1 not containing an added element are also shown.

TABLE 26

| | Additive | | | Apparent density ρ after sintering (g/cm3) | Open porosity Pop (vol %) |
|---|---|---|---|---|---|
| | Comp. | Am't added (mol) | Added element Type | Content (mol) | | |
| Sample H6 | $Bi_2O_3$ | 0.005 | Bi | 0.01 | 4.799 | 0.231 |
| Sample H6x | $Bi_2O_3$ | 0.0025 | Bi | 0.005 | 4.734 | 0.163 |
| Sample H6y | $Bi_2O_3$ | 0.0005 | Bi | 0.001 | 4.738 | 0.164 |
| Sample H6z | $Bi_2O_3$ | 0.00025 | Bi | 0.0005 | 4.757 | 0.246 |
| Sample Q1 | — | — | — | — | 4.617 | 0.408 |

As will be understood from Table 26, the Sample H6, Sample H6x, Sample H6y, and Sample H6z exhibited higher apparent densities and lower open porosities compared with the Sample Q1. That is, in the piezoelectric ceramic compositions of these examples, by including the above additive in the amounts of 0.0005 mol to 0.01 mol in terms of content of the metal element in the additive with respect to 1 mol of the compound $\{Li_{0.04}(K_{0.5}Na_{0.5})_{0.96}\}(Nb_{0.86}Ta_{0.5}Sb_{0.04})O_3$, it is possible to improve the apparent density and open porosity of the piezoelectric ceramic compositions.

Further, in general, if the open porosity is large, the porosity becomes larger. Therefore, by adding the additive as in the present examples, the ability to reduce the open porosity can be said to reduce the porosity as well.

EXAMPLE GROUP IX

Next, piezoelectric ceramic compositions of Example Group IX will be explained. In these examples, piezoelectric ceramic compositions were produced and measured in physical properties. The piezoelectric ceramic compositions of these examples were piezoelectric ceramic compositions containing as main ingredients compounds of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$. The piezoelectric ceramic compositions included added elements of at least one metal element selected from magnesium, calcium, strontium, and barium. Further, the total of the contents of the added elements was 0.01 mol with respect to 1 mol of the compound of the above general formula.

The above additive may be added to the above piezoelectric ceramic composition having the general formula by substitutional addition or external addition.

The method of production of the piezoelectric ceramic compositions of these examples comprises mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$, mixing an additive containing at least one metal element selected from magnesium, calcium, strontium, and barium, and sintering the result.

Next, the method of production of the piezoelectric ceramic compositions of these examples will be explained in more detail.

First, as the materials of the basic composition of the piezoelectric ceramic compositions, over 99% purity high purity $Li_2CO_3$, $Na_2CO_3$, $K_2CO_3$, $Nb_2O_5$, $Ta_2O_5$, and $Sb_2O_5$ and, as the additive, CaO, SrO, MgO, and BaO were prepared.

Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving a general formula $\{Li_x(L_{1-y}Na_y)_{1-x}\}(Nb_{1-z-w}Ta_zSb_w)O_3$ where x, y, z, and w are x=0.04, y=0.5, z=0.1, and w=0.04, that is, a stoichiometric ratio whereby the general formula becomes $\{Li_{0.04}(K_{0.5}Na_{0.5})_{0.96}\}(Nb_{0.86}Ta_{0.1}Sb_{0.04}))O_3$, then the CaO, SrO, MgO, and BaO serving as the additives were mixed to obtain eight types of formulations.

Regarding the amounts of incorporation of these additives, the CaO, SrO, MgO, and BaO of the additives were included in amounts of 0.01 mol and 0.005 mol each with respect to 1 mol of the compound $\{Li_{0.04}(K_{0.5}Na_{0.5})_{0.96}\}(Nb_{0.86}Ta_{0.1}Sb_{0.04}))O_3$ expected to be obtained by formulation by the above stoichiometric ratio. At this time, the amounts of the metal elements of the additives also became 0.01 mol and 0.005 mol.

Further, the CaO was also included 0.02 mol, 0.04 mol and 0.10 mol.

The formulations were kneaded by ball mills in acetone for 24 hours to fabricate mixtures.

Next, the mixtures were calcined at 750° C. for 5 hours, then the calcined mixtures was pulverized by ball mills for 24 hours. Next, polyvinyl butyral was added as a binder and the results granulated.

The powders after granulation were press formed into disk shapes of a diameter of 13 mm and a thickness of 2 mm by a pressure of 2 tons/cm². The shaped articles were sintered at 1000 to 1300° C. for 1 hour to prepare sintered bodies. Note that the sintering temperature at this time was the temperature giving the greatest density by 1 hour of sintering selected from 1000° C. to 1300° C. Further, at this time, the sintered bodies were densified to a relative density of at least 98%.

Next, the two surfaces of the sintered bodies after sintering were cylindrically polished, then the two surfaces of the disk samples were provided with metal electrodes by sputtering. Further, a DC voltage of 1 to 5 kV/mm was supplied between the electrodes for 10 minutes in 100° C. silicone oil to give polarization in the thickness direction and produce the piezoelectric ceramic compositions.

In this way, eight types of piezoelectric ceramic compositions (Samples J1 to J4, Samples F1 to F4 and Samples L1 to L3) were prepared. The ratios of the materials and additives in the samples are shown in Table 27.

These examples were prepared by substitutional addition that part of $(K_{0.5}Na_{0.5})$ is substituted by the metal element in the additives. For example, sample J1 had a composition of $\{Li_{0.04}(K_{0.5}Na_{0.5})_{0.94}Ca_{0.01}\}(Nb_{0.86}Ta_{0.1}Sb_{0.04})O_3$.

Note that as a method different from the method of production of these examples, it is also possible to fabricate piezoelectric ceramic compositions similar to the Samples J1 to J4, Samples F1 to F4, and Samples L1 to L3 by fabricating a compound of the above pulverizing this, mixing the result with the above additives, then calcining, granulating, shaping, and Sintering the results in the same way as the method of production of the present examples.

Further, in Samples J1 to J4, Samples F1 to F4 and Samples L1 to L3 of these examples, the CaO, SrO, MgO, and BaO of the additives may be contained in the grains or at the grain boundaries of the piezoelectric ceramic compositions in part as oxides or perovskite structure compounds or other compounds and may be contained in part in a state with the calcium, strontium, magnesium, and barium atoms substituting at least part of the lithium, potassium, and sodium of the compound of the above $\{Li_{0.04}(K_{0.5}Na_{0.5})_{0.96}\}(Nb_{0.86}Ta_{0.1}Sb_{0.04})O_3$.

Next, in these examples, to clarify the superior properties of the piezoelectric ceramic compositions, comparisons (Sample C1 and Sample C2) were fabricated in the following way. First, as materials of the comparisons, at least 99% purity high purity $Li_2CO_3$, $Na_2CO_3$, $K_2CO_3$, $Nb_2O_5$, $Ta_2O_4$, and $Sb_2O_5$ were prepared.

Among these materials, the $K_2CO_3$, $Na_2CO_3$, and $Nb_2O_5$ were mixed by a stoichiometric ratio giving the above general formula $\{Li_x(K_{1-y}Na_y)_{1-x}\}(Nb_{1-z-w}Ta_zSb_w)O_3$ wherein x=z=w=0 and y=0.5, that is, a stoichiometric ratio giving the above general formula $(K_{0.5}Na_{0.5})NbO_3$, then mixed by a ball mill in acetone for 24 hours to obtain a mixture This mixture was calcined, granulated, shaped, sintered, and polarized in the same way as in Samples J3 to J4, Samples F1 to F4 and Samples L1 to L3 to obtain a piezoelectric ceramic composition as a comparison (Sample C1). The Sample C1 was a piezoelectric ceramic composition containing $(K_{0.5}Na_{0.5})NbO_3$.

Next, the Sample C2 was fabricated as follows: First, the $Li_2CO_3$, $Na_2CO_3$, $K_2CO_3$, $Nb_2O_5$, $Ta_2O_5$, and $Sb_2O_5$ of the above prepared materials were mixed by a stoichiometric ratio giving the above general formula $\{Li_x(K_{1-y}Na_y)_{1-x}\}(Nb_{1-z-w}Ta_zSb_w)O_3$ wherein x=0.04, y=0.5, z=0.1, and w=0.04 after sintering, that is, a stoichiometric ratio giving the above general formula $\{Li_{0.04}(K_{0.5}Na_{0.5})_{0.96}\}Nb_{0.86}Ta_{0.1}Sb_{0.04})O_3$, then mixed by a ball mill in acetone for 24 hours to obtain a mixture. This mixture was calcined, granulated, shaped, sintered, and polarized in the same way as in Samples J1 to J4, Samples F1 to F4, and Samples L1 to L3 to obtain a piezoelectric ceramic composition as a comparison (Sample C2). The Sample C2, in the same way as the Samples J1 to J4, Samples F1 to F4, and Samples L1 to L3, was a piezoelectric ceramic composition which contained $\{Li_{0.04}(K_{0.5}Na_{0.5})_{0.96}\}(Nb_{0.86}Ta_{0.1}Sb_{0.04})O_3$ as a main ingredient, but did not contain the above added elements.

The compositions of the Sample C1 and Sample C2 are shown in Table 27.

TABLE 27

| | Composition ratio of sample | | | | Additive | | Added element | |
|---|---|---|---|---|---|---|---|---|
| | | | | | | Am't added | | Am't added |
| | x | y | z | w | Comp. | (mol) | Type | (mol) |
| Sample J1 | 0.04 | 0.5 | 0.1 | 0.4 | CaO | 0.01 | Ca | 0.01 |
| Sample J2 | 0.04 | 0.5 | 0.1 | 0.4 | SrO | 0.01 | Sr | 0.01 |
| Sample J3 | 0.04 | 0.5 | 0.1 | 0.4 | MgO | 0.01 | Mg | 0.01 |
| Sample J4 | 0.04 | 0.5 | 0.1 | 0.4 | BaO | 0.01 | Ba | 0.01 |
| Sample F1 | 0.04 | 0.5 | 0.1 | 0.4 | CaO | 0.005 | Ca | 0.005 |
| Sample F2 | 0.04 | 0.5 | 0.1 | 0.4 | SrO | 0.005 | Sr | 0.005 |
| Sample F3 | 0.04 | 0.5 | 0.1 | 0.4 | MgO | 0.005 | Mg | 0.005 |
| Sample F4 | 0.04 | 0.5 | 0.1 | 0.4 | BaO | 0.005 | Ba | 0.005 |
| Sample L1 | 0.04 | 0.5 | 0.1 | 0.04 | CaO | 0.02 | Ca | 0.02 |
| Sample L2 | 0.04 | 0.5 | 0.1 | 0.04 | CaO | 0.04 | Ca | 0.04 |
| Sample L3 | 0.04 | 0.5 | 0.1 | 0.04 | CaO | 0.1 | Ca | 0.1 |
| Sample C1 | 0 | 0.5 | 0 | 0 | — | — | — | 0 |
| Sample C2 | 0.04 | 0.5 | 0.1 | 0.4 | — | — | — | 0 |

Next, the Samples J1 to J4, Samples F1 to F4, Samples L1 to L3, and Samples C1 and C2 were measured for the piezoelectric $d_{31}$ constant, electromechanical coupling coefficient Kp, piezoelectric $g_{31}$ constant, mechanical quality factor Qm, relative dielectric constant $\epsilon_{33r}/\epsilon_0$, dielectric loss tan δ, and Curie temperature Tc. The piezoelectric $d_{31}$ constant, piezoelectric $g_{31}$ constant, electromechanical coupling coefficient Kp, and mechanical quality factor Qm were measured by the resonance-antiresonance method using an impedance analyzer (Precision Impedance Analyzer 4294A made by Agilent Co.) The dielectric loss tan δ and relative dielectric constant $\epsilon_{33r}/\epsilon_0$ were measured at a measurement frequency of 1 kHz using an impedance analyzer the same as the above. For the Curie temperature Tc, the temperature giving the highest relative dielectric constant $\epsilon_{33r}/\epsilon_0$ was made the Curie temperature Tc. The results are shown in Table 28.

TABLE 28

| | $d_{31}$ (pm/V) | Kp | $g_{31}$ (× 10⁻³ Vm/N) | Qm | $\epsilon_{33r}/\epsilon_0$ | tanδ | Tc (° C.) |
|---|---|---|---|---|---|---|---|
| Sample J1 | 106.3 | 0.484 | 7.63 | 41.8 | 1573.7 | 0.020 | 284 |
| Sample J2 | 102.1 | 0.480 | 7.57 | 38.3 | 1522.9 | 0.034 | 292 |
| Sample J3 | 97.9 | 0.467 | 8.11 | 59.4 | 1363.6 | 0.023 | 312 |
| Sample J4 | 95.3 | 0.449 | 7.18 | 45.9 | 1498.5 | 0.027 | 295 |
| Sample F1 | 110.6 | 0.500 | 7.86 | 49.1 | 1589.5 | 0.023 | 296 |
| Sample F2 | 121.0 | 0.551 | 8.81 | 25.2 | 1550.5 | 0.030 | 300 |
| Sample F3 | 85.9 | 0.432 | 7.30 | 47.9 | 1329.7 | 0.034 | 310 |
| Sample F4 | 104.5 | 0.485 | 7.67 | 46.9 | 1538.9 | 0.022 | 302 |

TABLE 28-continued

|  | $d_{31}$ (pm/V) | Kp | $g_{31}$ (× $10^{-3}$ Vm/N) | Qm | $\epsilon_{33T}/\epsilon_0$ | tanδ | Tc (° C.) |
|---|---|---|---|---|---|---|---|
| Sample L1 | 102.0 | 0.468 | 7.62 | 65.2 | 1557.9 | 0.021 | 272 |
| Sample L2 | 97.7 | 0.452 | 7.52 | 79.8 | 1542.1 | 0.019 | 260 |
| Sample L3 | 70.2 | 0.436 | 7.42 | 75.3 | 1526.3 | 0.02 | 236 |
| Sample C1 | 37.6 | 0.334 | 9.9 | 100.6 | 429 | 0.036 | 415 |
| Sample C2 | 96.1 | 0.452 | 7.81 | 48.4 | 1389.3 | 0.026 | 308 |

As will be understood from Table 28, the Samples J1 to J4, Samples F1 to F4, and Samples L1 to L3 were improved over Sample C1 in the piezoelectric $d_{31}$ constant, electromechanical coupling coefficient Kp, relative dielectric constant $\epsilon_{33T}/\epsilon_0$, and dielectric loss tan δ. Further, the Samples J1 to J4, Samples F1 to F4, and Samples L1 to L3 had equal or better properties even compared with the Sample C2 in at least one of the piezoelectric $d_{31}$ constant, electromechanical coupling coefficient Kp, piezoelectric $g_{31}$ constant, mechanical quality factor Qm, relative dielectric constant $\epsilon_{33T}/\epsilon_0$, dielectric loss tan δ, and Curie temperature Tc.

It was confirmed that the SrO, MgO, and BaO of the additives which were included in amounts of more than 0.01 mol (e.g. 0.10 mol) showed the same effect as that in CaO, while not shown in the present examples.

Here, taking note of the piezoelectric $d_{31}$ constant, as will be understood from Table 28, the piezoelectric $d_{31}$ constant of the Sample E2 exhibited the highest value of 121.0 pm/V.

When using the composition as a charge detection type circuit or a current detection type circuit, in general the piezoelectric $d_{31}$ constant is proportional to the output voltage of an accelerator sensor, weight sensor, impact sensor, knock sensor, and other piezoelectric type sensors. Seen from this point, it is possible to prepare a sensor with a charge sensor output larger the higher the piezoelectric $d_{31}$ constant of the piezoelectric ceramic composition. Further, to fabricate a sensor having properties equal to or better than Sample C1, it can be said to be preferable to have a piezoelectric $d_{31}$ constant of at least 30 pm/V. Further, to fabricate a high sensitivity sensor raised in the signal-to-noise ratio (SN ratio) and output voltage, the piezoelectric $d_{31}$ constant should be at least 80 pm/V. More preferably it should be at least 100 pm/V.

Further, when using the composition as an actuator, in general the piezoelectric $d_{31}$ constant is proportional to the generated distortion or displacement of the piezoelectric actuator. Seen from this point, it is possible to produce an actuator with a larger generated distortion or displacement the higher the piezoelectric $d_{31}$ constant of the piezoelectric ceramic composition. Further, to fabricate an actuator having properties equal to or better than the comparison, it can be said preferable to have a piezoelectric $d_{31}$ constant of at least 30 pm/V. More preferably it should be at least 40 pm/V. Further, to fabricate an actuator with a large displacement, the piezoelectric $d_{31}$ constant should be at least 80 pm/V. More preferably, it should be at least 100 pm/V.

Further, taking note of the electromechanical coupling coefficient Kp, as will be understood from Table 28, the electromechanical coupling coefficient Kp of Sample F2 exhibits its highest value of 0.551.

In general, the electromechanical coupling coefficient Kp is proportional to the electromechanical energy conversion efficiency of the piezoelectric transformer, ultrasonic motor, actuator, ultrasonic vibrator, etc. Seen from this viewpoint, it is possible to produce a piezoelectric transformer, ultrasonic motor, actuator, ultrasonic vibrator, etc. having a higher electromechanical energy conversion efficiency the higher the electromechanical coupling coefficient Kp of the piezoelectric ceramic composition. Further, to fabricate a piezoelectric transformer, ultrasonic motor, actuator, ultrasonic vibrator, etc. having properties equal to or better than the comparison Sample C1, it can be said to be preferable to have an electromechanical coupling coefficient Kp of at least 0.3. More preferably, it should be at least 0.34. Still more preferably, it should be at least 0.4. Most preferably, it should be at least 0.45.

Taking note of the mechanical quality factor Qm, as will be understood from Table 28, the mechanical quality factors Qm of Samples J1 to J4 exhibited superior values equal to or better than the Sample C1 and Sample C2.

In general, the mechanical quality factor Qm, like the electromechanical coupling coefficient Kp, is proportional to the electromechanical energy conversion efficiency of the piezoelectric transformer, ultrasonic motor, actuator, ultrasonic vibrator, etc. Seen from this viewpoint, it is possible to produce a piezoelectric transformer, ultrasonic motor, actuator, ultrasonic vibrator, etc. having a higher electromechanical energy conversion efficiency the higher the mechanical quality factor Qm of the piezoelectric ceramic composition. Further, to fabricate a piezoelectric transformer, ultrasonic motor, actuator, ultrasonic vibrator, etc. having properties equal to or better than the comparison Sample C1, it can be said to be preferable to have a mechanical quality factor Qm of at least 50.

Taking note of the Curie temperature Tc, the Curie temperatures Tc of Samples J1 to J4 and Samples F1 to F4 are all high values of at least 200° C. Therefore, the piezoelectric ceramic compositions of the present examples (Samples J1 to J4 and Samples F1 to F4) can be utilized as knock sensors or other high temperature sensors, actuators, ultrasonic motors, etc. able to be used stably over a long period at high temperature locations such as near an automobile engine.

For further long-term stable use as a high temperature sensor, actuator, ultrasonic motor, etc., the Curie temperature Tc is preferably at least 200° C. More preferably it should be at least 250° C.

Taking note of the piezoelectric $g_{31}$ constant, as will be understood from Table 28, the piezoelectric $g_{31}$ constant of Sample F2 exhibits its highest value at $8.81 \times 10^{-3}$ Vm/N.

The piezoelectric $g_{31}$ constant, like the piezoelectric $d_{31}$ constant, is proportional to the output voltage of a piezoelectric sensor, piezoelectric element, ultrasonic motor, etc. Therefore, it is possible to produce a sensor with a larger voltage sensor output the higher the piezoelectric $g_{31}$ constant of the piezoelectric ceramic composition. Further, to fabricate a sensor having properties equal to or better than the Comparison 1, it can be said to be preferable to have a piezoelectric $g_{31}$ constant of at least $7 \times 10^{-3}$ Vm/N. More preferably, it should be at least $8 \times 10^{-3}$ Vm/N.

Taking note of the relative dielectric constant $\epsilon_{33T}/\epsilon_0$, the relative dielectric constants $\epsilon_{33T}/\epsilon_0$ of the Samples J1 to J4 and Samples L1 to L3 are extremely high values of at least 1300.

The relative dielectric constant $\epsilon_{33T}/\epsilon_0$ is generally proportional to the electrostatic capacity of a multilayer capacitor or other capacitor. Seen from this point, it is possible to produce a capacitor with a larger electrostatic capacity the higher the relative dielectric constant of the piezoelectric ceramic composition. To fabricate a capacitor, it can be said to be preferable to have a relative dielectric constant of at least 400. More preferably, it should be at least 430, Still more preferably, it should be at least 1000.

Taking note of the dielectric loss tan δ, the dielectric losses tan δ of the Samples J1 to J4 are extremely low values of not more than 0.034.

The dielectric loss is proportional to the heat energy lost by a capacitor component or other capacitor, piezoelectric ultrasonic motor, piezoelectric actuator, piezoelectric transformer, or other component when applying an AC voltage to that component. Seen from this point, it is possible to fabricate a capacitor with a smaller energy loss or a piezoelectric ultrasonic motor, piezoelectric actuator, or piezoelectric transformer with a smaller heat generation the smaller the dielectric loss of the piezoelectric ceramic composition. Further, to fabricate a component with a small dielectric loss, it is preferable to have a dielectric loss of not more than 0.09. More preferably, it should be not more than 0.035. Still more preferably, it should be not more than 0.03.

As explained above, the piezoelectric ceramic compositions (Sample J1 to Sample J4 and Sample F1 to Sample F4) of the present examples are of compositions not containing lead and have superior piezoelectric properties and dielectric properties. Therefore, they are safe to the environment and can be utilized for high performance piezoelectric elements and dielectric elements.

EXAMPLE GROUP X

Next, piezoelectric ceramic compositions of Example Group X will be explained. In these examples, piezoelectric ceramic compositions were produced and measured in physical properties. The piezoelectric ceramic compositions of these examples were piezoelectric ceramic compositions containing as main ingredients compounds of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$. The piezoelectric ceramic compositions included added elements of at least one metal element selected from silicon, indium, and scandium. Further, the total of the contents of the added elements was 0.01 mol with respect to 1 mol of the compound of the above general formula.

The method of production of the piezoelectric ceramic compositions of these examples comprises mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$, mixing an additive containing at least one metal element selected from silicon, indium, and scandium, and sintering the result.

Next, the method of production of the piezoelectric ceramic compositions of these examples will be explained in more detail.

First, as the materials of the basic composition of the piezoelectric ceramic compositions, over 99% purity high purity $Li_2CO_3$, $Na_2CO_3$, $K_2CO_3$, $Nb_2O_5$, $Ta_2O_5$, and $Sb_2O_5$ and, as the additive, $SiO_2$, $Sc_2O_3$, and $In_2O_3$ were prepared.

Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving a general formula $\{Li_x(K_{1-y}Na_y)_{1-x}\}(Nb_{1-z-w}Ta_zSb_w)O_3$ where x, y, z, and w are x=0.04, y=0.5, z=0.1, and w=0.04, that is, a stoichiometric ratio whereby the general formula becomes $\{Li_{0.04}(K_{0.5}Na_{0.5})_{0.96}\}(Nb_{0.86}Ta_{0.1}Sb_{0.04}))O_3$, then the $SiO_2$, $Sc_2O_3$, and $In_2O_3$ serving as the additives were mixed to obtain three types of formulations.

Regarding the amounts of incorporation of these additives, the $SiO_2$, $Sc_2O_3$, and $In_2O_3$ of the additives were included in amounts of 0.01 mol, 0.005 mol, and 0.005 mol with respect to 1 mol of the compound $\{Li_{0.04}(K_{0.5}Na_{0.5})_{0.96}\}(Nb_{0.86}Ta_{0.1}Sb_{0.04}))O_3$ expected to be obtained by formulation by the above stoichiometric ratio. That is, the amounts of the additives incorporated were set to give 0.01 mol amounts of the added elements silicon, scandium, and indium.

The formulations were kneaded by ball mills in acetone for 24 hours to fabricate mixtures.

Next, in the same way as Samples J1 to J4 of Example Group IX, the mixtures were calcined, granulated, shaped, sintered, and polarized to obtain three types of piezoelectric ceramic compositions (Sample J5 to J7). The ratios of the materials and additives in the samples are shown in Table 29.

Note that as a method different from the method of production of these examples, it is also possible to fabricate piezoelectric ceramic compositions similar to the Samples J5 to J7 by fabricating a compound of the above $\{Li_{0.04}(K_{0.5}Na_{0.5})_{0.96}\}(Nb_{0.86}Ta_{0.1}Sb_{0.04})O_3$ by sintering, pulverizing this, mixing the result with the above additives, then calcining, granulating, shaping, and sintering the results in the same way as the method of production of the present examples.

Further, in Samples J5 to J7 of these examples, the $SiO_2$, $Sc_2O_3$, and $In_2O_3$ of the additives may be contained at the grain boundaries of the piezoelectric ceramic compositions in part as oxides or perovskite structure compounds or other compounds and may be contained in part in a state with the silicon, scandium, and indium atoms substituting at least part of the niobium, tantalum, and antimony of the compound of the above $\{Li_{0.04}(K_{0.5}Na_{0.5})_{0.96}\}(Nb_{0.86}Ta_{0.1}Sb_{0.04})O_3$.

TABLE 27

| | Composition ratio of sample | | | | Additive | | Added element | |
|---|---|---|---|---|---|---|---|---|
| | x | y | z | w | Comp. | Am't added (mol) | Type | Am't added (mol) |
| Sample J5 | 0.04 | 0.5 | 0.1 | 0.4 | $SiO_2$ | 0.01 | Si | 0.01 |
| Sample J6 | 0.04 | 0.5 | 0.1 | 0.4 | $Sc_2O_3$ | 0.005 | Sc | 0.01 |
| Sample J7 | 0.04 | 0.5 | 0.1 | 0.4 | $In_2O_3$ | 0.006 | In | 0.01 |

Next, in the same way as Example Group IX, the Samples J5 to J7 were measured for the piezoelectric $d_{31}$ constant, electromechanical coupling coefficient Kp, $pg_{31}c$, mechanical quality factor Qm, relative dielectric constant $\varepsilon_{33T}/\varepsilon_0$, dielectric loss tan δ, and Curie temperature Tc.

The results are shown in Table 30. Note that Table 30 also shows, for comparison, the piezoelectric properties and dielectric properties of the Sample C1 and Sample C2 prepared in Example Group IX.

TABLE 30

| | $d_{31}$ (pm/V) | Kp | $g_{31}$ (× $10^{-3}$ Vm/N) | Qm | $\epsilon_{33T}/\epsilon_0$ | tan δ | Tc (° C.) |
|---|---|---|---|---|---|---|---|
| Sample J5 | 96.6 | 0.470 | 7.96 | 48.8 | 1370.3 | 0.024 | 304 |
| Sample J6 | 101.9 | 0.489 | 7.95 | 50.4 | 1448.4 | 0.023 | 300 |
| Sample J7 | 106.4 | 0.498 | 8.48 | 58.7 | 1416.5 | 0.020 | 311 |
| Sample C1 | 37.5 | 0.334 | 9.9 | 100.6 | 429 | 0.036 | 415 |
| Sample C2 | 96.1 | 0.452 | 7.81 | 48.4 | 1389.3 | 0.025 | 308 |

As well be understood from Table 30, the Samples J5 to J7 were remarkably improved over Sample C1 in the piezoelectric $d_{31}$ constant, electromechanical coupling coefficient Kp, relative dielectric constant $\epsilon_{33T}/\epsilon_0$, and dielectric loss tan δ. Further, the Samples J5 to J7 were also improved over the Sample C2 in the piezoelectric $d_{31}$ constant, electromechanical coupling coefficient Kp, piezoelectric $g_{31}$ constant, mechanical quality factor Qm, and dielectric loss tan δ. The relative dielectric constant $\epsilon_{33T}/\epsilon_0$ and the Curie temperature Tc were also equally or more superior.

It was confirmed that the additives which were included in amounts of 0.001–0.08 mol showed the same effect as shown in Table 30, while not shown in the present examples.

In this way, the piezoelectric ceramic compositions (Sample J5 to Sample J7) of the present examples are of compositions not containing lead and have superior piezoelectric properties and dielectric properties. Therefore, they are safe to the environment and can be utilized for high performance piezoelectric elements and dielectric elements.

EXAMPLE GROUP XI

Next, piezoelectric ceramic compositions of Example Group XI will be explained. In these examples, piezoelectric ceramic compositions were produced and measured in physical properties. The piezoelectric ceramic compositions of these examples were piezoelectric ceramic compositions containing as main ingredients compounds of a general formula $\{Li_x(K_{1-y}Na_y)_{1-x}\}(Nb_{1-z-w}Ta_zSb_w)O_3$ where x, y, z, and w were in the ranges of $0 \leq x \leq 0.2$, $0 \leq y \leq 1$, $0 < z \leq 0.4$, and $0 < w \leq 0.2$. The piezoelectric ceramic compositions included bismuth as an added element. Further, the content of the added element was 0.0001 mol to 0.004 with respect to 1 mol of the compound of the above general formula.

The method of production of the piezoelectric ceramic compositions of these examples comprises mixing a compound containing lithium, a compound containing sodium, a compound containing potassium, a compound containing niobium, a compound containing tantalum, and a compound containing antimony by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$, mixing an additive containing bismuth, and sintering the result.

Next, the method of production of the piezoelectric ceramic compositions of these examples will be explained in more detail.

First, as the materials of the basic composition of the piezoelectric ceramic compositions, over 99% purity high purity $Li_2CO_3$, $Na_2CO_3$, $K_2CO_3$, $Nb_2O_5$, $Ta_2O_5$, and $Sb_2O_5$ and, as the additive, $Bi_2O_3$ were prepared.

Among these materials, the $Li_2CO_3$, $Na_2CO_3$, $K_2CO_3$, $Nb_2O_5$, $Ta_2O_5$, and $Sb_2O_5$ were mixed by a stoichiometric ratio giving a general formula $\{Li_x(K_{1-y}Na_y)_{1-x}\}(Nb_{1-z-w}Ta_zSb_w)O_3$ where x, y, z, and w are x=0.04, y=0.5, z=0.1, and w=0.04, that is, a stoichiometric ratio whereby the general formula becomes $\{Li_{0.04}(K_{0.5}Na_{0.5})_{0.96}\}(Nb_{0.86}Ta_{0.1}Sb_{0.04})O_3$, then the $Bi_2O_3$ serving as the additive was mixed in different amounts to obtain four types of formulations.

Regarding the amounts of incorporation of the additive, the $Bi_2O_3$ of the additive was included in amounts of 0.00025 mol, 0.0005 mol, 0.0025 mol, and 0.005 mol with respect to 1 mol of the compound $\{Li_{0.04}(K_{0.5}Na_{0.5})_{0.96}\}(Nb_{0.96}Ta_{0.1}Sb_{0.04}))O_3$ expected to be obtained by formulation by the above stoichiometric ratio. That is, the amounts of the additive incorporated were set to give 0.0005 mol, 0.001 mol, 0.005 mol, and 0.01 mol amounts of the bismuth.

The formulations were mixed by ball mills in acetone for 24 hours to fabricate mixtures.

Next, in the same way as Samples J1 to J4 and Samples F1 to F4 of Example Group IX, the mixtures were calcined, granulated, shaped, sintered, and polarized to obtain four types of piezoelectric ceramic compositions (Sample J8 to J11). The ratios of the materials and additives in the samples are shown in Table 31.

Note that as a method different from the method of production of these examples, it is also possible to fabricate piezoelectric ceramic compositions similar to the Samples J8 to J11 by fabricating a compound of the above $\{Li_{0.04}(K_{0.5}Na_{0.5})_{0.96}\}(Nb_{0.86}Ta_{0.1}Sb_{0.04})O_3$ by sintering, pulverizing this, mixing the result with the above additives, then calcining, granulating, shaping, and sintering the results in the same way as the method of production of the present examples.

Further, in Samples J8 to J11 of these examples, the bismuth of the added element may be contained in the grains or at the grain boundaries of the piezoelectric ceramic compositions in part as oxides or perovskite structure compounds or other compounds and may be contained in part in a state with the bismuth atoms substituting at least part of the niobium, tantalum, and antimony of the compound of the above $\{Li_{0.04}(K_{0.5}Na_{0.5})_{0.96}\}(Nb_{0.86}Ta_{0.1}Sb_{0.04})O_3$.

TABLE 31

| | Composition ratio of Additive sample | | | | | | Added element | |
|---|---|---|---|---|---|---|---|---|
| | x | y | z | w | Comp. | Am't added (mol) | Type | Am't added (mol) |
| Sample J8 | 0.04 | 0.5 | 0.1 | 0.4 | $Bi_2O_3$ | 0.00025 | Bi | 0.0005 |
| Sample J9 | 0.04 | 0.5 | 0.1 | 0.4 | $Bi_2O_4$ | 0.005 | Bi | 0.001 |
| Sample J10 | 0.04 | 0.5 | 0.1 | 0.4 | $Bi_2O_4$ | 0.0025 | Bi | 0.005 |
| Sample J11 | 0.04 | 0.5 | 0.1 | 0.4 | $Bi_2O_5$ | 0.005 | Bi | 0.01 |

Next, in the same way as the Example Group IX, Samples J8 to J11 were measured for the piezoelectric $d_{31}$ constant, electromechanical coupling coefficient Kp, piezoelectric $g_{31}$ constant, mechanical quality factor Qm, relative dielectric constant $\epsilon_{33T}/\epsilon_0$, dielectric loss tan δ, and Curie temperature Tc. The results are shown in Table 32. note that Table 32 also shows for comparison the piezoelectric properties and dielectric properties of Sample C1 and Sample C2 prepared in Example Group IX.

TABLE 32

|  | $d_{31}$ (pm/V) | Kp | $g_{31}$ (× $10^{-3}$ Vm/N) | Qm | $\epsilon_{33T}/\epsilon_0$ | tanδ | Tc (° C.) |
|---|---|---|---|---|---|---|---|
| Sample J8 | 115.2 | 0.502 | 7.73 | 44.1 | 1683.3 | 0.023 | 308 |
| Sample J9 | 105.6 | 0.489 | 7.84 | 49.0 | 1521.2 | 0.027 | 308 |
| Sample J10 | 61.2 | 0.290 | 4.40 | 75.3 | 1569 | 0.033 | 308 |
| Sample J11 | 17.6 | 0.100 | 1.60 | 264.1 | 1227.3 | 0.029 | 308 |
| Sample C1 | 37.6 | 0.334 | 9.9 | 100.6 | 429 | 0.036 | 415 |
| Sample C2 | 96.1 | 0.452 | 7.81 | 48.4 | 1389.3 | 0.026 | 308 |

As will be understood from Table 32, the Samples J8 and J9 were remarkably improved over Sample C1 in the piezoelectric $d_{31}$ constant, electromechanical coupling coefficient Kp, relative dielectric constant $\epsilon_{33T}/\epsilon_0$, and dielectric loss tan δ. Further, the Samples J8 and J9 were also improved over the Sample C2 in the piezoelectric $d_{31}$ constant, electromechanical coupling coefficient Kp, and relative dielectric constant $\epsilon_{33T}/\epsilon_0$ and were equally or more superior in the other properties as well.

On the other hand, the Sample J10 was remarkably improved over the Sample C1 in the piezoelectric $d_{31}$ constant, the relative dielectric constant $\epsilon_{33T}/\epsilon_0$, and the dielectric loss tan δ. Further, it was improved over the Sample C2 in the mechanical quality factor Qm and relative dielectric constant $\epsilon_{33T}/\epsilon_0$. However, on the other hand, the electromechanical coupling coefficient Kp and piezoelectric $g_{31}$ constant dropped considerably.

Further, the Sample J11 was improved over the Sample C1 in the mechanical quality factor Qm, the relative dielectric constant $\epsilon_{33T}/\epsilon_0$, and the dielectric loss tan δ. Further, it was improved over the Sample C2 in the mechanical quality factor Qm, but on the other hand the piezoelectric $g_{31}$ constant, the electromechanical coupling coefficient Kp, the piezoelectric $g_{31}$ constant, etc. dropped remarkably.

In this way, the piezoelectric ceramic compositions (Sample J8 and Sample J8) of the present examples are of compositions not containing lead and have superior piezoelectric properties and dielectric properties. Therefore, they are safe to the environment and can be utilized for high performance piezoelectric elements and dielectric elements.

According to our findings, the same effect as in these examples were obtained for the additives which were included in smaller amounts such as 0.0001 mol, while not shown in the present examples.

According to our findings, the additives can effectively enhance piezoelectric properties etc. either by substitutional addition or external addition, while not shown in the present examples. Further, the same effect as in these examples were obtained for the other piezoelectric ceramic compositions containing other main ingredients compounds.

While the invention has been described with reference to specific embodiments chosen for purpose of illustration, it should be apparent that numerous modifications could be made thereto by those skilled in the art without departing from the basic concept and scope of the invention.

What is claimed is:

1. A piezoelectric ceramic composition of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$.

2. A piezoelectric ceramic composition as set forth in claim 1, wherein the range of said x in said general formula is $0 < x \leq 0.2$.

3. A piezoelectric ceramic composition as set forth in claim 1, wherein the value of said x in said general formula is x=0.

4. A piezoelectric ceramic composition as set forth in claim 1, wherein the range of said y in said general formula is $0 < y \leq 1$.

5. A piezoelectric ceramic composition as set forth in claim 1, wherein the value of said y in said general formula is y=0.

6. A piezoelectric ceramic composition as set forth in claim 1, wherein said piezoelectric ceramic composition has a piezoelectric $d_{31}$ constant of not less than 30 pm/V.

7. A piezoelectric ceramic composition as set forth in claim 1, wherein said piezoelectric ceramic composition has a piezoelectric $g_{31}$ constant of not less than $7 \times 10^{-3}$ Vm/N.

8. A piezoelectric ceramic composition as set forth in claim 1, wherein said piezoelectric ceramic composition has an electromechanical coupling coefficient Kp of not less than 0.3.

9. A piezoelectric ceramic composition as set forth in claim 1, wherein said piezoelectric ceramic composition has a dielectric loss of not more than 0.09.

10. A piezoelectric ceramic composition as set forth in claim 1, wherein said piezoelectric ceramic composition has a relative dielectric constant of not less than 400.

11. A piezoelectric ceramic composition as set forth in claim 1, wherein said piezoelectric ceramic composition has a Curie temperature Tc of not less than 200° C.

12. A piezoelectric ceramic composition as set forth in claim 1, wherein said piezoelectric ceramic composition has a piezoelectric $d_{31}$ constant of not less than 30 pm/V and a Curie temperature Tc of not less than 200° C.

13. A piezoelectric ceramic composition as set forth in claim 1, wherein said piezoelectric ceramic composition has a piezoelectric $g_{31}$ constant of not less than $7 \times 10^{-3}$ Vm/N and a Curie temperature Tc of not less than 200° C.

14. A piezoelectric ceramic composition as set forth in claim 1, wherein said piezoelectric ceramic composition has an electromechanical coupling coefficient Kp of not less than 0.3 and a Curie temperature Tc of not less than 200° C.

15. A piezoelectric ceramic composition as set forth in claim 1, wherein said piezoelectric ceramic composition has a dielectric loss of not more than 0.09 and a Curie temperature Tc of not less than 200° C.

16. A piezoelectric ceramic composition as set forth in claim 1, wherein said piezoelectric ceramic composition has a piezoelectric $d_{31}$ constant of not less than 30 pm/V, an electromechanical coupling coefficient Kp of not less than 0.3, and a Curie temperature Tc of not less than 200° C.

17. A method of production of a piezoelectric ceramic composition comprising shaping and sintering a powder comprised of a piezoelectric ceramic composition of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$.

18. A method of production of a piezoelectric ceramic composition comprising mixing and sintering a compound containing lithium, a compound containing sodium, a compound containing potassium, a compound containing niobium, a compound containing tantalum, and a compound containing antimony so as to obtain a piezoelectric ceramic composition as set forth in claim 1.

19. A method of production of a piezoelectric ceramic composition as set forth in claim 18, wherein said compound containing lithium is $Li_2CO_3$, said compound containing sodium is $Na_2CO_3$, said compound containing potassium is $K_2CO_3$, said compound containing niobium is $Nb_2O_5$, said compound containing tantalum is $Ta_2O_5$, and said compound containing antimony is $Sb_2O_5$ or $Sb_2O_3$.

20. A piezoelectric element having a piezoelectric body comprised of a piezoelectric ceramic composition produced by a method of production of claim 17.

21. A dielectric element having a dielectric body comprised of a piezoelectric ceramic composition produced by a method of production of claim 17.

22. A piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein said piezoelectric ceramic composition contains at least one metal element selected from palladium, silver, gold, ruthenium, rhodium, rhenium, osmium, iridium, and platinum as an added element, and a total of the contents of said added elements is 0.001 mol to 0.15 mol with respect to 1 mole of the compound of the above general formula.

23. A piezoelectric ceramic composition as set forth in claim 22, wherein a piezoelectric $d_{31}$ constant of said piezoelectric ceramic composition is larger than a piezoelectric $d_{31}$ constant of a piezoelectric ceramic composition of the above general formula not containing said added elements.

24. A piezoelectric ceramic composition as set forth in claim 22, wherein an electromechanical coupling coefficient Kp of said piezoelectric ceramic composition is larger than an electromechanical coupling coefficient Kp of a piezoelectric ceramic composition of the above general formula not containing said added elements.

25. A piezoelectric ceramic composition as set forth in claim 22, wherein a piezoelectric $g_{31}$ constant of said piezoelectric ceramic composition is larger than a piezoelectric $g_{31}$ constant of a piezoelectric ceramic composition of the above general formula not containing said added elements.

26. A piezoelectric ceramic composition as set forth in claim 22, wherein a relative dielectric constant of said piezoelectric ceramic composition is larger than a relative dielectric constant of a piezoelectric ceramic composition of the above general formula not containing said added elements.

27. A piezoelectric ceramic composition as set forth in claim 22, wherein a dielectric loss of said piezoelectric ceramic composition is smaller than a dielectric loss of a piezoelectric ceramic composition of the above general formula not containing said added elements.

28. A piezoelectric ceramic composition as set forth in claim 22, wherein a Curie temperature Tc of said piezoelectric ceramic composition is larger than a Curie temperature of a piezoelectric ceramic composition of the above general formula not containing said added elements.

29. A piezoelectric ceramic composition as set forth in claim 22, wherein said piezoelectric ceramic composition has a piezoelectric $d_{31}$ constant of not less than 30 pm/V.

30. A piezoelectric ceramic composition as set forth in claim 22, wherein said piezoelectric ceramic composition has an electromechanical coupling coefficient Kp of not less than 0.3.

31. A piezoelectric ceramic composition as set forth in claim 22, wherein said piezoelectric ceramic composition has a piezoelectric $g_{31}$ constant of not less than $7 \times 10^{-3}$ Vm/N.

32. A piezoelectric ceramic composition as set forth in claim 22, wherein said piezoelectric ceramic composition has a relative dielectric constant of not less than 400.

33. A piezoelectric ceramic composition as set forth in claim 22, wherein said piezoelectric ceramic composition has a dielectric loss of not more than 0.09.

34. A piezoelectric ceramic composition as set forth in claim 22, wherein said piezoelectric ceramic composition has a Curie temperature Tc of not less than 200° C.

35. A piezoelectric ceramic composition as set forth in claim 22, wherein said piezoelectric ceramic composition has a piezoelectric $d_{31}$ constant of not less than 30 pm/V and a Curie temperature Tc of not less than 200° C.

36. A piezoelectric ceramic composition as set forth in claim 22, wherein said piezoelectric ceramic composition has a piezoelectric $g_{31}$ constant of not less than $7 \times 10^{-3}$ Vm/N and a Curie temperature Tc of not less than 200° C.

37. A piezoelectric ceramic composition as set forth in claim 22, wherein said piezoelectric ceramic composition has an electromechanical coupling coefficient Kp of not less than 0.3 and a Curie temperature Tc of not less than 200° C.

38. A piezoelectric ceramic composition as set forth in claim 22, wherein said piezoelectric ceramic composition has a dielectric loss of not more than 0.09 and a Curie temperature Tc of not less than 200° C.

39. A piezoelectric ceramic composition as set forth in claim 22, wherein said piezoelectric ceramic composition has a piezoelectric $d_{31}$ constant of not less than 30 pm/V, an electromechanical coupling coefficient Kp of rot less than 0.3, and a Curie temperature Tc of not less than 200° C.

40. A method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from palladium, silver, gold, ruthenium, rhodium, rhenium, osmium, iridium, and platinum.

41. A method of production of a piezoelectric ceramic composition comprising mixing a compound containing lithium, a compound containing sodium, a compound containing potassium, a compound containing niobium, a compound containing tantalum, and a compound containing antimony either by a stoichiometric ratio giving, after sintering, a compound of a general formula $\{Li_x(K_{1-y}Na_y)_{1-x}\}(Nb_{1-z-w}Ta_zSb_w)O_3$ where x, y, 2, and w are in the ranges of $0 \leq x \leq 0.2$, $0 \leq y \leq 1$, $0 < z \leq 0.4$, and $0 < w \leq 0.2$ or by a stoichiometric ratio considering substitution to either Li, K, Na, Nb, Ta, or Sb in a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, $0 < w \leq 0.2$ by a metal element contained in the following additive, mixing an additive containing at least one metal element selected from palladium, silver, gold, ruthenium, rhodium, rhenium, osmium, iridium, and platinum, and sintering the result.

42. A method of production of a piezoelectric ceramic composition as set forth in claim 41, wherein said compound containing lithium is $Li_2CO_3$, said compound containing sodium is $Na_2CO_3$, said compound containing potassium is $K_2CO_3$, said compound containing niobium is $Nb_2O_5$, said compound containing tantalum is $Ta_2O_5$, and said compound containing antimony is $Sb_2O_5$ or $Sb_2O_3$ and said additive is at least one additive selected from $PdO_2$, $Ag_2O$, Au, $Au_2O$, $Ru_2O$, RhO, $Re_2O_5$, $OsO_2$, $IrO_2$, and $PtO_2$.

43. A piezoelectric element having a piezoelectric body comprised of a piezoelectric ceramic composition produced by a method of production of claim 41.

44. A piezoelectric element having a piezoelectric body comprised of a piezoelectric ceramic composition produced by a method of production of claim 40.

45. A dielectric element having a dielectric body comprised of a piezoelectric ceramic composition produced by a method of production of claim 41.

46. A dielectric element having a dielectric body comprised of a piezoelectric ceramic composition produced by a method of production of claim 40.

47. A piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein
said piezoelectric ceramic composition contains at least one metal element selected from nickel, iron, manganese, copper, and zinc as an added element, and a total of the contents of said added elements is 0.001 mol to 0.08 mol with respect to 1 mole of the compound of the above general formula.

48. A piezoelectric ceramic composition as set forth in claim 47, wherein a piezoelectric $d_{31}$ constant of said piezoelectric ceramic composition is larger than a piezoelectric $d_{31}$ constant of a piezoelectric ceramic composition of the above general formula not containing said added elements.

49. A piezoelectric ceramic composition as set forth in claim 47, wherein an electromechanical coupling coefficient Kp of said piezoelectric ceramic composition is larger than an electromechanical coupling coefficient Kp of a piezoelectric ceramic composition of the above general formula not containing said added elements.

50. A piezoelectric ceramic composition as set forth in claim 47, wherein a piezoelectric $g_{31}$ constant of said piezoelectric ceramic composition is larger than a piezoelectric $g_{31}$ constant of a piezoelectric ceramic composition of the above general formula not containing said added elements.

51. A piezoelectric ceramic composition as set forth in claim 47, wherein a mechanical quality factor Qm of said piezoelectric ceramic composition is larger than a mechanical quality factor Qm of a piezoelectric ceramic composition of the above general formula not containing said added elements.

52. A piezoelectric ceramic composition as set forth in claim 47, wherein a relative dielectric constant of said piezoelectric ceramic composition is larger than a relative dielectric constant of a piezoelectric ceramic composition of the above general formula not containing said added elements.

53. A piezoelectric ceramic composition as set forth in claim 47, wherein a dielectric loss of said piezoelectric ceramic composition is smaller than a dielectric loss of a piezoelectric ceramic composition of the above general formula not containing said added elements.

54. A piezoelectric ceramic composition as set forth in claim 47, wherein a Curie temperature Tc of said piezoelectric ceramic composition is larger than a Curie temperature of a piezoelectric ceramic composition of the above general formula not containing said added elements.

55. A piezoelectric ceramic composition as set forth in claim 47, wherein said piezoelectric ceramic composition has a piezoelectric $d_{31}$ constant of not less than 30 pm/V.

56. A piezoelectric ceramic composition as set forth in claim 47, wherein said piezoelectric ceramic composition has an electromechanical coupling coefficient Kp of not less than 0.3.

57. A piezoelectric ceramic composition as set forth in claim 47, wherein said piezoelectric ceramic composition has a piezoelectric $g_{31}$ constant of not less than $7 \times 10^{-3}$ Vm/N.

58. A piezoelectric ceramic composition as set forth in claim 47, wherein said piezoelectric ceramic composition has a mechanical quality factor Qm of not less than 50.

59. A piezoelectric ceramic composition as set forth in claim 47, wherein said piezoelectric ceramic composition has a relative dielectric constant of not less than 400.

60. A piezoelectric ceramic composition as set forth in claim 47, wherein said piezoelectric ceramic composition has a dielectric loss of not more than 0.09.

61. A piezoelectric ceramic composition as set forth in claim 47, wherein said piezoelectric ceramic composition has a Curie temperature Tc of not less than 200° C.

62. A piezoelectric ceramic composition as set forth in claim 47, wherein said piezoelectric ceramic composition has a piezoelectric $d_{31}$ constant of not less than 30 pm/V and a Curie temperature Tc of not less than 200° C.

63. A piezoelectric ceramic composition as set forth in claim 47, wherein said piezoelectric ceramic composition has a piezoelectric $g_{31}$ constant of not less than $7 \times 10^{-3}$ Vm/N and a Curie temperature Tc of not less than 200° C.

64. A piezoelectric ceramic composition as set forth in claim 47, wherein said piezoelectric ceramic composition has an electromechanical coupling coefficient Kp of not less than 0.3 and a Curie temperature Tc of not less than 200° C.

65. A piezoelectric ceramic composition as set forth in claim 47, wherein said piezoelectric ceramic composition has a mechanical quality factor Qm of not less than 50 and a Curie temperature Tc of not less than 200° C.

66. A piezoelectric ceramic composition as set forth in claim 47, wherein said piezoelectric ceramic composition has a dielectric loss of not more than 0.09 and a Curie temperature Tc of not less than 200° C.

67. A piezoelectric ceramic composition as set forth in claim 47, wherein said piezoelectric ceramic composition has a piezoelectric $d_{31}$ constant of not less than 30 pm/V, an electromechanical coupling coefficient Kp of not less than 0.3, and a Curie temperature Tc of not less than 200° C.

68. A method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from nickel, iron, manganese, copper, and zinc.

69. A method of production of a piezoelectric ceramic composition comprising mixing a compound containing lithium, a compound containing sodium, a compound containing potassium, a compound containing niobium, a compound containing tantalum, and a compound containing antimony either by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ or a stoichiometric ratio considering substitution to either Li, K, Na, Nb, Ta, or Sb in a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, $0 < w \leq 0.2$ by a metal element contained in the following additive, mixing an additive containing at least one metal element selected from nickel, iron, manganese, copper, and zinc, and sintering the result.

70. A method of production of a piezoelectric ceramic composition as set forth in claim 69, wherein said compound containing lithium is $Li_2CO_3$, said compound containing sodium is Na$_2$CO$_3$, said compound containing potassium is K$_2$CO$_3$, said compound containing niobium is Nb$_2$O$_5$, said compound containing tantalum is Ta$_2$O$_5$, and said compound containing antimony is Sb$_2$O$_5$ or Sb$_2$O$_3$ and said additive is at least one additive selected from NiO, Fe$_2$O$_3$, Mn$_2$O$_5$, Cu$_2$O, MnO, CuO, and ZnO.

71. A piezoelectric element having a piezoelectric body comprised of a piezoelectric ceramic composition produced by a method of production of claim 69.

72. A piezoelectric element having a piezoelectric body comprised of a piezoelectric ceramic composition produced by a method of production of claim 68.

73. A dielectric element having a dielectric body comprised of a piezoelectric ceramic composition produced by a method of production of claim 69.

74. A dielectric element having a dielectric body comprised of a piezoelectric ceramic composition produced by a method of production of claim 68.

75. A Piezoelectric ceramic composition having a compound of a general formula $\{Li_x(K_{1-y}Na_y)_{1-x}\}Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein said piezoelectric ceramic composition contains at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium, a total of the contents of said added elements is 0.0005 mol to 0.15 mol with respect to 1 mole of the compound of the above general formula, and an open porosity is not more than 0.4 vol %.

76. A piezoelectric ceramic composition as set forth in claim 75, wherein an apparent density of said piezoelectric ceramic composition is larger than an apparent density of a piezoelectric ceramic composition of the above general formula not containing said added elements.

77. A piezoelectric ceramic composition as set forth in claim 75, wherein a porosity or open porosity of said piezoelectric ceramic composition is smaller than a porosity or open porosity of a piezoelectric ceramic composition of the above general formula not containing said added elements.

78. A method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium.

79. A method of production of a piezoelectric ceramic composition comprising mixing a compound containing lithium, a compound containing sodium, a compound containing potassium, a compound containing niobium, a compound containing tantalum, and a compound containing antimony either by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ or by a stoichiometric ratio considering substitution to either Li, K, Na, Nb, Ta, or Sb in a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, $0 < w \leq 0.2$ by a metal element contained in the following additive, mixing an additive containing at least one metal element selected from silver, aluminum, gold, boron, barium, bismuth, calcium, cerium, cobalt, cesium, copper, dysprosium, erbium, europium, iron, gallium, gadolinium, germanium, hafnium, holmium, indium, iridium, lanthanum, lutetium, magnesium, manganese, neodymium, nickel, palladium, praseodymium, platinum, rubidium, rhenium, ruthenium, scandium, silicon, samarium, tin, strontium, terbium, titanium, thulium, vanadium, yttrium, ytterbium, zinc, and zirconium, and sintering the result.

80. A method of production of a piezoelectric ceramic composition as set forth in claim 79, wherein said compound containing lithium is Li$_2$CO$_3$, said compound containing sodium is Na$_2$CO$_3$, said compound containing potassium is K$_2$CO$_3$, said compound containing niobium is Nb$_2$O$_5$, said compound containing tantalum is Ta$_2$O$_5$, and said compound containing antimony is Sb$_2$O$_5$ or Sb$_2$O$_3$ and said additive is at least one additive selected from Ag$_2$O, Al$_2$O$_3$, Au, Au$_2$O$_3$, B$_2$O$_3$, H$_3$BO$_3$, BaO, BaO$_2$, BaCO$_3$, Bi$_2$O$_3$, CaO, CaCO$_3$, CeO$_2$, Ce$_2$(CO$_3$)$_3$, CoO, Co$_3$O$_4$, CoCO$_3$, Cs$_2$CO$_3$, CuO, Cu$_2$O, Dy$_2$O$_3$, Er$_2$O$_3$, Eu$_2$O$_3$, Fe$_2$O$_3$, Ga$_2$O$_3$, Gd$_2$O$_3$, GeO$_2$, HfO$_2$, Ho$_2$O$_3$, In$_2$O$_3$, IrO$_2$, Ir$_2$O$_3$, La$_2$O$_3$, Lu$_2$O$_3$, MgO, MgC$_2$O$_4$, MnO, MnO$_2$, Mn$_2$O$_3$, Mn$_3$O$_4$, Nd$_2$O$_3$, Nd$_2$CO$_3$, NiO, NiCO$_3$, PdO, Pr$_2$O$_3$, Pr$_6$O$_{11}$, Pr$_2$(CO$_3$)$_3$, PtO$_2$, Rb$_2$O, Rb$_2$CO$_3$, Re$_2$O$_7$, RuO$_2$, Sc$_2$O$_3$, SiO$_2$, SiO, SiC, Sm$_2$O$_3$, SnO, SnO$_2$, SrO, SrCO$_3$, Tb$_4$O$_7$, TiO, Ti$_2$O$_3$, TiO$_2$, Tm$_2$O$_3$, V$_2$O$_3$, V$_2$O$_4$, V$_2$O$_5$, Y$_2$O$_3$, Y$_2$(CO$_3$)$_3$, Yb$_2$O$_3$, ZnO, and ZrO$_2$.

81. A piezoelectric element having a piezoelectric body comprised of a piezoelectric ceramic composition produced by a method of production of claim 79.

82. A piezoelectric element having a piezoelectric body comprised of a piezoelectric ceramic composition produced by a method of production of claim 78.

83. A dielectric element having a dielectric body comprised of a piezoelectric ceramic composition produced by a method of production of claim 79.

84. A dielectric element having a dielectric body comprised of a piezoelectric ceramic composition produced by a method of production of claim 78.

85. A piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein said piezoelectric ceramic composition contains at least one metal element selected from magnesium, calcium, strontium, and barium as an added element, and a total of the contents of said added elements is 0.0001 mol to 0.10 mol with respect to 1 mole of the compound of the above general formula.

86. A piezoelectric ceramic composition as set forth in claim 85, wherein said added elements are included substituting at least part of the lithium, potassium, and sodium of said compound of said general formula.

87. A piezoelectric ceramic composition having a compound of a general formula $\{Li_x(K_{1-y}Na_y)_{1-x}\}(Nb_{1-z-w}$ $Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein said piezoelectric ceramic composition contains at least one metal element selected from silicon, indium, and scandium as an added element, and a total of the contents of said added elements is not more than 0.08 mol with respect to 1 mole of the compound of the above general formula.

88. A piezoelectric ceramic composition as set forth in claim 87, wherein a total of the contents of said added elements is 0.0001 mol to 0.08 mol with respect to 1 mole of the compound of the above general formula.

89. A piezoelectric ceramic composition having a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ as a main ingredient, wherein said piezoelectric ceramic composition contains bismuth as an added element, and a content of said added element is 0.0001 mol to 0.004 mol with respect to 1 mole of the compound of the above general formula.

90. A piezoelectric ceramic composition as set forth in claim 85, wherein a piezoelectric $d_{31}$ constant of said piezoelectric ceramic composition is larger than a piezoelectric $d_{31}$ constant of a piezoelectric ceramic composition of the above general formula not containing said added elements.

91. A piezoelectric ceramic composition as set forth in claim 85, wherein an electromechanical coupling coefficient Kp of said piezoelectric ceramic composition is larger than an electromechanical coupling coefficient Kp of a piezoelectric ceramic composition of the above general formula not containing said added elements.

92. A piezoelectric ceramic composition as set forth in claim 85, wherein a piezoelectric $g_{31}$ constant of said piezoelectric ceramic composition is larger than a piezoelectric $g_{31}$ constant of a piezoelectric ceramic composition of the above general formula not containing said added elements.

93. A piezoelectric ceramic composition as set forth in claim 85, wherein a mechanical quality factor Qm of said piezoelectric ceramic composition is larger than a mechanical quality factor Qm of a piezoelectric ceramic composition of the above general formula not containing said added elements.

94. A piezoelectric ceramic composition as set forth in claim 85, wherein a relative dielectric constant of said piezoelectric ceramic composition is larger than a relative dielectric constant of a piezoelectric ceramic composition of the above general formula not containing said added elements.

95. A piezoelectric ceramic composition as set forth in claim 85, wherein a dielectric loss of said piezoelectric ceramic composition is smaller than a dielectric loss of a piezoelectric ceramic composition of the above general formula not containing said added elements.

96. A piezoelectric ceramic composition as set forth in claim 85, wherein a Curie temperature Tc of said piezoelectric ceramic composition is larger than a Curie temperature of a piezoelectric ceramic composition of the above general formula not containing said added elements.

97. A piezoelectric ceramic composition as set forth in claim 85, wherein said piezoelectric ceramic composition has a piezoelectric $d_{31}$ constant of not less than 30 pm/V.

98. A piezoelectric ceramic composition as set forth in claim 85, wherein said piezoelectric ceramic composition has an electromechanical coupling coefficient Kp of not less than 0.3.

99. A piezoelectric ceramic composition as set forth in claim 85, wherein said piezoelectric ceramic composition has a piezoelectric $g_{31}$ constant of not less than $7 \times 10^{-3}$ Vm/N.

100. A piezoelectric ceramic composition as set forth in claim 85, wherein said piezoelectric ceramic composition has a mechanical quality factor Qm of not less than 50.

101. A piezoelectric ceramic composition as set forth in claim 85, wherein said piezoelectric ceramic composition has a relative dielectric constant of not less than 400.

102. A piezoelectric ceramic composition as set forth in claim 85, wherein said piezoelectric ceramic composition has a dielectric loss of not more than 0.09.

103. A piezoelectric ceramic composition as set forth in claim 85, wherein said piezoelectric ceramic composition has a Curie temperature Tc of not less than 200° C.

104. A piezoelectric ceramic composition as set forth in claim 85, wherein said piezoelectric ceramic composition has a piezoelectric $d_{31}$ constant of not less than 30 pm/V and a Curie temperature Tc of not less than 200° C.

105. A piezoelectric ceramic composition as set forth in claim 85, wherein said piezoelectric ceramic composition has a piezoelectric $g_{31}$ constant of not less than $7 \times 10^{-3}$ Vm/N and a Curie temperature Tc of not less than 200° C.

106. A piezoelectric ceramic composition as set forth in claim 85, wherein said piezoelectric ceramic composition has an electromechanical coupling coefficient Kp of not less than 0.3 and a Curie temperature Tc of not less than 200° C.

107. A piezoelectric ceramic composition as set forth in claim 85, wherein said piezoelectric ceramic composition has a mechanical quality factor Qm of not less than 50 and a Curie temperature Tc of not less than 200° C.

108. A piezoelectric ceramic composition as set forth in claim 85, wherein said piezoelectric ceramic composition has a dielectric loss of not more than 0.09 and a Curie temperature Tc of not less than 200° C.

109. A piezoelectric ceramic composition as set forth in claim 85, wherein said piezoelectric ceramic composition has a piezoelectric do constant of not less than 30 pm/V, an electromechanical coupling coefficient Kp of not less than 0.3, and a Curie temperature Tc of not less than 200° C.

110. A method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from magnesium, calcium, strontium, and barium.

111. A method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including at least one metal element selected from silicon, indium, and scandium.

112. A method of production of a piezoelectric ceramic composition comprising mixing and sintering a compound of a general formula $\{Li_x(K_{1-y}Na_y)_{1-x}\}(Nb_{1-z-w}Ta_zSb_w)O_3$ where x, y, z, and w are in the ranges of $0 \leq x \leq 0.2$, $0 \leq y \leq 1$, $0 < z \leq 0.4$, and $0 < w \leq 0.2$ and an additive including bismuth.

113. A method of production of a piezoelectric ceramic composition comprising preparing a compound containing lithium, a compound containing sodium, a compound containing potassium, a compound containing niobium, a compound containing tantalum, and a compound containing antimony either by a stoichiometric ratio giving, after sintering, a compound of a general formula $\{Li_x(K_{1-y}$ $Na_y)_{1-x}\}(Nb_{1-z-w}Ta_zSb_w)O_3$ where x, y, z, and w are in the ranges of $0\leq x\leq 0.2$, $0\leq y\leq 1$, $0<z\leq 0.4$, and $0<w\leq 0.2$ or by a stoichiometric ratio considering substitution to either Li, K, Na, Nb, Ta, or Sb in a general formula $\{Li_x(K_{1-y}Na_y)_{1-x}\}(Nb_{1-z-w}Ta_zSb_w)O_3$ where x, y, z, and w are in the ranges of $0\leq x\leq 0.2$, $0\leq y\leq 1$, $0<z\leq 0.4$, and $0<w\leq 0.2$ by a metal element contained in the following additive, mixing an additive containing at least one metal element selected from magnesium, calcium, strontium, and barium, and sintering the result.

114. A method of production of a piezoelectric ceramic composition as set forth in claim 113, wherein said compound containing lithium is $Li_2CO_3$, said compound containing sodium is $Na_2CO_3$, said compound containing potassium is $K_2CO_3$, said compound containing niobium is $Nb_2O_5$, said compound containing tantalum is $Ta_2O_5$, and said compound containing antimony is $Sb_2O_5$ or $Sb_2O_3$ and said additive is at least one additive selected from MgO, $MgCO_3$, CaO, $CaCO_3$, SrO, $SrCO_3$, BaO, and $BaCO_3$.

115. A method of production of a piezoelectric ceramic composition comprising preparing a compound containing lithium, a compound containing sodium, a compound containing potassium, a compound containing niobium, a compound containing tantalum, and a compound containing antimony either by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0\leq x\leq 0.2$, $0\leq y\leq 1$, $0<z\leq 0.4$, and $0<w\leq 0.2$ or a stoichiometric ratio considering substitution to either Li, K, Na, Nb, Ta, or Sb in a general formula $\{Li_x(K_{1-y}Na_y)_{1-x}\}(Nb_{1-z-w}Ta_zSb_w)O_3$ where x, y, z, and w are in the ranges of $0\leq x\leq 0.2$, $0\leq y\leq 1$, $0<z\leq 0.4$, and $0<w\leq 0.2$ by a metal element contained in the following additive, mixing an additive containing at least one metal element selected from silicon, indium, and scandium, and sintering the result.

116. A method of production of a piezoelectric ceramic composition as set forth in claim 115, wherein said compound containing lithium is $Li_2CO_3$, said compound containing sodium is $Na_2CO_3$, said compound containing potassium is $K_2CO_3$, said compound containing niobium is $Nb_2O_5$, said compound containing tantalum is $Ta_2O_5$, and said compound containing antimony is $Sb_2O_5$ or $Sb_2O_3$ and said additive is at least one additive selected from $SiO_2$, $In_2O_3$, and $Sc_2O_3$.

117. A method of production of a piezoelectric ceramic composition comprising preparing a compound containing lithium, a compound containing sodium, a compound containing potassium, a compound containing niobium, a compound containing tantalum, and a compound containing antimony either by a stoichiometric ratio giving, after sintering, a compound of a general formula $\{Li_x(K_{1-y}Na_y)_{1-x}\}(Nb_{1-z-w}Ta_zSb_w)O_3$ where x, y, z, and w are in the ranges of $0\leq x\leq 0.2$, $0\leq y\leq 1$, $0<z\leq 0.4$, and $0<w\leq 0.2$ or a stoichiometric ratio considering substitution to either Li, K, Na, Nb, Ta, or Sb in a general formula $\{Li_x(K_{1-y}Na_y)_{1-x}\}(Nb_{1-z-w}Ta_zSb_w)O_3$ where x, y, z, and w are in the ranges of $0\leq x\leq 0.2$, $0\leq y\leq 1$, $0<z\leq 0.4$, and $0<w\leq 0.2$ by a metal element contained in the following additive, mixing an additive containing bismuth, and sintering the result.

118. A method of production of a piezoelectric ceramic composition as set forth in claim 117, wherein said compound containing lithium is $Li_2CO_3$, said compound containing sodium is $Na_2CO_3$, said compound containing potassium is $K_2CO_3$, said compound containing niobium is $Nb_2O_5$, said compound containing tantalum is $Ta_2O_5$, and said compound containing antimony is $Sb_2O_5$ or $Sb_2O_3$ and said additive is $Bi_2O_3$.

119. A piezoelectric element having a piezoelectric body comprised of a piezoelectric ceramic composition produced by a method of production of claim 111.

120. A piezoelectric element having a piezoelectric body comprised of a piezoelectric ceramic composition produced by a method of production of claim 110.

121. A dielectric element having a dielectric body comprised of a piezoelectric ceramic composition produced by a method of production of claim 111.

122. A dielectric element having a dielectric body comprised of a piezoelectric ceramic composition produced by a method of production of claim 110.

* * * * *

UNITED STATES PATENT AND TRADEMARK OFFICE
CERTIFICATE OF CORRECTION

PATENT NO. : 7,101,491 B2  
APPLICATION NO. : 10/620923  
DATED : September 5, 2006  
INVENTOR(S) : Tatsuhiko Nonoyama et al.

It is certified that error appears in the above-identified patent and that said Letters Patent is hereby corrected as shown below:

Col. 94, line 49, claim 41, delete "2" and substitute --z-- therefor

Col. 100, line 39, claim 109, delete "do" and substitute --$d_{13}$-- therefor

Col. 101, line 28, claim 115, after "or" insert --by--

Signed and Sealed this

Thirty-first Day of July, 2007

JON W. DUDAS  
*Director of the United States Patent and Trademark Office*